(12) United States Patent
Shibuya et al.

(10) Patent No.: US 7,232,644 B2
(45) Date of Patent: Jun. 19, 2007

(54) POLYMERIZABLE COMPOSITION AND NEGATIVE-WORKING PLANOGRAPHIC PRINTING PLATE PRECURSOR USING THE SAME

(75) Inventors: Akinori Shibuya, Shizuoka-ken (JP); Kazuto Kunita, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 39 days.

(21) Appl. No.: 10/645,796

(22) Filed: Aug. 22, 2003

(65) Prior Publication Data

US 2004/0043325 A1    Mar. 4, 2004

(30) Foreign Application Priority Data

Aug. 22, 2002   (JP) ............................. 2002-241719

(51) Int. Cl.
  *G03F 7/033*  (2006.01)
  *G03F 7/038*  (2006.01)
  *G03F 7/09*   (2006.01)

(52) U.S. Cl. .............. 430/278.1; 430/286.1; 430/287.1; 430/964; 529/281; 529/282; 529/286; 529/302; 529/310; 529/347.1

(58) Field of Classification Search ............ 430/270.1, 430/302, 286.1, 287.1, 964, 278.1; 526/281, 526/282, 286, 302, 310, 347.1
See application file for complete search history.

(56) References Cited

U.S. PATENT DOCUMENTS 2,850,445 A   9/1958   Oster
6,824,948 B1 *  11/2004  Aoai et al. ................. 430/170
6,838,222 B2 *  1/2005   Aoshima et al. ............ 430/176
6,916,595 B2 *  7/2005   Fujimaki et al. .......... 430/287.1

FOREIGN PATENT DOCUMENTS

| | | |
|---|---|---|
| DE | 3907820 A1 | 9/1989 |
| EP | 0 780 239 A2 | 6/1997 |
| EP | 1 117 004 A2 | 7/2001 |
| EP | 1 176 467 A1 | 1/2002 |
| EP | 1 369 231 A2 | 12/2003 |
| JP | 44-20189 B | 8/1969 |
| JP | 08-108621 A | 4/1996 |
| JP | 08-276558 A | 10/1996 |
| JP | 09-034110 A | 2/1997 |
| JP | 2002-156757 A | 5/2002 |

OTHER PUBLICATIONS

European Search for EP Appln. No. 03018695.1-2222, issued Aug. 14, 2006.

* cited by examiner

*Primary Examiner*—Richard L. Schilling
(74) *Attorney, Agent, or Firm*—Sughrue Mion, PLLC

(57) ABSTRACT

The invention provides a polymerizable composition comprising: a binder polymer containing at least an acid group having an acid dissociation constant (pKa) of 5.5 or more and a radical addition polymerizable group, and a radical-generating compound capable of generating a radical with light or heat. Further, the invention provides a negative-working planographic printing plate precursor which has a recording layer containing the polymerizable composition. Use of the polymerizable composition of the invention provides a planographic printing plate precursor that is capable of forming high-quality images free from stains in non-image portions, and further has high strength in formed image portions and excellent printing endurance.

18 Claims, No Drawings

POLYMERIZABLE COMPOSITION AND NEGATIVE-WORKING PLANOGRAPHIC PRINTING PLATE PRECURSOR USING THE SAME

CROSS-REFERENCE TO RELATED APPLICATIONS

This application claims benefit of and priority to Japanese Patent Application No. 2002-241719, filed on Aug. 22, 2002, which is incorporated herein by reference in its entirety for all purposes.

BACKGROUND OF THE INVENTION

1. Field of the Invention

The present invention relates to a polymerizable composition that can be used in image forming materials such as three-dimensional rapid prototyping, holography, planographic printing plate precursors, colorproofs, photoresists, and color filters, as well as photocurable resin materials such as inks, paints, and adhesives.

In particular, the invention relates to a polymerizable composition that is suitable for use in negative-working planographic printing plate precursors, which can be directly made by using various lasers from digital signals of computers and the like. The present invention also relates to a negative-working planographic printing plate precursor using the composition.

2. Description of the Related Art

In recent years, solid lasers, semiconductor lasers, and gas lasers, which radiate ultraviolet rays, visible rays or infrared rays having wavelengths of 300 nm to 1,200 nm, have become more powerful, more compact, and easily available. These lasers are very useful as exposure sources during direct plate making from digital data of computers and the like.

There are various studies with respect to recording materials sensitive to these types of lasers. Representative examples of materials that can be recorded with infrared lasers having a photosensitive wavelength of 760 nm or more include the positive-working recording material described in U.S. Pat. No. 4,708,925 and the acid catalyst crosslinking type negative-working recording material described in Japanese Patent Application Laid-Open (JP-A) No. 8-276558. Further, many recording materials responsive to ultraviolet or visible lasers having wavelengths of 300 nm to 700 nm are known, and examples thereof include the negative-working recording materials utilizing radical polymerization described in U.S. Pat. No. 2,850,445 and Japanese Patent Application Publication (JP-B) No. 44-20189.

Negative-working image forming materials utilize a recording method in which a polymerization reaction occurs using radicals generated by light as an initiator, and exposed areas in the recording layer thereof are cured to form image areas. When compared with positive-working image forming materials in which solubilization of a recording layer occurs due to the energy from infrared laser irradiation, such negative-working image forming materials have low image forming properties. Therefore, in order to facilitate the curing reaction by polymerization and form firm image areas, heat treatment is generally carried out prior to development.

Image recording materials having photopolymerizable recording layers that use a photopolymerizable composition as a recording layer are known described in JP-A Nos. 8-108621 and 9-34110. Such recording layers excel at high-sensitivity image forming, however, when a hydrophilized substrate is used as a support, adhesion at the interface between the recording layer and the support is low, thus printing endurance is poor when used as a printing plate. In contrast to the above, when a non-hydrophilized substrate is used, adhesion is enhanced, however, such a substrate is also problematic in that non-image portions are not completely removed and thus remain after development.

In negative-working planographic printing plate precursors, a polymer binder having an alkali-soluble acid group in a recording layer is used, and non-image portions are formed by developing with an alkaline developing solution and removing unexposed areas. As such alkali-soluble acid groups, carboxylic acid groups have been conventionally used. However, since carboxylic acid groups generally have low acid dissociation constants (pKa) (e.g., in the case of an acetic acid, the pKa is 4.74), they tend to dissociate due to penetration of alkaline developing solution. Accordingly, the developing solution tends to penetrate into cured image areas, whereby the interface between the support and the recording layer is damaged due to adhesion deterioration, which leads to deterioration in printing endurance.

In order to enhance adhesion between the recording layer and the support and prevent penetration of developing solution into the interface, a non-hydrophilized support may be used. In this case, however, staining tends to occur in non-image portions. In order to completely remove the non-image portions and prevent staining, it is necessary to use strong alkaline developing solutions having a pH of 13 or more. However, use of such strong alkaline developing solutions is problematic since these are liable to penetrate into and damage cured image areas, thereby deteriorating printing endurance.

Accordingly, as mentioned above, in conventional negative printing plate precursors, it is difficult to make both printing endurance and stain-resistance consistent with each other, and precursors having thoroughly satisfactory functions have yet to be obtained.

SUMMARY OF THE INVENTION

According to the present invention, the foregoing problems of the related art can be solved.

The invention provides a polymerizable composition that is capable of forming high-quality images free from stains in non-image areas, and capable of forming recording layers of planographic printing plate precursors having high strength in formed image areas and excellent printing endurance, and a planographic printing plate precursor using the polymerizable composition. In particular, the invention provides a polymerizable composition that is suitable for recording layers of planographic printing plate precursors that can be made directly from digital data of computers and the like by recording using solid lasers or semiconductor layers which irradiates ultraviolet rays, visible rays or infrared rays.

The present inventors made extensive and intensive investigations, and found that the forgoing object can be attained by using a binder polymer having a specific acid group and a radical addition polymerizable group, leading to accomplishment to the invention.

Specifically, the polymerizable composition of the invention is a polymerizable composition comprising: a binder polymer containing at least an acid group having an acid dissociation constant (pKa) of 5.5 or more and a radical addition polymerizable group (hereinafter, this binder polymer being prop rly referred to as "specific binder polymer"); and a radical-generating compound capable of generating a radical with light or heat (hereinafter, this compound being properly referred to as "polymerization initiator").

Further, the invention provides a negative-working planographic printing plate precursor, comprising a support having thereon a recording layer containing the foregoing polymerizable composition.

While the action mechanism of the invention is not completely clear, it may be assumed as follows.

Namely, it is thought that since the specific binder polymer of the invention contains an acid group having a pKa of 5.5 or more, a difference between the pKa and hydrogen ion index (pH) of an alkaline developing solution becomes small, and therefore, a dissociation rate to the alkaline developing solution becomes low in image areas (exposed areas), whereby deterioration in printing endurance, that is caused by damaging due to penetration of the developing solution into the recording layer, hardly occurs.

Further, it is thought that since the specific polymer binder of the invention further contains a radical addition polymerizable group, when the radical addition polymerizable group reacts due to active radicals generated from the polymerization initiator by exposure, the binder polymer is made to have a higher molecular weight and thus the motion thereof is suppressed, and therefore, the acid group having a pKa of 5.5 or more is immobilized, thereby enabling to suppress penetration of the alkaline developing solution into the recording layer. Moreover, it is thought that since on the acid group structure surface after exposure, dissociated protons are surrounded by hydrophobic groups such as aromatic ring groups, an hydrophobicity enhancing effect after curing due to immobilization of the acid group by radical polymerization becomes larger. Thus, it is assumed that deterioration of printing endurance caused by damaging due to penetration of the developing solution into the recording layer can effectively be suppressed.

On the other hand, in non-image areas (exposed areas), development can be carried out using a strong alkaline developing system having a high pH (for example, a pH of 13 or more). Accordingly, the non-image areas can completely be removed, so that it becomes possible to effectively suppress occurrence of staining.

In the light of the above, it is assumed that the invention achieves both of printing endurance and staining resistance property.

DETAILED DESCRIPTION OF THE INVENTION

The present invention will be described below in detail.

The polymerizable composition of the invention comprises a binder polymer containing at least an acid group having an acid dissociation constant (pKa) of 5.5 or more and a radical addition polymerizable group; and a radical-generating compound capable of generating a radical with light or heat. The polymerizable composition of the invention may be heat polymerizable or photopolymerizable.

Further, the negative-working planographic printing plate precursor of the invention comprises a support having a recording layer containing the foregoing polymerizable composition provided thereon, thereby exhibiting excellent printing endurance and staining resistance property.

Binder Polymer Containing an Acid Group Having an Acid Dissociation Constant (pKa) of 5.5 or More and a Radical Addition Polymerizable Group In the invention, it is required to contain a binder polymer (specific binder polymer) containing an acid group having an acid dissociation constant (pKa) of 5.5 or more and a radical addition polymerizable group. The specific binder polymer is a high-molecular compound that is soluble or swollen in an alkaline developing solution.

In the invention, as the specific binder polymer are preferable those having an acid group having an acid dissociation constant (pKa) of 5.5 or more (hereinafter, this acid group being properly referred to as "specific acid group") and a radical addition polymerizable group are introduced as one or more of side chain of the binder polymer from the standpoint of effect. However, the specific acid group and radical addition polymerizable group may be introduced into the terminal ends of a polymer main chain of the binder polymer. Suitable examples of the polymer main chains into which the specific acid group and radical addition polymerizable group are introduced include vinyl resins (such as acrylic resins and styrene resins), urethane resins, polyester resins, and polyamide resins.

Acid Group Having an Acid Dissociation Constant (pKa) of 5.5 or More

In the invention, the specific acid group to be contained in the specific binder polymer is required to have an acid dissociation constant (pKa) of 5.5 or more, preferably from 7 to 11.5, and more preferably ranging from 8 to 11. Specific examples of the specific acid group include a phenol group (pKa=9.99), a 2-methoxyphenol group (pKa=9.99), a 2-chlorophenol group (pKa=8.55), a 2-hydroxybenzoic acid methyl group (pKa=9.87), a 4-methylphenol group (pKa=10.28), a 1,3-benzenediol group (pKa=9.20), a 1-naphthol group (pKa=9.30), a 1,2-benzenediol group (pKa=9.45), a benzenesulfonamide group (pKa=10.00), an N-acetylphenylbenzenesulfonamide group (pKa=6.94), a 4-aminobenzenesulfonamide group (pKa=10.58), an N-phenyl-4-aminobenzenesulfonamide group (pKa=6.30), an N-(4-acetylphenyl)-4-aminobenzenesulfonamide group (pKa=7.61), an acetylacetic acid ethyl group (pKa=10.68), a barbituric acid group (pKa=8.02), and a 4-pyridineamide group (pKa=11.47). Among these, most preferable are a phenol group that may have substituent(s) on an aromatic group thereof and a benzenesulfonamide group that may have substituent(s) on a aromatic group thereof.

Incidentally, the values of acid dissociation constant (pKa) given in the foregoing specific examples are those described in *IONISATION CONSTANTS OF ORGANIC ACIDS IN AQUEOUS SOLUTION* by E. P. Serjeant, et al., and *LANGE'S HANDBOOK OF CHEMISTRY* by John A. Dean.

As structural units having the foregoing specific acid group, structural units represented the following general formula (1) are preferable.

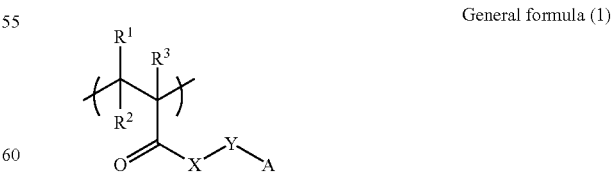

General formula (1)

In the general formula (1), X represents O, S, or —NR$^4$—; Y represents a divalent organic group; A represents a specific acid group; and each of R$^1$, R$^2$, R$^3$ and R$^4$ independently represents a hydrogen atom, a halogen atom, a monovalent organic group, a cyano group, or a nitro group.

In the general formula (1), examples of the monovalent organic group represented by each of $R^1$, $R^2$, $R^3$ and $R^4$ include a linear, branched or cyclic alkyl group, an aromatic group, an alkoxyl group, an acyl group, an aralkyl group, an alkoxycarbonyl group, and an aryloxy group.

The monovalent organic group may further have one or more substituents. Examples of substituents that can be introduced include an alkyl group, an aryl group, an alkoxyl group, an acyloxy group, a halogen atom, a hydroxyl group, an amino group, a cyano group, and a nitro group.

In the general formula (1), examples of the divalent organic group represented by Y include an alkylene group, a phenylene group, and a naphthylene group.

The divalent organic group may further have a substituent. Examples of substituents that can be introduced include an alkyl group, an aryl group, an alkoxyl group, an acyloxy group, a halogen atom, a hydroxyl group, an amino group, a cyano group, and a nitro group.

As structural units having the foregoing specific acid group, structural units represented the following general formulae (2) to (8) are also preferable.

General formula (2)

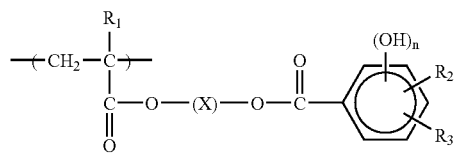

In the general formula (2), X represents an alkylene group, a substituted alkylene group, —CH₂CH₂OCH₂CH₂—,

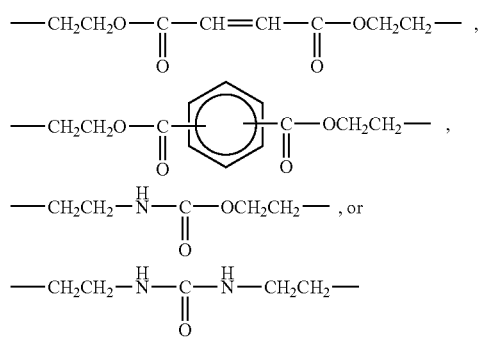

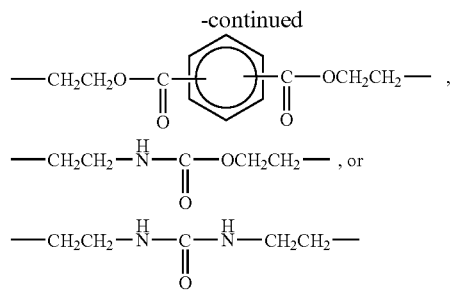

$R^1$ represents a hydrogen atom, a halogen atom, or an alkyl group. Each of $R^2$ and $R^3$ independently represents a hydrogen atom, a halogen atom, an alkyl group, a substituted alkyl group, an aromatic group, a substituted aromatic group, —OR⁴, —COOR⁵, —COONHR⁶, —COR⁷, or —CN. $R^2$ and $R^3$ may be bonded to each other to form a ring. Each of $R^4$ to $R^7$ independently represents an alkyl group or an aromatic group. n represents 2 or 3.

The general formula (2) will be described below in detail.

In the general formula (2), $R^1$ represents a hydrogen atom, a halogen atom, or an alkyl group; preferably a hydrogen atom, a chlorine atom, or an alkyl group having from 1 to 4 carbon atoms: and particularly preferably a hydrogen atom or a methyl group. X represents an alkylene group, a substituted alkylene group, —CH₂CH₂OCH₂CH₂—.

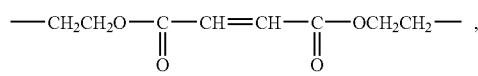

X preferably represents an alkylene group or a substituted alkylene group each having from 1 to 20 carbon atoms, and particularly preferably an alkylene group having from 2 to 6 carbon atoms.

As substituents that the foregoing substituted alkylene group has are preferably a hydroxyl group, an alkyl group having from 1 to 10 carbon atoms, an alkoxyl group having from 1 to 10 carbon atoms, and an acyloxy group having from 1 to 10 carbon atoms.

In the general formula (2), each of $R^2$ and $R^3$ independently represents a hydrogen atom, a halogen atom, an alkyl group, a substituted alkyl group, an aromatic group, a substituted aromatic group, —OR⁴, —COOR⁵, —COONHR⁶, —COR⁷, or —CN. $R^2$ and $R^3$ may be bonded to each other to form a ring. Each of $R^4$ to $R^7$ independently represents an alkyl group or an aromatic group. Preferably, each of $R^2$ and $R^3$ independently represents a hydrogen atom, a chlorine atom, an alkyl group having from 1 to 4 carbon atoms, a phenyl group, —OR⁴, —COOR⁵, —COONHR⁶, —COR⁷, or —CN; and each of $R^4$ to $R^7$ represents an alkyl group having from 1 to 4 carbon atoms or a phenyl group. Particularly preferably, each of $R^2$ and $R^3$ independently represents a hydrogen atom, a chlorine atom, a methyl group, or a methoxy group.

General formula (3)

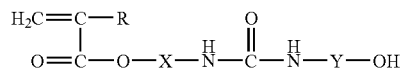

In the general formula (3), R represents a hydrogen atom or an alkyl group. X represents a divalent linking group Y represents a divalent aromatic group which may have one or more of substituents.

In the general formula (3), examples of the divalent linking group represented by Y include an alkylene group or a phenylene group, wherein each of which may be optionally substituted (namely, each of which may have one or more of substituents). Examples of the optionally substituted divalent aromatic group represented by Y include an optionally substituted phenylene group or a naphthylene group.

General formula (4)

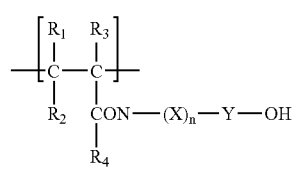

In the general formula (4), $R^1$ and $R^2$ each independently represents a hydrogen atom, an alkyl group, or a carboxylic acid group. $R^3$ represents a hydrogen atom, a halogen atom, or an alkyl group. $R^4$ represents a hydrogen atom, an alkyl group, a phenyl group, or an aralkyl group. X represents a divalent organic group linking a nitrogen atom to a carbon atom in an aromatic ring n represents 0 or 1. Y represents a phenylene group or a naphthylene group, each of which may have one or more of substituents.

The general formula (4) will be described below in detail.

In the structural unit represented by the general formula (4), Y represents an optionally substituted phenylene group or an optionally substituted naphthylene group. Since it is rare that the characteristics of the polymerizable composition of the invention being substantially largely influenced by the kind of substituent, arbitrary groups can be used as the substituents. Representative examples of substituents include an alkyl group, an alkoxyl group, a halogen atom, an acyl group, a hydroxyl group, a carboxylic acid group, a sulfonic acid group, a cyano group, and a nitro group.

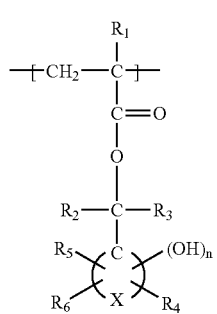

General formula (5)

In the general formula (5), $R_1$ represents a hydrogen atom, a halogen atom, a cyano group, or an alkyl group. Each of $R_2$ and $R_3$ independently represents a hydrogen atom, a halogen atom, an alkyl group, an alkoxyl group, or an aryl group. Each of $R^4$, $R^5$ and $R^6$ independently represents a hydrogen atom, an alkyl group, an aryl group or a halogen atom. X represents an atom necessary for completing a monocyclic or polycyclic carbocyclic aromatic ring system. n represents 1, 2 or 3.

As the structural unit represented by the general formula (5), preferable examples include those in which $R^1$ represents a hydrogen atom, a halogen atom, a cyano group, or an alkyl group having from 1 to 6 carbon atoms; each of $R^2$ and $R^3$ independently represents a hydrogen atom or an alkyl group having from 1 to 4 carbon atoms; each of $R^4$, $R^5$ and $R^6$ independently represents a hydrogen atom, an alkyl group having from 1 to 4 carbon atoms, an aryl group or a halogen atom; X represents a carbon atom necessary for completing a benzene ring or a naphthalene ring; and n represents 1.

As the structural unit represented by the general formula (5), particularly preferable examples include those in which $R^1$ represents a hydrogen atom or a methyl group: each of $R^2$, $R^3$ and $R^4$ represents a hydrogen atom; $R^5$ represents a hydrogen atom, an alkyl group having from 1 to 4 carbon atoms, or a halogen atom; $R^6$ represents a hydrogen atom, an alkyl group having from 1 to 4 carbon atoms, an aryl group, or a halogen atom; X represents a carbon atom necessary for completing a benzene ring or a naphthalene ring; and n represents 1.

In the general formula (5), in the case where $R^1$ represents an alkyl group, the alkyl group preferably has from 1 to 6 carbon atoms, and more preferably 1 or 2 carbon atoms. Particularly preferably, $R^1$ represents a hydrogen atom or a methyl group.

In the general formula (5), it is preferred that at least one of $R^2$ and $R^3$ represents a hydrogen atom. In the case where each of $R^2$ and $R^3$ represents an alkyl group, the alkyl group preferably has from 1 to 6 carbon atoms, and more preferably from 1 to 3 carbon atoms.

In the general formula (5), $R^4$ preferably represents hydrogen. $R^5$ preferably represents an alkyl group having from 1 to 4 carbon atoms, and more preferably a methyl group. $R^6$ preferably represents an alkyl group having from 1 to 4 carbon atoms or an aryl group.

In general, the term "alkyl group" as referred to herein means a cyclic or non-cyclic, branched or non-branched, saturated or unsaturated group that may be substituted with one or more of halogen atoms or one or more of hydroxyl groups or may contain an ether group or a ketone group. The alkyl group is preferably a non-branched alkyl group having from 1 to 4 carbon atoms. The term "aryl group" as referred to herein means a heterocyclic or carbocyclic aromatic ring system that may be monocyclic or polycyclic and may be substituted with one or more of aryl groups, alkoxyl groups, hydroxyl groups, or halogen atoms.

The position on which the substituent resides on the ring system X is not particularly limited, and that is influenced only by easiness of preparation of compounds.

The carbocyclic aromatic ring system x may be monocyclic or polycyclic. Examples of the carbocyclic ring system particularly preferably includes benzene systems and naphthalene systems.

As the halogen atoms used in the general formula (5), chlorine, bromine and iodine atoms are preferable, and among them, chlorine is particularly preferable.

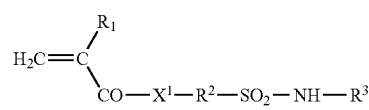

General formula (6)

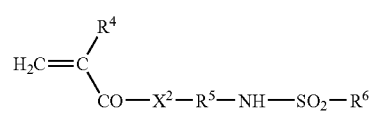

General formula (7)

In the general formulae (6) and (7), each of $X^1$ and $X^2$ independently represents —O— or —$NR^7$—. Each of $R^1$ and $R^4$ independently represents —H or —$CH_3$. Each of $R^2$ and $R^5$ independently represents an alkylene group, a cycloalkylene group, an arylene group or an aralkylene group each having from 1 to 12 carbon atoms and each of which may have substituents; $R^3$ represents —H or an alkyl group, a cycloalkyl group, an aryl group or an aralkyl group each having from 1 to 12 carbon atoms and each of which may have substituents. $R^6$ represents an alkyl group, a cycloalkyl group, an aryl group or an aralkyl group each having from 1 to 12 carbon atoms and each of which may have substituents. $R^7$ represents a hydrogen atom or an alkyl group, a cycloalkyl group, an aryl group or an aralkyl group each having from 1 to 12 carbon atoms and each of which may have substituents.

General formula (8)

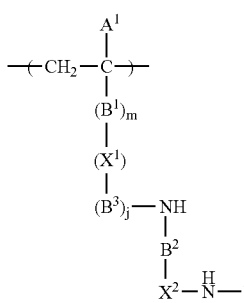

In the general formula (8), $A^1$ represents a hydrogen atom, a halogen atom, or an alkyl group having from 1 to 4 carbon atoms; $B^1$ represents a phenylene group or a substituted phenylene group. $B^2$ represents an alkylene group having from 2 to 6 carbon atoms or a phenylene group, wherein each of which may have substituents; B represents a divalent organic group. Each of $X^1$ and $x^2$ independently represents —CO— or —$SO_2$—. Y represents —CO—$R^1$ or —$SO_2$—$R^1$. $R^1$ represents an alkyl group, a substituted alkyl group, an aromatic group, or a substituted aromatic group. Each of m and j represents 0 or 1.

Specific examples (A-1 to A-16, B-1 to B-6, C-1 to C-15, D-1 to D-6, E-1 to E-15, F-1 to F-13, G-1 to G-3, H-1 to H-2, and J-1 to J-2) of copolymerization monomers to be used as structural units represented by the general formulae (1) to (8) will be given below, but it should not be construed that the invention is limited thereto. Incidentally, these copolymerization monomers were synthesized by the methods described in JP-A Nos. 7-333839 and 8-339080, JP-B No. 52-28401, and JP-A Nos. 4-212961, 2-866 and 8-286369.

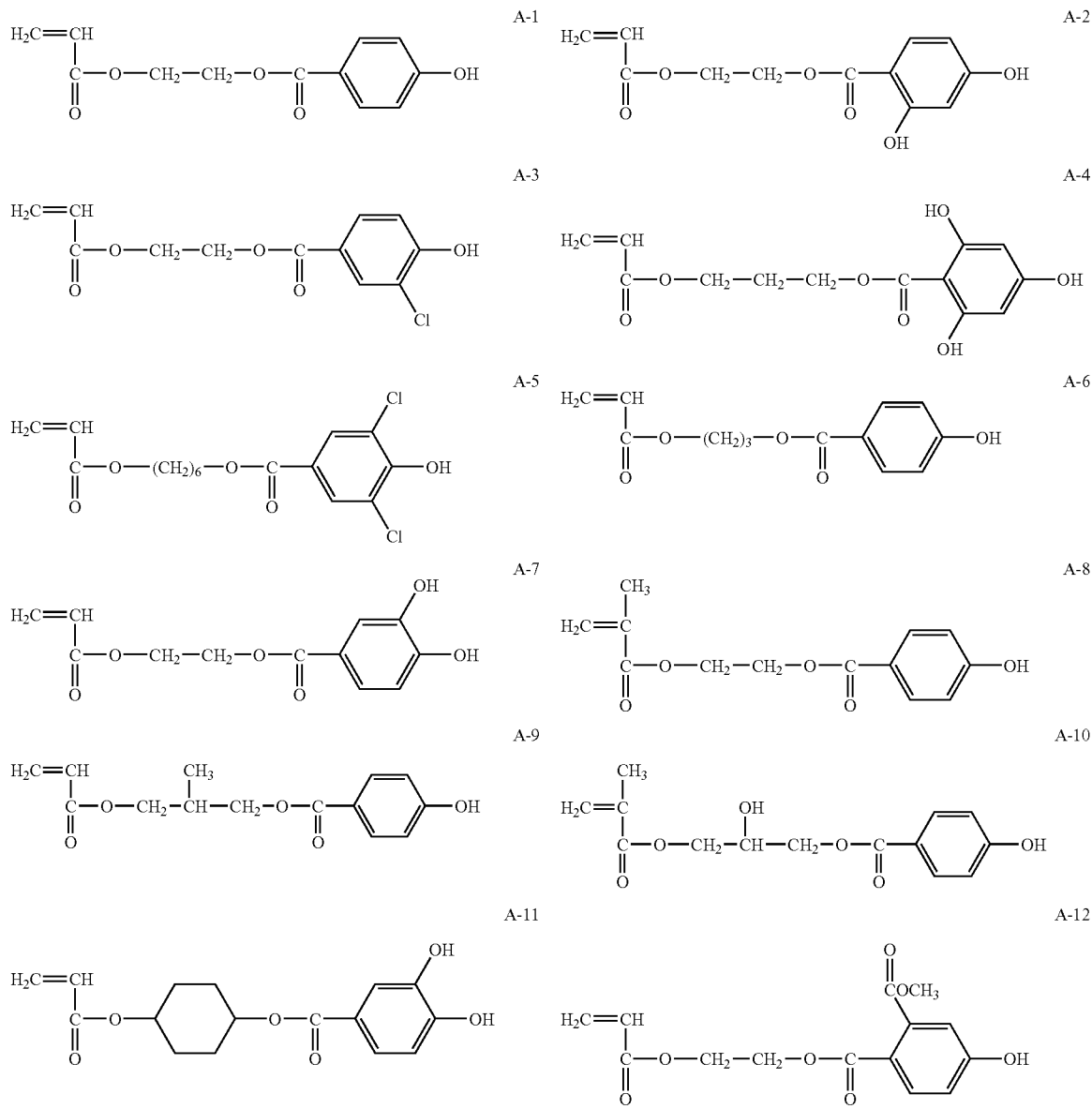

-continued
A-13 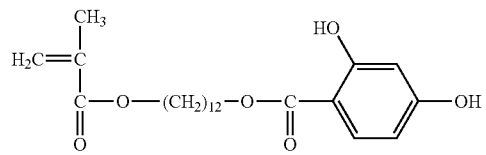
A-14 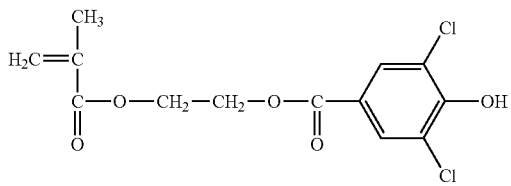
A-15 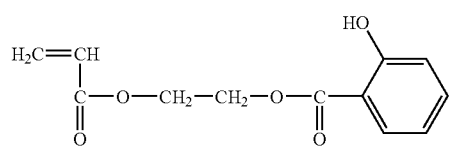
A-16 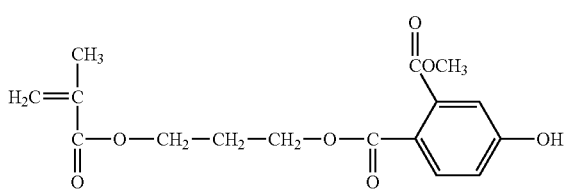
B-1 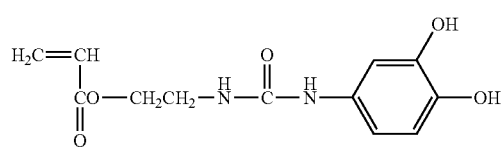
B-2 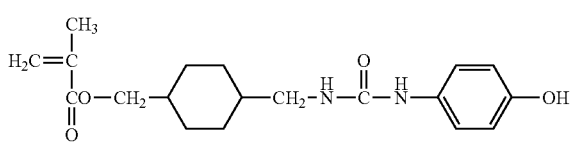
B-3 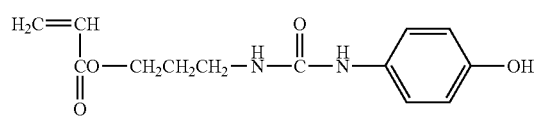
B-4 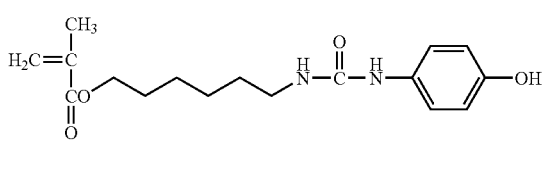
B-5 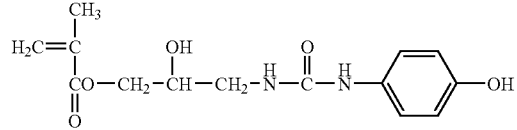
B-6 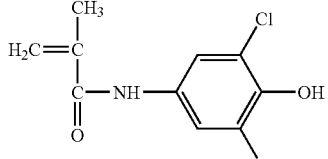
C-1 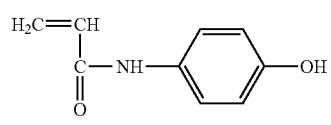
C-2 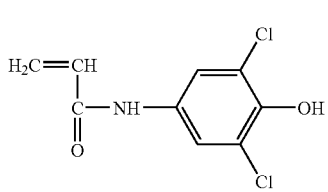
C-3 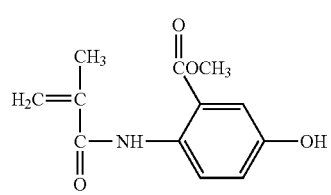
C-4 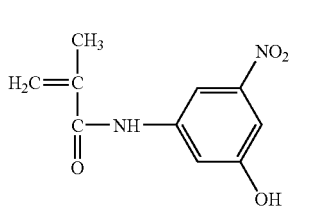
C-5 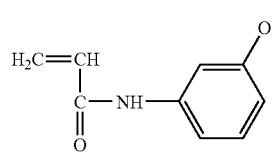
C-6 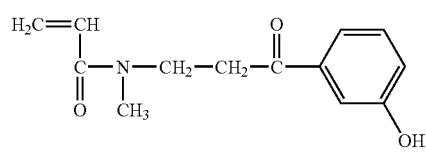

-continued
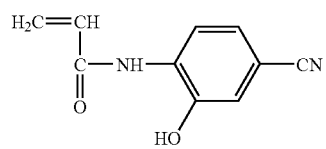
C-9
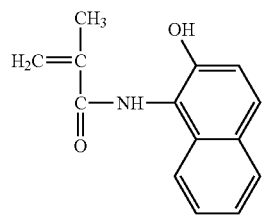
C-10
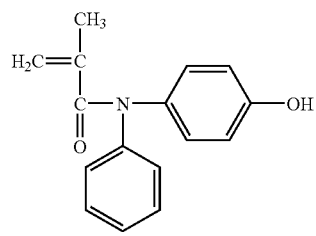
C-11
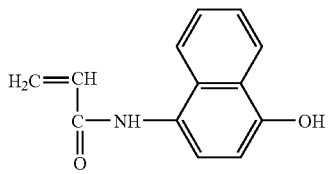
C-12
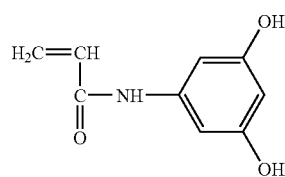
C-13
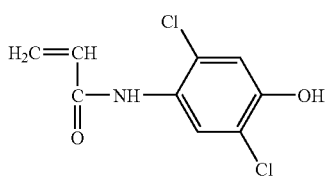
C-14
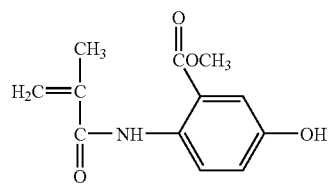
C-15
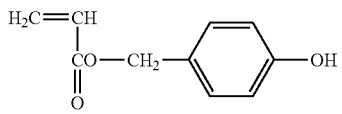
D-1
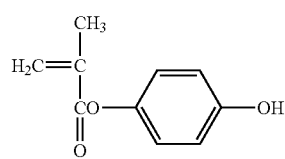
D-2
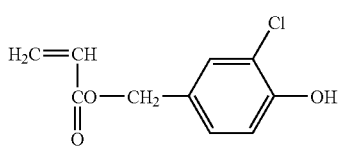
D-3
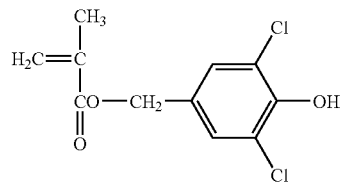
D-4
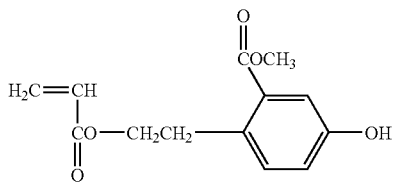
D-5
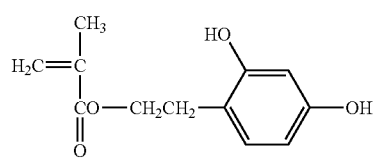
D-6
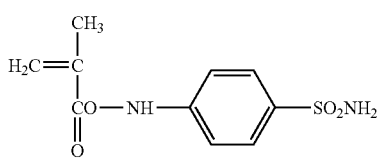
E-1
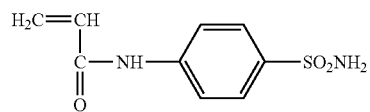
E-2
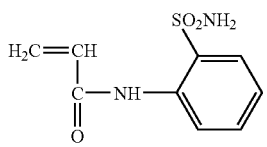
E-3

-continued
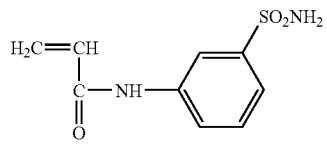 E-4
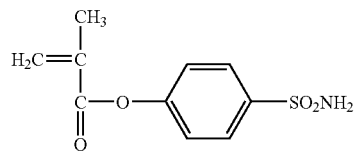 E-5
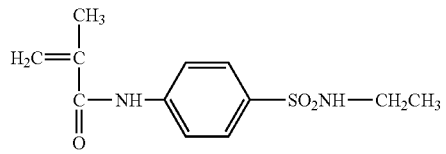 E-6
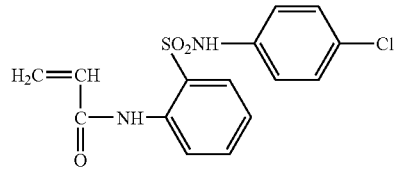 E-7
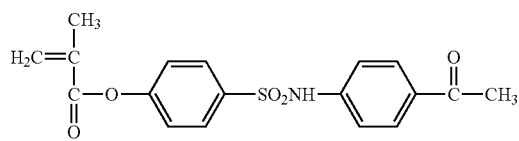 E-8
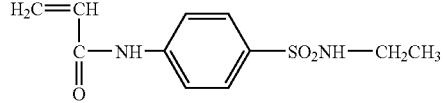 E-9
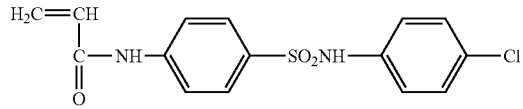 E-10
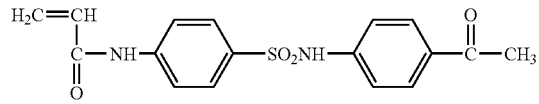 E-11
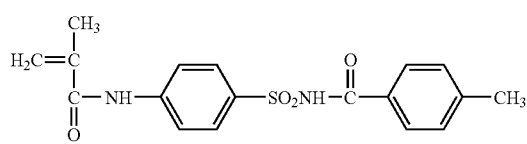 E-12
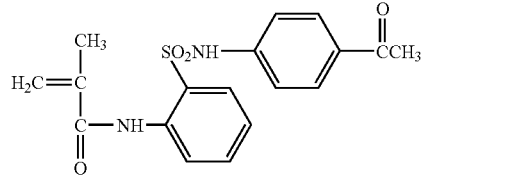 E-13
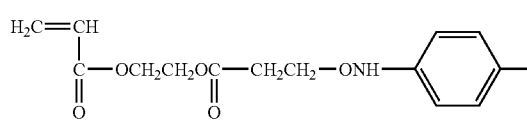 E-14
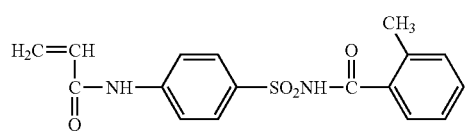 E-15
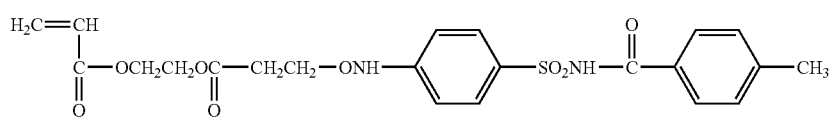 F-1
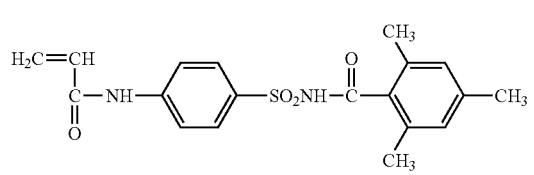 F-2
F-3
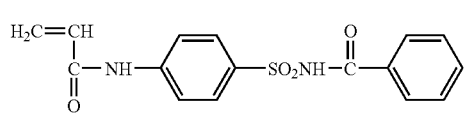 F-4

-continued
F-6
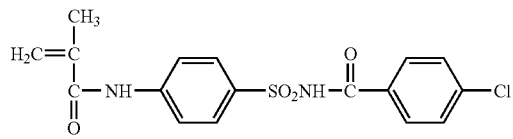
F-7
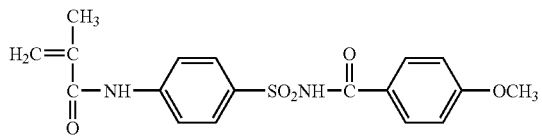
F-8
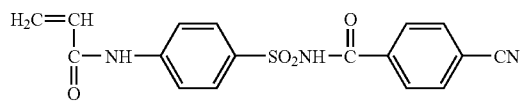
F-9
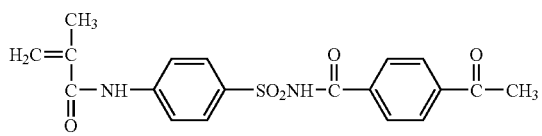
F-10
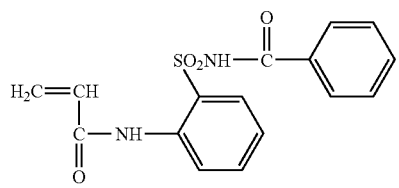
F-11
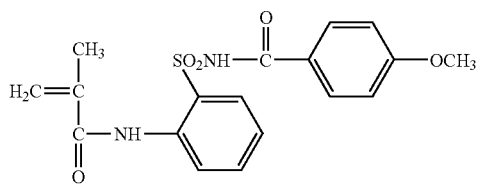
F-12
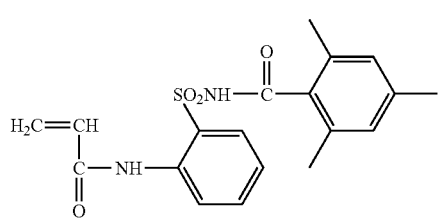
F-13
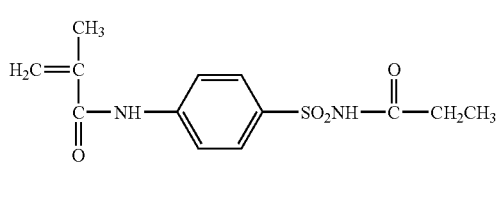
G-1
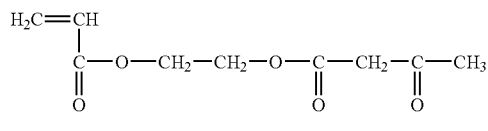
G-2
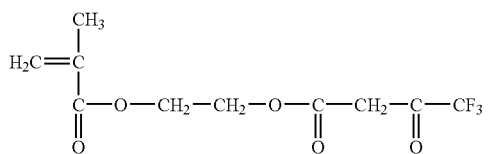
G-3
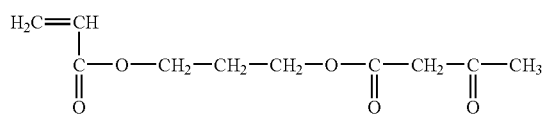
H-1
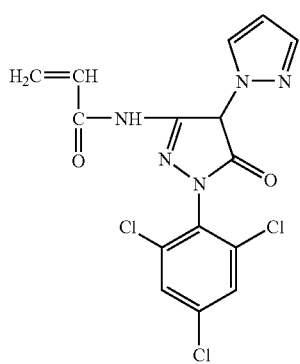

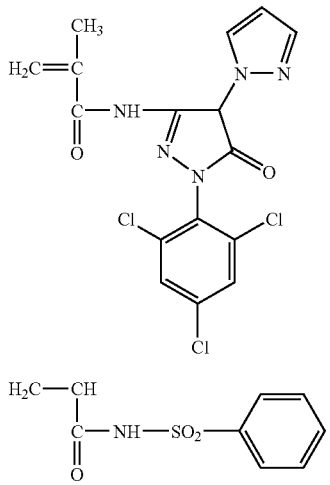

H-2

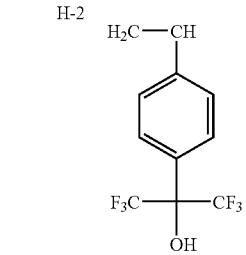

I-1

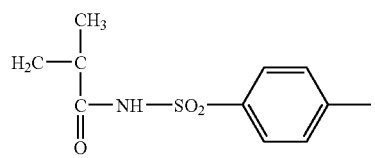

J-1

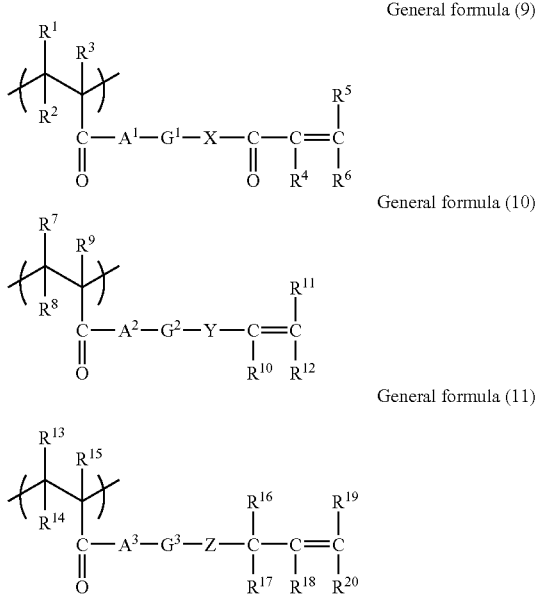

J-2

The structural unit containing the foregoing specific acid group may be contained singly or in combination of two or more thereof in the specific binder polymer.

Radical Addition Polymerizable Group-containing Structural Unit

In the invention, as a structural unit containing a radical addition polymerizable group contained in the specific binder polymer, structural units represented by one of the following general formulae (9) to (11) are preferable.

General formula (9)

General formula (10)

General formula (11)

In the general formulae (9) to (11), each of $A^1$, $A^2$ and $A^3$ independently represents an oxygen atom, a sulfur atom, or —N($R^{22}$)—. $R^{22}$ represents a hydrogen atom or an alkyl group which may have substituents. Each of $G^1$, $G^2$ and $G^3$ independently represents a divalent organic group. Each of X and Z independently repres nts an oxyg n atom, a sulfur atom, or —N($R^{22}$)—. $R^{22}$ represents a hydrogen atom or an alkyl group which may have substituents. Y represents an oxygen atom, a sulfur atom, a phenylene group which may have substituents, or —N($R^{23}$)—. $R^{23}$ represents an alkyl group which may have substituents. Each of $R^1$ to $R^{20}$ independently represents a monovalent inorganic or organic group.

The general formula (9) will be described below in detail.

In the general formula (9), Each of $R^1$ to $R^3$ independently represents a monovalent inorganic or organic group, examples of which include a hydrogen atom and an optionally substituted alkyl group. Especially, Each of $R^1$ and $R^2$ preferably represents a hydrogen atom, and $R^3$ preferably represents a hydrogen atom or a methyl group.

In the general formula (9), Each of $R^4$ to $R^6$ independently represents a monovalent inorganic or organic group. $R^4$ is preferably a hydrogen atom or an optionally substituted alkyl group, wherein a hydrogen atom, a methyl group and an ethyl group are more preferable. Each of $R^5$ and $R^6$ are preferably a hydrogen atom, a halogen atom, an alkoxycarbonyl group, a sulfo group, a nitro group, a cyano group, an optionally substituted alkyl group, an optionally substituted aryl group, an optionally substitute alkoxyl group, an optionally substituted aryloxy group, an optionally substituted alkylsulfonyl group, and an optionally substituted arylsulfonyl group, wherein a hydrogen atom, an alkoxycarbonyl group, an optionally substituted alkyl group, and an optionally substituted aryl group are preferable.

Here, examples of substituents that can be introduced include a methoxycarbonyl group, an ethoxycarbonyl group, an isopropoxycarbonyl group, a methyl group, an ethyl group, and a phenyl group.

In the general formula (9), $A^1$ represents an oxygen atom, a sulfur atom, or —N($R^{21}$)—; and $R^{21}$ represents a hydrogen atom or an optionally substituted alkyl group. X represents an oxygen atom, a sulfur atom, or —N($R^{22}$)—; and $R^{22}$ represents a hydrogen atom or an optionally substituted alkyl group.

In the general formula (9), $G^1$ represents a divalent organic group, which is preferably an optionally substituted alkyl group, and more preferably an optionally substituted alkyl group having from 1 to 20 carbon atoms, an optionally substituted cycloalkyl group having from 3 to 20 carbon atoms, or an optionally substituted aromatic group having from 6 to 20 carbon atoms. Among these, an optionally substituted, linear or branched alkyl group having from 1 to 10 carbon atoms, an optionally substituted cycloalkyl group having from 3 to 10 carbon atoms, and an optionally substituted aromatic group having from 6 to 12 carbon atoms are preferable from the viewpoint of performance of strength, developability and the like.

Here, as the substituent in $G^1$, groups in which a hydrogen atom is bonded to a hetero atom, such as a hydroxyl group, an amino group, a thiol group, and ones free from a carboxyl group, are preferable. When a compound having a linking group in which a hydrogen atom is bonded to a hetero atom is used in combination with an onium salt compound described later as an initiator, storage stability of the polymerizable composition is deteriorated.

The general formula (10) will be described below in detail.

In the general formula (10), each of $R^7$ to $R^9$ independently represents a monovalent inorganic or organic group, examples of which include a hydrogen atom and an optionally substituted alkyl group. Especially, each of $R^7$ and $R^8$ preferably represents a hydrogen atom, and $R^9$ preferably represents a hydrogen atom or a methyl group.

In the general formula (10), each of $R^{10}$ to $R^{12}$ independently represents a monovalent inorganic or organic group. Specific examples of organic groups include a hydrogen atom, a halogen atom, a dialkylamino group, an alkoxycarbonyl group, a sulfo group, a nitro group, a cyano group, an optionally substituted alkyl group, an optionally substituted aryl group, an optionally substituted alkoxyl group, an optionally substituted aryloxy group, an optionally substituted alkylsulfonyl group, and an optionally substituted arylsulfonyl group, wherein a hydrogen atom, an alkoxycarbonyl group, an optionally substituted alkyl group, and an optionally aryl group are more preferable.

Examples of the substituents that can be introduced include those as listed above for the general formula (9).

In the general formula (10), $A^2$ represents an oxygen atom, a sulfur atom, or —N($R^{21}$)—; and $R^{21}$ represents a hydrogen atom or an optionally substituted alkyl group.

In the general formula (10), $G^2$ represents a divalent organic group, and preferably an optionally substituted alkyl group. Preferable examples include an optionally substituted alkyl group having from 1 to 20 carbon atoms, an optionally substituted cycloalkyl group having from 3 to 20 carbon atoms, and an optionally aromatic group having from 6 to 20 carbon atoms. Among these, an optionally substituted, linear or branched alkyl group having from 1 to 10 carbon atoms, an optionally substituted cycloalkyl group having from 3 to 10 carbon atoms, and an optionally substituted aromatic group having from 6 to 12 carbon atoms are preferable from the viewpoint of performance of strength, developability and the like.

Here, as the substituent in $G^2$, groups in which a hydrogen atom is bonded to a hetero atom, such as a hydroxyl group, an amino group, a thiol group, and ones free from a carboxyl group, are preferable. When a compound having a linking group in which a hydrogen atom is bonded to a hetero atom is used in combination with an onium salt compound described later as an initiator, storage stability of the polymerizable composition is deteriorated.

In the general formula (10), Y represents an oxygen atom, a sulfur atom, —N($R^{23}$)—, or an optionally substituted phenylene group; and $R^{22}$ represents a hydrogen atom or an optionally substituted alkyl group.

The general formula (11) will be described below in detail.

In the general formula (11), each of $R^{13}$ to $R^{15}$ independently represents a monovalent inorganic or organic group, examples of which include a hydrogen atom and an optionally substituted alkyl group. Especially, each of $R^{13}$ and $R^{14}$ preferably represents a hydrogen atom, and $R^{15}$ preferably represents a hydrogen atom or a methyl group.

In the general formula (11), each of $R^{16}$ to $R^{20}$ independently represents a monovalent inorganic or organic group. Specific examples of $R^{16}$ to $R^{20}$ include a hydrogen atom, a halogen atom, a dialkylamino group, an alkoxycarbonyl group, a sulfo group, a nitro group, a cyano group, an optionally substituted alkyl group, an optionally substituted aryl group, an optionally substituted alkoxyl group, an optionally substituted aryloxy group, an optionally substituted alkylsulfonyl group, and an optionally substituted arylsulfonyl group. Among them, a hydrogen atom, an alkoxycarbonyl group, an optionally substituted alkyl group, and an optionally aryl group are more preferable. Examples of substituents that can be introduced include those as listed above for the general formula (9). Each of $A^3$ and Z represents an oxygen atom, a sulfur atom, or —N($R^{21}$)—. As $R^{21}$, those as listed above for the general formula (9) can be provided.

In the general formula (11), $G^3$ represents a divalent organic group, and preferably an optionally substituted alkyl group. Preferable examples include an optionally substituted alkyl group having from 1 to 20 carbon atoms, an optionally substituted cycloalkyl group having from 3 to 20 carbon atoms, and an optionally aromatic group having from 6 to 20 carbon atoms. Among these, an optionally substituted, linear or branched alkyl group having from 1 to 10 carbon atoms, an optionally substituted cycloalkyl group having from 3 to 10 carbon atoms, and an optionally substituted aromatic group having from 6 to 12 carbon atoms are preferable from the viewpoint of performance of strength, developability and the like.

Here, as the substituent in $G^3$, groups in which a hydrogen atom is bonded to a hetero atom, such as a hydroxyl group, an amino group, a thiol group, and ones free from a carboxyl group, are preferable. When a compound having a linking group in which a hydrog n atom is bonded to a hetero atom is used in combination with an onium salt compound described later as an initiator, storage stability of the polymerizable composition is deteriorated.

The structural unit containing the foregoing radical addition polymerizable group may be contained singly or in combination of two or more thereof in the specific binder polymer.

A mixing ratio of structural units that have the acid groups relative to total structural units contained in the binder polymer is preferably in a range of 5 to 70% by mole, more preferably in a range of 10 to 60% by mole, and further preferably in a range of 20 to 50% by mole. A a mixing ratio of structural units that have the radical addition polymerizable groups relative to total structural units contained in the binder polymer is preferably in a range of 5 to 95% by mole, more preferably in a range of 20 to 80% by mole, and further preferably in a range of 30 to 70% by mole.

Others

In the invention, the specific binder polymer may contain other radical polymerizable compounds as a copolymerization component, other than the foregoing structural unit containing a specific acid group and structural unit containing a radical addition polymerizable group. Examples of other radical polymerizable compounds include acrylic acid esters, methacrylic acid esters, N,N-di-substituted acrylamides, N,N-di-substituted methacrylamides, styrenes, acrylonitriles, and methacrylonitriles.

Specific examples include acrylic acid esters such as alkyl acrylates (preferably those in which the alkyl group thereof has from 1 to 20 carbon atoms, such as methyl acrylate, ethyl acrylate, propyl acrylate, butyl acrylate, amyl acrylate, ethylhexyl acrylate, octyl acrylate, t-butyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydrofurfuryl acrylate) and aryl acrylates (such as phenyl acrylate); methacrylic acid esters such as alkyl methacrylates (preferably those in which the alkyl group thereof has from 1 to 20 carbon atoms, such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxyprpyl methacrylate, trimethylolpropane monomethacrylate, pentaerythritol monomethacrylate, glycidyl m thacrylate, furfuryl methacrylate, and tetrahydrofurfuryl methacrylate) and aryl methacrylates (such as phenyl methacrylate, cresyl methacrylate, and naphthyl methacrylate); styrenes such as styrene, alkylstyrenes (such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromechylstyrene, trifluoromethylstyrene, ethoxymethylstyrene, and acetoxymethylstyrene), alkoxystyrenes (such as methoxystyrene, 4-methoxy-3-methylstyrene, and dimethoxystyrene), halogen styrenes (such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene); acrylonitrile; and methacrylonitrile.

These other radical polymerizable compounds may be contained singly or in combination of two or more thereof in the specific binder polymer.

In the case where these other radical polymerizble compounds are contained as a copolymerization component in the specific binder polymer, the content thereof is preferably from 10 to 90% by mole, and more preferably from 20 to 70% by mole.

In the invention, the specific binder polymer pr ferably has a weight average molecular weight in the range of 2,000 to 1,000,000, more preferably from 10,000 to 500,000, and further preferably from 20,000 to 200,000. When the weight average molecular weight is too low, the cured film is insufficient in strength, whereas when it is too high, developability is liable to be lowered.

In the invention, the specific binder polymer may contain unreacted monomers. In this case, it is desired that the proportion of such monomers occupying in the specific binder polymer is not more than 15% by weight.

The content of the specific binder polymer in the polymerizable composition of the invention is preferably from 5 to 95% by weight, and more preferably from 40 to 90% by weight in the whole of solid contents, like the case where it is used in a recording layer of planographic printing plate precursor. When the content is too low, the recording layer is insufficient in strength, likely leading to a reduction of printing endurance, whereas when it is too high, image forming property is influenced, whereby image quality is possibly lowered. Therefore, both are not preferred.

Representative synthesis examples and specific high-molecular compounds of the specific binder polymer will be described below, but it should not be construed that the invention is limited thereto. Incidentally, the following Synthesis Examples are acc rding to the method described in JP-A No. 2002-062648.

Synthesis Example 1

Synthesis of High-Molecular Compound (1)

In a 500-mL three-necked flask equipped with a condenser and a stirrer, 240 mL of dimethylacetamide was charged and heated at 70° C. A dimethylacetamide solution (240 mL) containing 33.9 g of a precursor monomer having a structural unit containing a radical addition polymerizable group (Compound M-1 described below), 20.5 g of methyl methacrylate, 36.3 g of Illustrative Compound (A-8) and 0.690 g of an azo heat polymerization initiator (a trade name: V-65, manufactured by Wako Pure Chemical Industries, Ltd.) was added dropwise thereto over 2.5 hours in a nitrogen gas stream. The mixture was allowed to react at 70° C. for 2 hours. After cooling the reaction mixture to 0° C., 38.9 g of triethylamine was added dropwise thereto with stirring, and the mixture was allowed to react for 15 hours while gradually elevating the temperature to room temperature. After cooling the reaction mixture to 0° C., 3M HCl was added dropwise thereto with stirring until the pH of the reaction mixture became 6 or less. The reaction mixture was thrown into 5.5 L of water to deposit a polymer. The polymer was collected by filtration, rinsed and then dried to obtain 85.2 g of High-Molecular Compound (1). It was confirmed from NMR spectrum that all of groups derived from (M-1) were converted into an acrylic group. As a result of gel permeation chromatography (GPC) using polystyrene as a standard substance, this compound had a weight average molecular weight of 105,000.

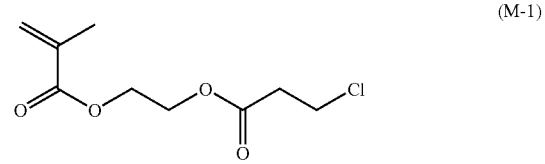

(M-1)

Synthesis Example 2

Synthesis of High-Molecular Compound (4)

In a 2,000-mL three-necked flask equipped with a condenser and a stirrer. 750 g of dimethylacetamide was charged and heated at 70° C. A dimethylacetamide solution (750 g) containing 32.2 g of allyl methacrylate, 74.3 g of Illustrative Compound (E-7), 4.2 g of methyl methacrylate and 0.679 g of an azo heat polymerization initiator (a trade name: V-59, manufactured by Wako Pure Chemical Industries. Ltd.) was added dropwise thereto over 2.5 hours in a nitrogen gas stream. The mixture was allowed to react at 70° C. for 2 hours. After cooling the reaction mixture to room temperature, the reaction mixture was thrown into 4 L of water to deposit a polymer. The polymer was collected by filtration, rinsed and then dried to obtain 100 g of High- Molecular Compound (4). As a result of gel permeation chromatography (GPC) using polystyrene as a standard substance, this compound had a weight average molecular weight of 115,000.

Synthesis Examples 3 to 18

Syntheses of High-Molecular Compounds (2), (3) and (5) to (18)

High-Molecular Compounds (2), (3) and (5) to (18) were synthesized in the same manners as in Synthesis Examples 1 and 2 while changing the kinds of monomers to be charged and composition ratios. These compounds were measured for weight average molecular weight in the same manners as in Synthesis Examples 1 and 2.

The high-molecular compounds (specific binder polymers) obtained in the foregoing synthesis methods are shown in the following Tables 1 to 4 with respect to structures and polymerization molar ratios of the structural units thereof along with their weight average molecular weights measured (High-Molecular Compounds (1) to (18)).

TABLE 1

| Syn. No. | Composition (% by mole) | Mw |
| --- | --- | --- |
| 1 | (structures) | 205,000 |
| 2 | (structures) | 123,000 |
| 3 | (structures) | 78,000 |

TABLE 1-continued

| Syn. No. | Composition (% by mole) | Mw |
|---|---|---|
| 4 | (structures shown) | 115,000 |
| 5 | (structures shown) | 152,000 |

TABLE 2

| Syn. No. | Composition (% by mole) | Mw |
|---|---|---|
| 6 | (structures shown) | 142,000 |
| 7 | (structures shown) | 95,000 |

TABLE 2-continued
| Syn. No. | Composition (% by mole) | Mw |
|---|---|---|
| 8 | 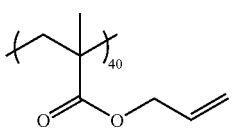 | 104,000 |
| 9 | 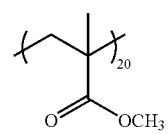 | 75,000 |
| 10 | 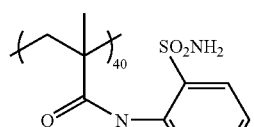 | 153,000 |
| 11 | 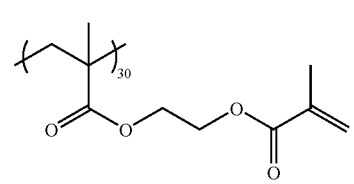 | 135,000 |
TABLE 3
| Syn. No. | Composition (% by mole) | Mw |
|---|---|---|
| 12 | 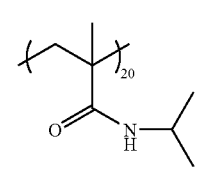 | 179,000 |

TABLE 3-continued

| Syn. No. | Composition (% by mole) | Mw |
| --- | --- | --- |
| 13 | | 153,000 |
| 14 | | 143,000 |
| 15 | | 154,000 |
| 16 | | 175,000 |

TABLE 4

| Syn. No. | Composition (% by mole) | Mw |
|---|---|---|
| 17 | 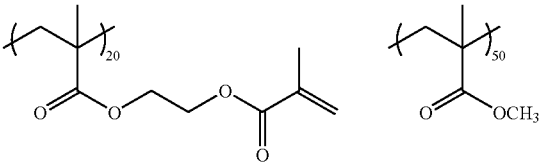 | 153,000 |
| 18 | 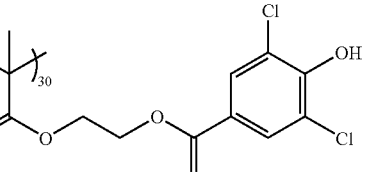 | 135,000 |

Radical-Generating Compound Capable of Generating Radicals with Light or Beat

In the invention, it is necessary to add a radical-generating compound capable of generating radicals by light or heat (polymerization initiator)

In the invention, the "radical-generating compound capable of generating radicals by light or heat" as referred to herein means a compound that forms radicals by light and/or heat energy to initiate polymerization reaction of the radical polymerizable compound and to further accelerate progress the polymerization reaction depending upon the reaction mechanism of that compound.

Preferable examples of the radical-generating compound include (a) aromatic ketones, (b) onium salt compounds, (c) organic peroxides, (d) thio compounds, (e) hexaaryl biimidazole compounds, (f) keto oxime ester compounds, (g) borate compounds, (h) azinium compounds, (i) metallocene compounds, (j) active ester compounds, and (k) compounds having a carbon-halogen bond. Specific examples of these (a) to (k) compounds will be given below, but it should not be construed that the invention is limited thereto.

(a) Aromatic Ketones

As the aromatic ketones (a) are provided compounds having a benzophenone skeleton or a thioxanthone skeleton described in RADIATION CURING IN POLYMER SCI-ENCE AND TECHNOLOGY, J. P. Fouassier, J. F. Rabek (1993), pp. 77–117. Examples include the following compounds.

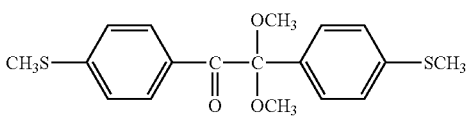

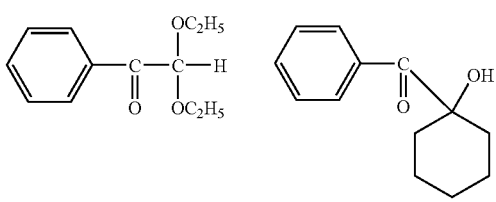

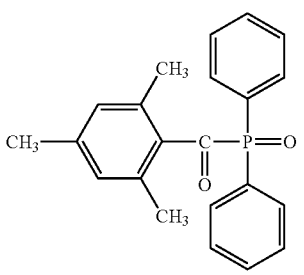

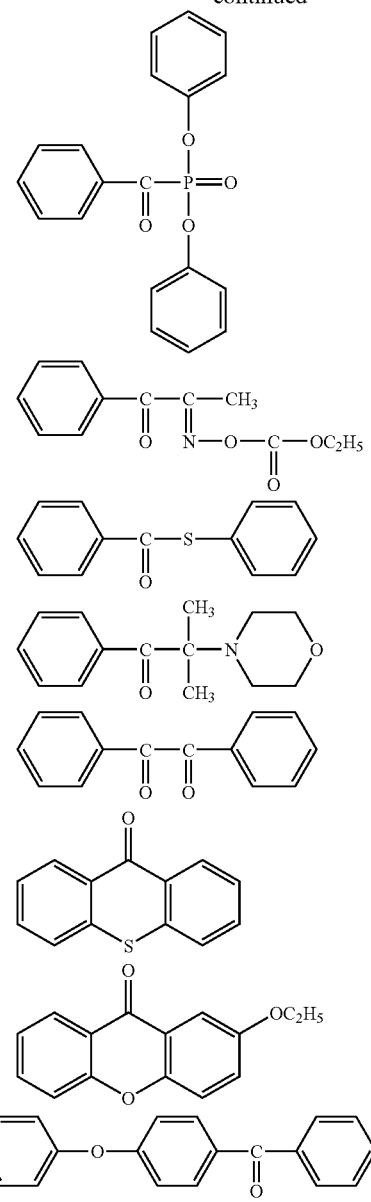

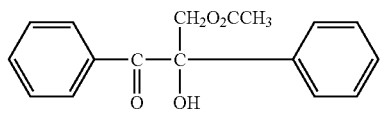

Benzoin derivatives described in JP-B No. 47-23664, aroylphopshonic acid esters described in JP-A No. 57-30704, and dialkoxybenzophenones described in JP-B No. 60-26483, such as the following compound, are provided as preferable examples.

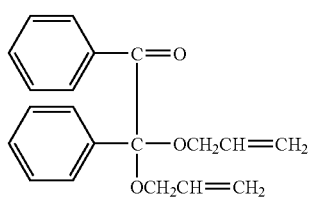

Benzoin ethers described in JP-B No. 60-26403 and JP-A No. 62-81345, such as the following compound, are provided as preferable examples.

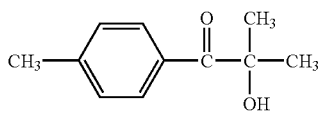

α-Aminobenzophenones described in JP-B No. 1-34242, U.S. Pat. No. 4,318,791 and EP-A No. 0284561, such the following compounds, are provided as preferable examples.

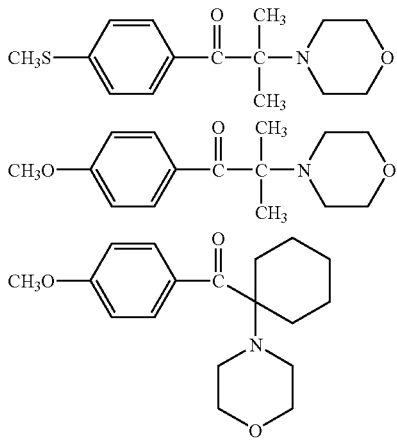

p-Di(dimethylaminobenzoyl)benzene described in JP-A No. 2-211452, which is represented by the following formula, is provided as a preferable example.

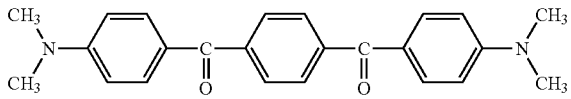

Especially, α-thiobenzophenone compounds described in JP-B No. 47-6416 and benzoin ether compounds described in JP-B No. 47-3981, such as the following compound, are provided as preferable examples of the aromatic ketones (a).

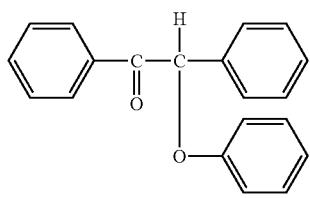

α-Substituted benzoin compounds described in JP-B No. 47-22326, such as the following compound, are provided as preferable examples.

Thio-substituted aromatic ketones described in JP-A No. 61-194062, such as the following compound, are provided as preferable examples.

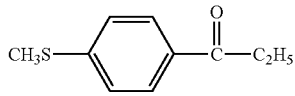

Acyl phosphine sulfides described in JP-B No. 2-9597, such as the following compounds, are provided as preferable examples.

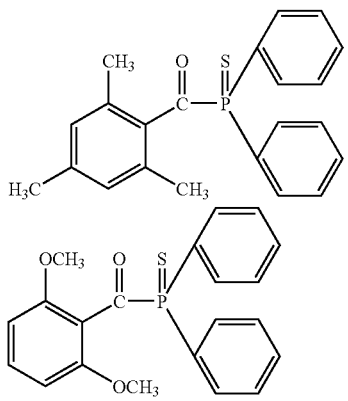

Acyl phosphines described in JP-B No. 2-9596, such as the following compounds, are provided as preferable examples.

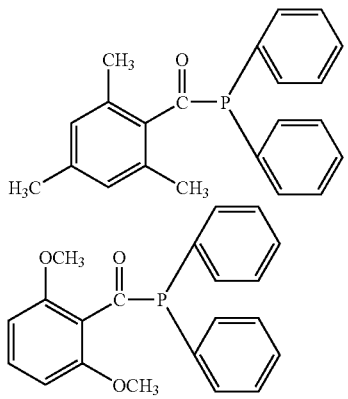

Thioxanthones described in JP-B No. 63-61950 and cumarins described in JP-B No. 59-42864 are also provided as preferable examples.

(b) Onium Salt Compounds

As the onium salt compounds (b) are provided compounds represented by the following general formulae (12) to (14).

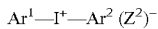  General formula (12)

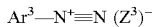  General formula (13)

General formula (14)
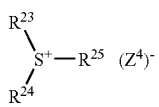

In the general formula (12), each of $Ar^1$ and $Ar^2$ independently represents an optionally substituted aryl group having not more than 20 carbon atoms. When the aryl group has substituents, preferable examples of substituents include a halogen atom, a nitro group, an alkyl group having not more than 12 carbon atoms, an alkoxyl group having not more than 12 carbon atoms, and an aryloxy group having not more than 12 carbon atoms. $(Z^2)^-$ represents a counter ion selected from the group consisting of a halogen ion, a perchloric acid ion, a carboxylic acid ion, a tetrafluoroborate ion, a hexafluorophosphate ion, and a sulfonic acid ion, with a perchloric acid ion, a hexafluorophosphate ion, and an arylsuofnic acid ion being preferred.

In the general formula (13), $Ar^3$ represents an optionally substituted aryl group having not more than 20 carbon atoms. Preferable examples of substituents include a halogen atom, a nitro group, an alkyl group having not more than 12 carbon atoms, an alkoxyl group having not more than 12 carbon atoms, an aryloxy group having not more than 12 carbon atoms, an alkylamino group having not more than 12 carbon atoms, a dialkylamino group having not more than 12 carbon atoms, an arylamino group having not more than 12 carbon atoms, and a diarylamino group having not more than 12 carbon atoms ($Z^3$) represents a counter ion synonymous with $(Z^2)$ in the general formula (12).

In the general formula (14), $R^{23}$, $R^{24}$ and $R^{25}$ may be the same or different and each represents an optionally substituted hydrocarbon group having not more than 20 carbon atoms. Preferable examples of substituents include a halogen atom, a nitro group, an alkyl group having not more than 12 carbon atoms, an alkoxyl group having not more than 12 carbon atoms, and an aryloxy group having not more than 12 carbon atoms. $(Z^4)^-$ represents a counter ion synonymous with $(Z^2)^-$ in the general formula (12).

As specific examples of the onium slat that can suitably be used in the invention, those described in paragraphs [0030] to [00333 ] of Japanese Patent Application No. 11-310623 and those described in paragraphs ([0015] to [0046] of Japanese Patent Application No. 2000-160323, both of which applications are proposed by the present assigner, can be provided.

The onium salt used in the invention preferably has a maximum absorption wavelength in a range of not longer than 400 nm, and more preferably not longer than 360 nm. By setting the absorption wavelength in ultraviolet regions, it is possible to deal with planographic printing plate precursors under white lamps.

(c) Organic Peroxides

As the organic peroxides (c), almost all of organic compounds having at least one oxygen-oxygen bond in the molecule thereof are included. Examples include methyl ethyle ketone peroxide, cyclohexanone peroxide, 3,3,5-trimethylcyclohexanone peroxide, methylcyclohexanone peoxide, acetylacetone peroxide, 1,1-bis(tertiary butylperoxy)-3,3,5-trimethylcyclohexane, 1,1-bis(tertiary butylperoxy)cyclohexane, 2,2-bis(tertiary butylperoxy)butane, tertiary butyl hydroperoxide, cumene hydroperoxide, diisopropylbenzene hydroperoxide, p-methane hydroperoxide, 2,5-dimethylhexane-2,5-dihydroperoxide, 1,1,3,3-tetramethylbutyl hydroperoxide, di-tertiary butyl peroxide, tertiary butylcumyl peroxide, dicumyl peroxide, bis(tertiary butylperoxyivopropyl)benzene, 2,5-dimethyl-2,5-di(tertiary butylperoxy)hexane, 2,5-xanoyl peroxide, succinic peroxide, benozyl peroxide, 2,4-dichlorobenzoyl peroxide, m-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tertiary butyl peroxyacetate, tertiary butyl peroxypivalate, tertiary butyl peroxyneodecanoate, tertiary butyl peroxyoctanoate, tertiary butyl peroxy-3,3,5-trimethylhexanoate, tertiary isobutyl peroxylaurate, tertiary carbonate, 3,3',4,4'-tetra-(tertiary butyl peroxycarbonyl)benzophenone, 3,3',4,4'-tetra-(t-amyl peroxycarbonyl)benzophenone, 3,3',4,4'-tetra-(t-hexyl peroxycarbonyl)benzophenone, 3,3',4,4'-tetra-(t-octyl peroxycarbonyl)benzophenone, 3,3',4,4'-tetra-(cumyl peroxycarbonyl)benzophenone, 3,3',4,4'-tetra-(p-isopropylcumyl peroxycarbonyl)benzophenone, carbonyl di(t-butyl peroxy dihydrogendiphthalate), and carbonyl di(t-hexyl peroxy dihydrogendiphthalate).

Of these are preferable peresters such as 3,3',4,4'-tetra-(t-butyl peroxycarbonyl)benzophenone, 3,3',4,4'-tetra-(t-amyl peroxycarbonyl)benzophenone, 3,3',4,4'-tetra-(t-hexyl peroxycarbonyl)benzophenone, 3,3',4,4'-tetra-(t-octyl peroxycarbonyl)benzophenone, 3,3',4,4'-tetra-(cumyl peroxycarbonyl)benzophenone, 3,3',4,4'-tetra-(p-isoproylcumyl peroxycarbonyl)benzophenone, and di-t-butyl diperoxyisophthalate.

(d) Thio Compounds

As the thio compounds (d) are provided compounds represented by the following general formula (15).

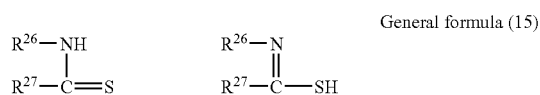

General formula (15)

In the general formula (15), $R^{26}$ represents an alkyl group, an aryl group, or a substituted aryl group; and $R^{27}$ represents a hydrogen atom or an alkyl group. $R^{26}$ and $R^{27}$ may be bonded to each other to represent a non-metallic atomic group necessary for forming a 5-membered to 7-membered ring that may contain a hetero atom selected from oxygen, sulfur and nitrogen atoms.

In the general formula (15), the alkyl group is preferably one having from 1 to 4 carbon atoms; the aryl group is preferably one having from 6 to 10 carbon atoms such as phenyl and naphthyl; and the substituted aryl group includes the foregoing aryl group having a substituent such as a halogen atom (such as a chlorine atom), an alkyl group (such as a methyl group), and an alkoxyl group (such as a methoxy group and an ethoxy group). $R^{27}$ preferably represents an alkyl group having from 1 to 4 carbon atoms. Specific examples of the thio compounds represented by the general formula (15) include compounds as shown in the following Table 5.

TABLE 5

| No. | $R^{26}$ | $R^{27}$ |
|---|---|---|
| 1 | —H | —H |
| 2 | —H | —CH$_3$ |
| 3 | —CH$_3$ | —H |
| 4 | —CH$_3$ | —H |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OCH$_3$ | —C$_4$H$_9$ |
| 15 | —(CH$_2$)$_2$— | |

TABLE 5-continued

| No. | $R^{26}$ | $R^{27}$ |
|---|---|---|
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |
| 25 | —(CH$_2$)$_3$—S— | |
| 26 | —(CH$_2$)$_2$—CH(CH$_3$)—S— | |
| 27 | —(CH$_2$)$_3$—O— | |
| 28 | —(CH$_2$)$_5$— | |
| 29 | —C$_6$H$_4$—O— | |
| 30 | —N=C(SCH$_3$)—S— | |
| 31 | —C$_6$H$_4$—NH— | |
| 32 | 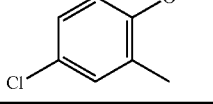 | |

(e) Hexaaryl Biimidazole Compounds

As the hexaaryl bimidazol compounds are provided lophine dimers described in JP-B N s. 45-37377 and 44-86516, such as 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4'-5,5'-tetraphenyl biimidazole, and 2,2'-bis(o-trifluorophenyl)-4,4',5,5'-tetraphenyl biimidazole.

(f) Keto Oxime Ester Compounds

As the keto oxime ester compounds (f) are provided 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpropan-1-one.

(g) Borate Compounds

As the borate compounds (g) are provided compounds represented by the following general formula (16).

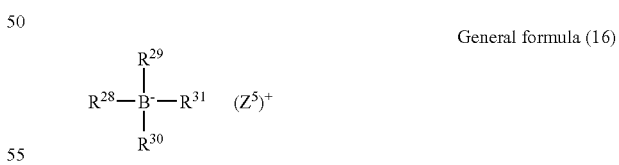

General formula (16)

In the general formula (16), $R^{28}$, $R^{29}$, $R^{30}$ and $R^{31}$ may be the same of different and each independently represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group; and two or more of $R^{28}$, $R^{29}$, $R^{30}$ and $R^{31}$ may be bonded to each other to form a cyclic structure, provided that at least one of $R^{28}$, $R^{29}$, $R^{30}$ and $R^{31}$ represents a substituted or unsubstituted alkyl group. $(Z^5)^+$ represents an alkali metal cation or a quaternary ammonium cation.

The alkyl group represented by $R^{28}$ to $R^{31}$ includes linear, branched or cyclic alkyl groups, and those having from 1 to 8 carbon atoms are preferable. Specific examples include methyl, ethyl, propyl, isopropyl, butyl, pentyl, hexyl, octyl, stearyl, cyclobutyl, cyclopentyl, and cyclohexyl. Examples of the substituted alkyl group represented by $R^{28}$ to $R^{31}$ include the foregoing alkyl groups having a substituent such as a halogen atom (such as —Cl and —Br), a cyano group, a nitro group, an aryl group (preferably a phenyl group), a hydroxyl group, —COOR$^{32}$ (wherein $R^{32}$ represents a hydrogen atom, an alkyl group having from 1 to 14 carbon atoms, or an aryl group), —OCOR$^{33}$ or —OR$^{34}$ (wherein each of $R^{33}$ and $R^{34}$ represents an alkyl group having from 1 to 14 carbon atoms or an aryl group), and a group represented by the following formula.

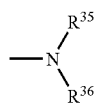

Here, $R^{35}$ and $R^{36}$ each independently represents a hydrogen atom, an alkyl group having from 1 to 14 carbon atoms, or an aryl group.

The aryl group represented by $R^{28}$ to $R^{31}$ includes monocyclic to tricyclic aryl groups such as a phenyl group and a naphthyl group; and the substituted aryl group represented by $R^{28}$ to $R^{31}$ includes the foregoing aryl groups having a substituent such as those in the foregoing substituted alkyl groups and an alkyl group having from 1 to 14 carbon atoms. The alkenyl group represented by $R^{28}$ to $R^{31}$ includes linear, branched or cyclic alkenyl groups having from 2 to 18 carbon atoms; and examples of substituents of the substituted alkenyl group represented by $R^{28}$ to $R^{31}$ include those provided above as the substituent of the substituted alkyl group. The alkynyl group represented by $R^{28}$ to $R^{31}$ includes linear or branched alkynyl groups having from 2 to 28 carbon atoms; and examples of substituents of the substituted alkynyl group represented by $R^{28}$ to $R^{31}$ include those provided above as the substituent of the substituted alkyl group. The heterocyclic group represented by $R^{28}$ to $R^{31}$ includes 5-membered or more membered heterocyclic groups containing at least one of N, S and O, and preferably 5-membered to 7-membered heterocyclic groups. These heterocyclic groups may include fused rings. Further, these heterocyclic groups may have a substituent such as those provided above as the substituent of the substituted aryl group. Specific examples of compounds represented by the general formula (16) include compounds described in U.S. Pat. Nos. 3,567,453 and 4,343,891 and EP-A Nos. 109,772 and 109,773 and compounds described below.

(h) Azinium compounds

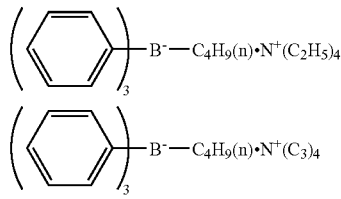

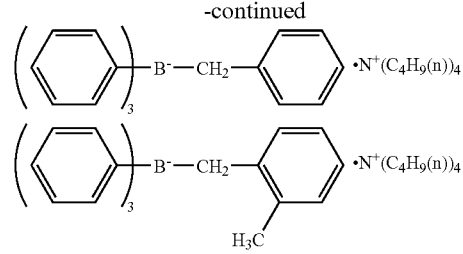

As the azinium compounds (h) are provided compounds having an N—O bond described in JP-A Nos. 63-138345, 63-142345, 63-142346 and 63-143537 and JP-B No. 46-42363.

(i) Metallocene Compounds

As the metallocene compounds (i) are provided titanocene compounds described in JP-A Nos. 59-152396, 61-151197, 63-41484, 2-249 and 2-4705 and iron-arene complexes described in JP-A NOS. 1-304453 and 1-152109.

Specific examples of titanocene compounds include di-cyclopentadienyl-Ti-di-chloride, di-cyclopentadienyl-Ti-bis-phenyl, di-cyclopentadienyl-Ti-bis-2,3,4,5,6-pentafluoropben-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-2,6-difluorophen-1-yl, di-chloropentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, bis (cyclopentadienyl)-bis(2,6-difluoro-3-(pyr-1-yl)phenyl)-titanium bis(cyclopentadienyl) bis[2,6-difluoro-3-(methylsulfonamido)phenyl]titanium, bis(cyclopentadienyl) bis[2,6-difluoro-3-(N-butylbiaroyl-amino)phenyl]titanium, bis (cyclopentadienyl) bis[2,6-difluoro-3-(N-butyl-(4-chlorobenzoyl)amino)phenyl]titanium, bis (cyclopentadienyl) bis[2,6-difluoro-3-(N-benzyl-2,2-dimethylpentanoylamino)phenyl]titanium, bis (cyclopentadienyl) bis[2,6-difluoro-3-(N-(2-ethylhexyl)-4-tolyl-sulfonyl)amino]-phenyl]titanium, bis (cyclopentadienyl) bis[2,6-difluoro-3-(N-(3-oxaheptyl) benzoylamino)phenyl]titanium, bis-(cyclopentadienyl) bis [2,6-dilfuoro-3-(N-(3,6-dioxadecyl)benzoylamino)phenyl] titanium, bis(cyclopentadienyl) bis[2,6-difluoro-3-(trifluoromethylsulfonyl)aminophenyl]-titanium, bis (cyclopentadienyl) bis[2,6-difluoro-3-(trifluoroacetylamino)phenyl]-titanium, bis (cyclopentadienyl) bis[2,6-difluoro-3-(2-chlorobenzoylamino)henyl]titanium, bis(cyclopentadienyl) bis[2,6-difluoro-3-(4-chlorobenzoylamino)phenyl]titanium, bis(cyclopentadienyl) bis[2,6-difluoro-3-(N-(3,6-dioxadecyl)-2,2-dimethylpentanoylamino)phenyl]titanium, bis(cyclopentadienyl) bis[2,6-difluoro-3-(N-(3,7-dimethyl-7-methoxyoctyl)benzoylamino)phenyl]titanium, and bis (cyclopentadienyl) bis[2,6-difluoro-3-(N-cyclohexylbenzoylamino)phenyl]titanium.

(j) Active Ester Compounds

As the active ester compounds (j) are provided imide sultonate compounds described in JP-B No. 62-6223 and active sulfonates described in JP-B No. 63-14340 and JP-A No. 59-174831.

(k) Compounds Having a Carbon-halogen Bond

As the compounds (k) having a carbon-halogen bond are provided compounds represented by the following general formulae (17) to (23).

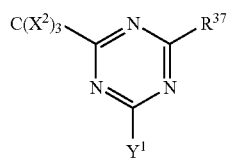

General formula (17)

In the general formula (17), $X^2$ represents a halogen atom. $Y^2$ represents —$C(X^2)_3$, —$NH_2$, —$NHR^{38}$, —$NR^{38}$, or —$OR^{38}$. $R^{38}$ represents an alkyl group, a substituted alkyl group, an aryl group, or a substituted aryl group. $R^{37}$ represents —$C(X^2)_3$, an alkyl group, a substituted alkyl group, an aryl group, a substituted aryl group, or a substituted alkenyl group.

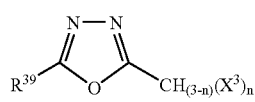

General formula (18)

In the general formula (18), $R^{39}$ represents an alkyl group, a substituted alkyl group, an alkenyl group, a substituted alkenyl group, an aryl group, a substituted aryl group, a halogen atom, an alkoxyl group, a substituted alkoxyl group, a nitro group, or a cyano group; $X^3$ represents a halogen atom; and n represents an integer from 1 to 3.

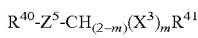

General formula (19)

$R^{40}$-$Z^5$-$CH_{(2-m)}(X^3)_m R^{41}$

In the general formula (19), $R^{40}$ represents an aryl group or a substituted aryl group; $R^{41}$ represents any one of the following groups or a halogen; $Z^5$ represents —C(=O)—, —C(=S)—, or —$SO_2$—; $X^3$ represents a halogen atom; and m is 1 or 2.

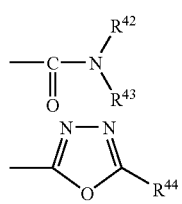
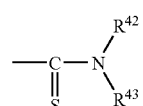

Here, each of $R^{42}$ and $R^{43}$ represents an alkyl group, a substituted alkyl group, an alkenyl group, a substituted alkenyl group, an aryl group, or a substituted aryl group; and $R^{44}$ is similar as $R^{38}$ in the general formula (17).

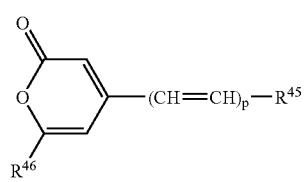

General formula (20)

In the general formula (20), $R^{45}$ represents an optionally substituted aryl group or heterocyclic group; $R^{46}$ represents a trihaloalkyl group or trihaloalkenyl group having from 1 to 3 carbon atoms; and p is 1, 2 or 3.

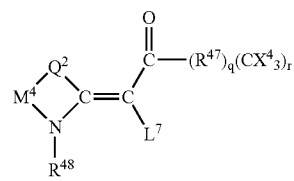

General formula (21)

A compound represented by the general formula (21) is a carbonylmethylene hetarocyclic compound having a trihalogenomethyl group. In the formula, $L^7$ represents a hydrogen atom or a substituent of CO—$(R^{17})_q(C(X^4)_3)_r$; $Q^2$ represents a sulfur, selenium or oxygen atom, a dialkylmethylene group, an alken-1,2-ylene group, a 1,2-phenylene group, or an N—R group; $M^4$ represents a substituted or unsubstituted alkylene group or alkenylene group or a 1,2-arylene group; $R^{48}$ represents an alkyl group, an aralkyl group, or an alkoxyalkyl group; $R^{17}$ represents a carbocyclic or heterocyclic divalent aromatic group; $X^4$ represents a chlorine, bromine or iodine atom; and q=0 and r=1, or q=1 and r=1 or 2.

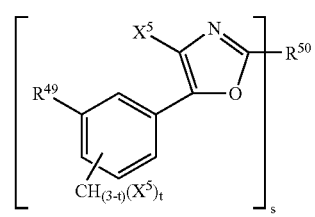

General formula (22)

A compound represented by the general formula (22) is a 4-halogeno-5-(halogenomethyl-phenyl)-oxazole derivative. In the formula, $X^5$ represents a halogen atom; t represents an integer from 1 to 3; s represents an integer from 1 to 4; $R^{49}$ represents a hydrogen atom or a $CH_{3-t}X^5_t$ group; and $R^{50}$ represents an optionally substituted unsaturated group having a valence of s.

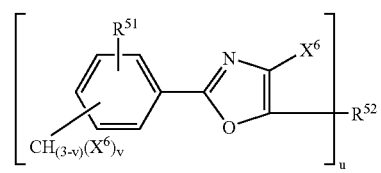

General fomula (23)

A compound represented by the general formula (23) is a 2-(halogenomethyl-phenyl)-4-halogeno-oxazole derivative. In the formula, $X^6$ represents a halogen atom; v represents an integer from 1 to 3; u represents an integer from 1 to 4; $R^{51}$ represents a hydrogen atom or a $CH_{3-v}X^6_v$ group; and $R^{52}$ represents an optionally substituted unsaturated group having a valence of u.

Specific examples of such compounds having a carbon-halogen bond include compounds described in Wakabayashi, et al., *Bull. Chem. Soc. Japan,* 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine, and 2-($\alpha,\alpha,\beta$-trichloroethyl)-4,6-bis(trichloromethyl)-S-triazine. Besides, examples include compounds described in British Patent No. 1,388,492, such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine, 2-(p-metboxystyryl)-4-amino-6-trichloromethyl-S-triazine; and compounds described in JP-A No. 53-133428, such as 2-(4-methoxy-naphth-1-yl)-4,6-bis-trichloromethyl-S-triazine, 2-(4-ethoxy-naphth-1-yl)-4,6-bis-trichloromethyl-S-triazine, 2-[4-(2-ethoxyethyl)-naphth-1-yl]-4,6-bis-trichloromethyl-S-triazine, 2-(4,7-dimethoxy-naphth-1-yl)-4,6-bis-trichloromethyl-S-triazine, and 2-(acetonaphth-5-yl)-4,6-bis-trichloromethyl-S-triazine; and compounds described in German Patent No 3,337,024, such as the following compounds.

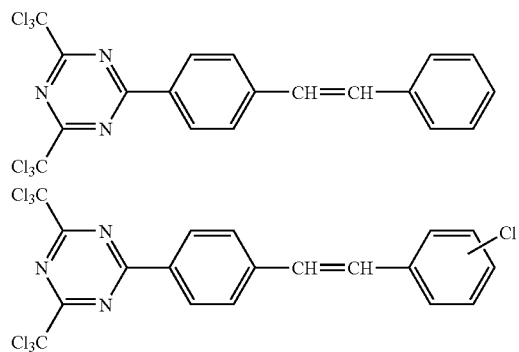

Also, compounds described in F. C. Schaefer, et al., *J. Org. Chem.,* 29, 1527 (1964), such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine, and 2-methoxy-4-methyl-6-trichloromethyl-S-triazine, can be provided. Further, compounds described in JP-A No. 62-58241, such as the following compounds, can be provided.

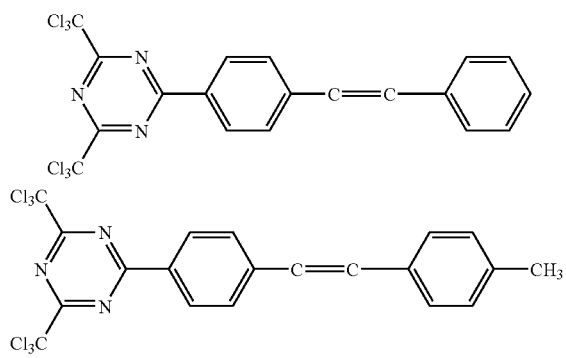

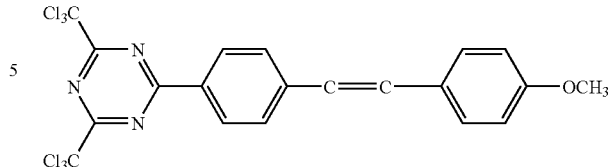

Moreover, compounds described in JP-A No. 5-281728, such as the following compounds, can be provided.

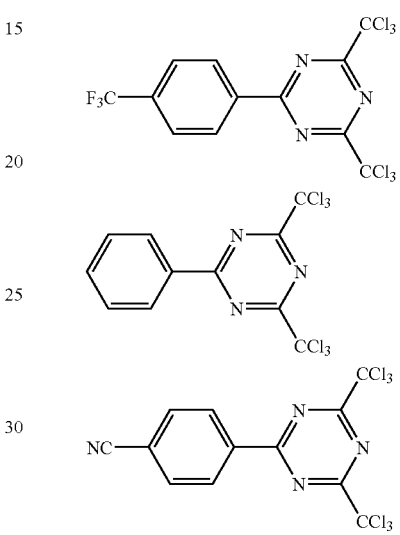

Additionally, compounds that can be easily synthesized by those skilled in the art according synthesis methods described in M. P. Hutt, E. F. Elslager and L. M. Herbel, *Journal of Heterocyclic Chemistry,* Vol. 7 (No. 3), pages 511, et seq. (1970), such as the following compounds, can be provided.

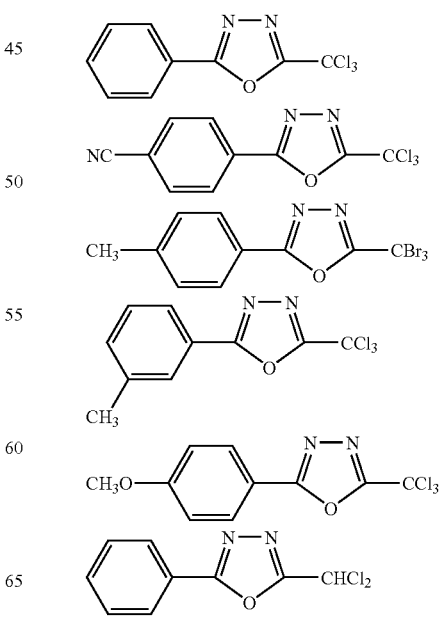

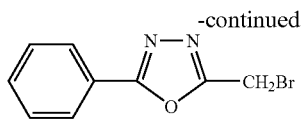

In the invention, more preferable examples of the polymerization initiator include the foregoing aromatic ketones (a), onium salt compounds (b), organic peroxides (c) hexaaryl biimidazole compounds (e) metallocene compounds (i) and compounds (k) having a carbon-halogen bond, and most preferable examples include aromatic iodonium salts, aromatic sulfonium compounds, titanocene compounds, and trihalomethyl-S-triazine compounds represented by the general formula (17).

The content of the radical-generating compound in the polymerizable composition of the invention is preferably in a range of 0.1 to 50% by weight, more preferably from in a range of 0.5 to 30% by weight, and particularly preferably in a range of 5 to 20% by weight in the whole of solid contents of the polymerizable composition, like the case where it is used in a recording layer of planographic printing plate precursor.

In the invention, the radical-generating compound component may suitably be used singly or in combination of two or more thereof.

Radical Polymerizable Compound

In the invention, for the purposes of enhancing sensitivity and image forming property, it is preferred to use a radical polymerizable compound together with the binder polymer and the radical-generating compound.

The radical polymerizable compound to be used herein is a radical polymerizable compound having at least one ethylenically unsaturated double bond and is selected from compounds having at least one, and preferably at least two terminal ethylenically unsaturated bonds. Such compounds are widely known in this industrial field, and these known compounds can be used in the invention without particular limitations. These compounds take a chemical state such as monomers and prepolymers, i.e., dimers, trimers and oligomers, or mixtures and copolymers thereof.

Examples of monomers and copolymers thereof include unsaturated carboxylic acids (such as acrylic acid, methacrylic acid, itaconic acid, crotonic acid, isocrotonic acid, and maleic acid) and esters and amides thereof, and preferably esters between unsaturated carboxylic acids and aliphatic polyhydric alcohols and amides between unsaturated carboxylic acids and aliphatic polyhydric amine compounds. Further, addition reaction products between unsaturated carboxylic acid esters or amides having a nucleophilic substituent (such as a hydroxyl group, an amino group, and a mercapto group) and monofunctional or polyfunctional isocyanates or epoxies and dehydration condensation reaction products between the foregoing unsaturated carboxylic acid esters or amides and monofunctional or polyfunctional carboxylic acids are also suitably used.

Also, addition reaction products between unsaturated carboxylic acid esters or amides having an electrophilic substituent (such as an isocyanate group and an epoxy group) and monofunctional or polyfunctional alcohols, amines or thiols and displacement reaction products between unsaturated carboxylic acid esters having a split-off group (such as a halogen group and a tosyloxy group) and monofunctional or polyfunctional alcohols, amines or thiols are suitable. As other examples, compounds in which the unsaturated carboxylic acid in the foregoing compounds is replaced by an unsaturated phosphonic acid or styrene can be used.

Specific examples of esters between aliphatic polyhydric alcohols and unsaturated carboxylic acids as the radical polymerizable compound include:

acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers;

methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane;

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic acid esters such as ethylene glycol dicrotonate, tetramethylene glycol dicrotonate, pentaerythritol dicrotonate, and sorbitol tetradicrotonate;

isocrotonic acid esters such as ethylene glycol dicrotonate, pentaerythritol diisocrotonate, and sorbitol tetraisocrotonate; and maleic acid esters such as ethylene glycol dimaleate, triethylene glycol dimaleate, pentaerythritol dimaleate, and sorbitol tetramaleate.

As other examples of esters are suitably used aliphatic alcohol esters described in JP-B Nos. 46-27926 and 51-47334 and JP-A No. 57-196231; esters having an aromatic skeleton described in JP-A Nos. 59-5240, 59-5241 and 2-226149; and esters containing an amino group described in JP-A No. 1-165613.

Specific examples of monomers of amides between aliphatic polyhydric amine compounds and unsaturated carboxylic acids include methylene bis-acrylamide, methylene bis-methacrylamide, 1,6-hexamethylene bis-acrylamide, 1,6hexamethylene bis-methacrylamide, diethylenetriamine tris-acrylamide, xylylene bis-acrylamide, and xylylene bis-methacrylamide.

As other preferable examples of amide monomers can be provided those having a cyclohexylene structure described in JP-B No. 54-21726.

Urethane addition polymerizable compounds as produced using addition reaction between isocyanate and hydroxyl groups. Specific examples include polyisocyanate compounds having two or more isocyanate groups in one molecule thereof, described in JP-B No. 48-41708; and vinyl urethane compounds having two or more polymerizable vinyl groups in one molecule thereof, as prepared by adding a hydroxyl group-containing vinyl monomer represented by the following general formula (24).

$$CH_2=C(R^{34})COOCH_2CH(R^{35})OH \qquad \text{General formula (24)}$$

In the general formula (24), each of $R^{34}$ and $R^{35}$ independently represents a hydrogen atom or a methyl group.

Urethane acrylates described in JP-A No. 51-37193 and JP-B Nos. 2-32293 and 2-16765 and urethane compounds having an ethylene oxide skeleton described in JP-B Nos. 58-49860, 56-17654, 62-39417 and 62-39419 are also suitable.

Additionally, radical polymerizable compounds having an amino structure or a sulfide structure in the molecule thereof, described in JP-A Nos. 63-277653, 63-260909 and 1-105238 may be used.

As other examples, polyfunctional acrylates or methacrylates such as polyester acrylates and epoxy acrylates obtained by reacting epoxy resins with (meth)acrylic acid, described in JP-A No. 48-64183 and JP-B Nos. 49-43191 and 52-30490, can be provided. Also, specific unsaturated compounds described in JP-B Nos. 46-43946, 1-40337 and 1-40336 and vinyl phosphonic acid compounds described in JP-A No. 2-25493 can be provided. Also, as the case may be, structures containing a perfluoroalkyl group described in JP-A No. 61-22048 are suitably used. Additionally, compounds introduced as photocurable monomers or oligomers in *Journal of Adhesion Society of Japan*, Vol. 20, No.7, pp. 300–308 (1984) can be used.

In the invention, the radical polymerizable compound may be used singly or in combination of two or more thereof. The details of use method of such radical polymerizable compounds, such as what structure should be used, whether the compound be used singly or in combination, and what addition amount be employed, can be arbitrarily set up according to the performance design of ultimate recording material.

In the invention, with respect to the compounding ratio of the radical polymerizable compound, it is advantageous from the standpoint of sensitivity that the amount of the radical polymerizable compound is high. In the case where the amount of the radical polymerizable compound is too high, there may be caused problems such as generation of undesired phase separation, a problem in production step due to adhesiveness of recording layer (such as transfer of recording layer components and production failure derived from adhesion), and generation of deposition from a developing solution. From these viewpoints, in many cases, the compounding ratio of the radical polymerizable compound is preferably from 5 to 80% by weight, and more preferably from 20 to 75% by weight based on the whole of components of the composition.

In the invention, in the case where the specific binder polymer and the radical polymerizable compound are used together, a mixing ratio of the binder polymer component to the radical polymerizable compound component is preferably in a range of 1:0.05 to 1:3 by weight, more preferably in a range of 1:0.1 to 1:2 by weight, and further preferably in a range of 1:03 to 1:1.5 by weight.

With respect to the use method of the radical polymerizable compound, proper structure, compounding and addition amount can be arbitrarily selected from the viewpoints of magnitude of polymerization inhibition against oxygen, resolution, fogging, change in refractive index, and surface adhesiveness. Further, as the case may be, layer construction and coating method for undercoating and over coating can be carried out.

Sensitizing Pigment

In the invention, it is preferred to add a sensitizing pigment capable of absorbing light having a prescribed wavelength. By exposure of light having a prescribed wavelength the sensitizing pigment can absorb, radical formation reaction of the foregoing radical-generating compound component and polymerization reaction in the foregoing radical polymerizable compound are accelerated. As such sensitizing pigments are provided known spectral sensitizing pigments and dyes or pigments capable of absorbing light to mutually act with a photopolymerization initiator. The polymerizable composition becomes a composition sensitive to lights of various wavelengths of from ultraviolet rays to visible rays and infrared rays according to the wavelength of light that the sensitizing pigment absorbs.

Spectral Sensitizing Pigment or Dye

Preferable examples of spectral sensitizing pigments or dyes as the sensitizing pigment that is used in the invention include polynuclear aromatics (such as pyrene, perylene, and triphenylene), xanthenes (such as fluorescein, eosin, erythrosine, Rhodamine B, and Rose Bengale), cyanines (such as thiacarbocyanine and oxacarbocyanine), merocyanines (such as merocyanine and carbomerocyanine), thiazines (such as thionine, Methylene Blue, and Toluidine Blue), acridines (such as Acridine Orange, chloroflavin, and acriflavine) phthalocyanines (such as phthalocyanine and metaphthalocyanine), porphyrins (such as tetraphenylporphyrin and central metal-substituted porphyrin), chlorophylls (such as chlorophyll, chlorophyllin, and central metal-substituted chlorophyll), metal complexes (such as the following compound), anthraquinones (such as

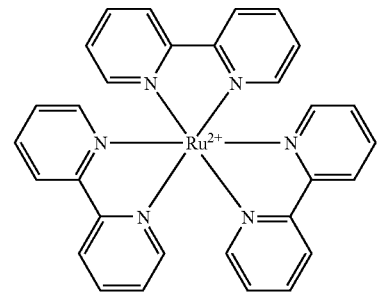

anthraquinone), and squaryliums (such as squarylium).

More preferable examples of spectral sensitizing pigments or dyes are provided as follows.

Styryl pigments described in JP-B No. 37-13034, preferable specific examples of which are provided below.

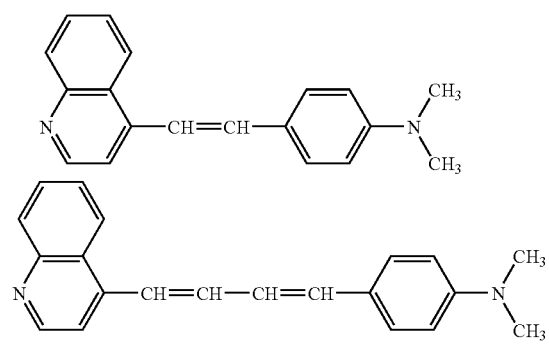

Cationic dyes described in JP-A No. 62-143044, preferable specific examples of which are provided below.

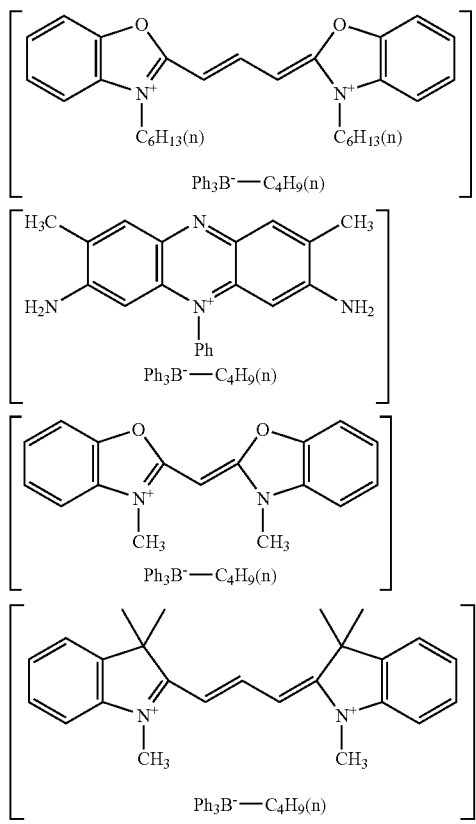

Quinoxalinium salts described in JP-B No. 59-24147, preferable specific examples of which are provided below.

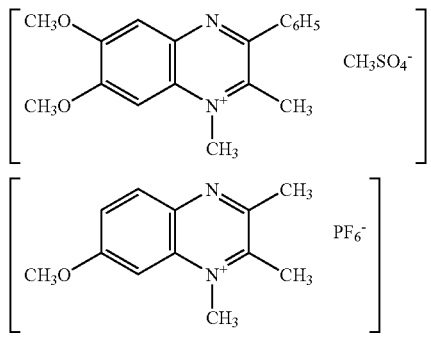

New Methylene Blue compounds described in JP-A No. 64-33104, a preferable specific example of which is provided below.

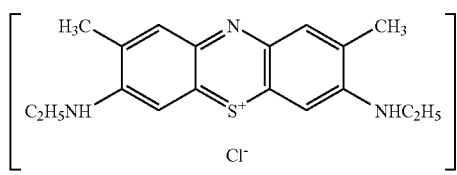

Anthraquinones described in JP-A No. 64-56767, preferable specific examples of which are provided below.

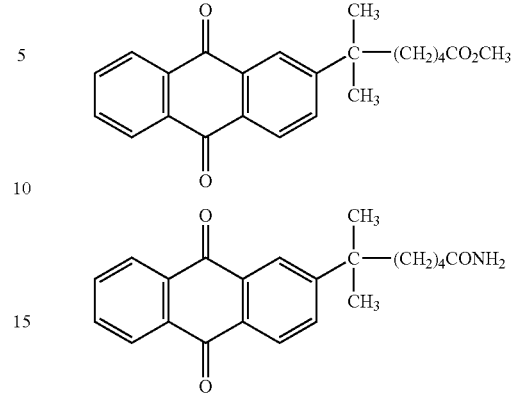

Benzoxanthene dyes described in JP-A No. 2-1714 and acridines described in JP-A Nos. 2-226148 and 2-226149, preferable specific examples of which are provided below.

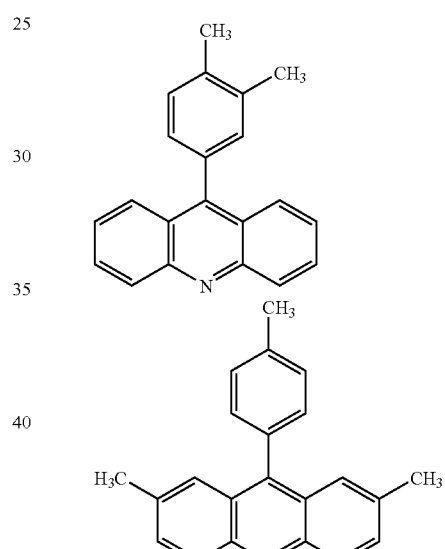

Pyrylium salts described in JP-B No. 40-28499, preferable specific examples of which are provided below.

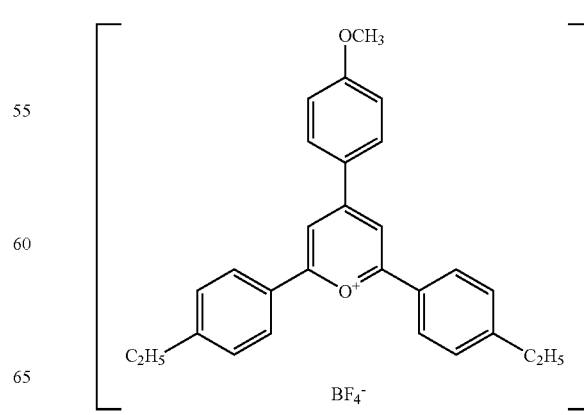

-continued

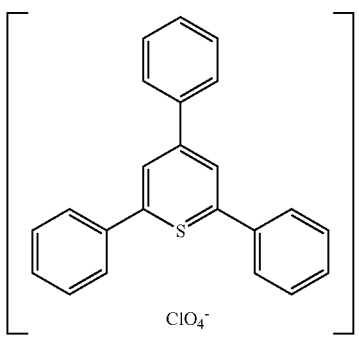

Cyanines described in JP-B No. 46-42363, preferable specific examples of which are provided below.

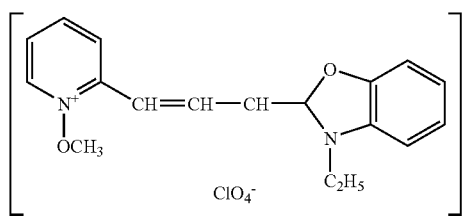

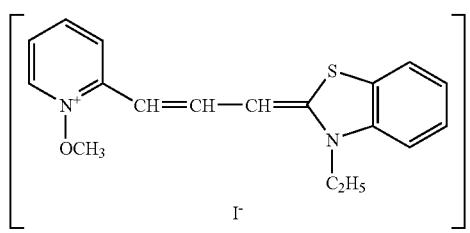

Benzofuran pigments described in JP-A No. 2-63053, preferable specific examples of which are provided below.

Conjugated ketone pigments described in JP-A Nos. 2-85858 and 2-216154, preferable specific examples of which are provided below.

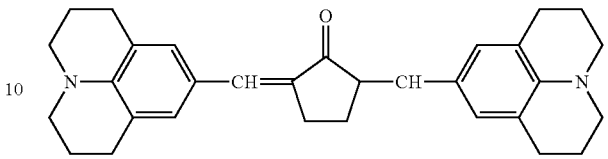

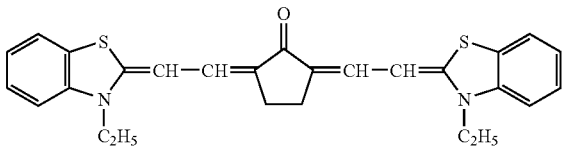

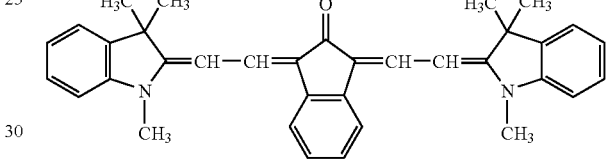

Pigments described in JP-A No. 57-10605 and azo-cinnamylidene derivatives, a preferable specific example of which is provided below.

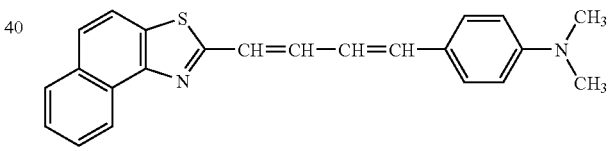

Cyanine pigments described in JP-A No. 1-287105, preferable specific examples of which are provided below.

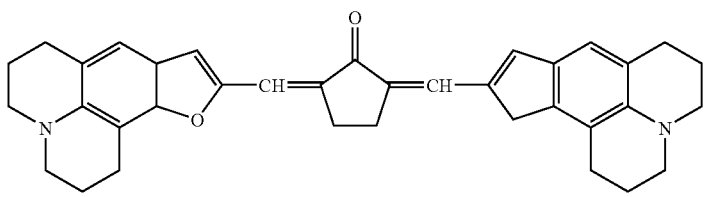

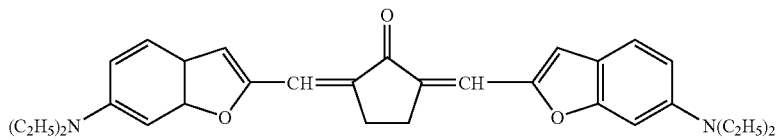

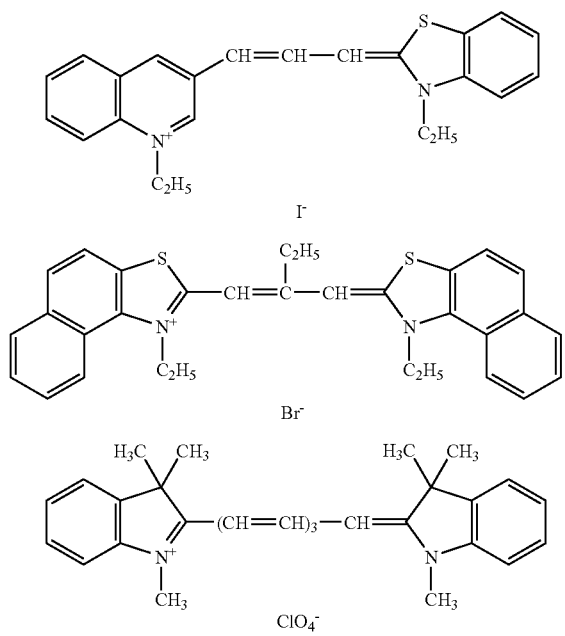

Xanthene pigments described in JP-A Nos. 62-31844, 62-31848 and 62-143043, specific preferable examples of which are provided below.

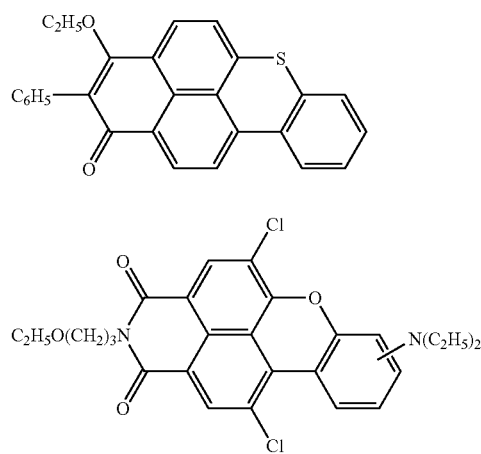

Aminostyryl ketones described in JP-B No. 59-28325, preferable specific examples of which are provided below.

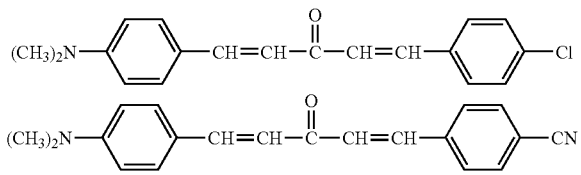

Pigments represented by the following general formulae (25) to (27), described in JP-A No. 2-179643.

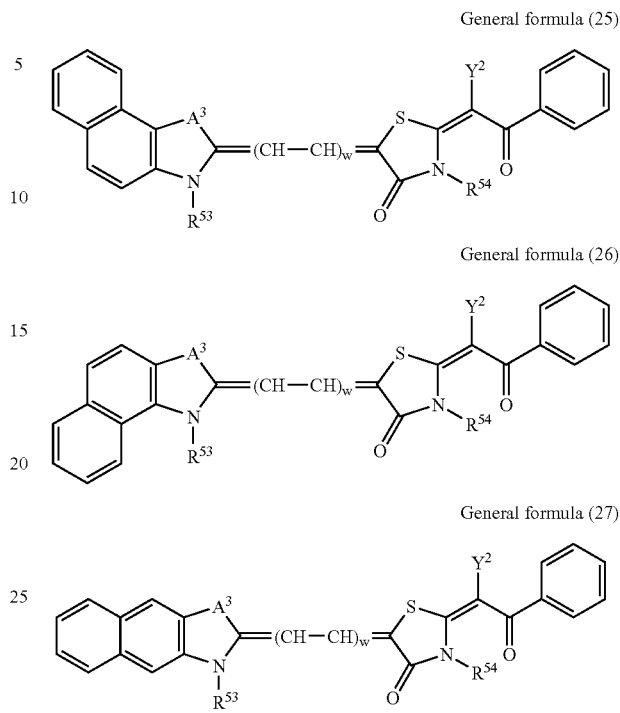

In the general formulae (25) to (27), $A^3$ represents an oxygen atom, a sulfur atom, a selenium atom, a tellurium atom, an alkyl- or aryl-substituted nitrogen atom, or a dialkyl-substituted carbon atom; $Y^2$ represents a hydrogen atom, an alkyl group, a substituted alkyl group, an aryl group, a substituted aryl group, an aralkyl group, an acyl group, or a substituted alkoxycarbonyl group: each of $R^{53}$ and $R^{54}$ represents a hydrogen atom, an alkyl group having from 1 to 18 carbon atoms, or a substituted alkyl group having from 1 to 18 carbon atoms and having one or more of substituents selected from $-OR^{55}$, $-(CH_2CH_2O)_w-R^{55}$, a halogen atom (such as F, Cl, Br, and I), and groups represented by the following formulae; $R^{55}$ represents a hydrogen atom or an alkyl group having from 1 to 10 carbon atoms; $B^1$ represents a dialkylamino group, a hydroxyl group, an acyloxy group, a halogen atom, or

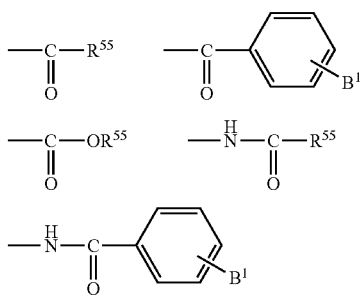

a nitro group; and w represents an integer from 0 to 4.

Merocyanine pigments represented by the following general formula (28), described in JP-A No. 2-244050.

General formula (28)

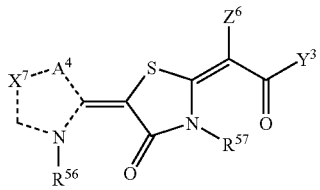

In the general formula (28), each of $R^{56}$ and $R^{57}$ independently represents a hydrogen atom, an alkyl group, a substituted alkyl group, an alkoxycarbonyl group, an aryl group, a substituted aryl group, or an aralkyl group. $A^4$ represents an oxygen atom, a sulfur atom, a selenium atom, a tellurium atom, an alkyl- or aryl-substituted nitrogen atom, or a dialkyl-substituted carbon atom. $X^7$ represents a non-metallic atomic group necessary for forming a nitrogen-containing hetero 5-membered ring. $Y^3$ represents a substituted phenyl group, an unsubstituted or substituted polynuclear aromatic ring, or an unsubstituted or substituted hetero aromatic ring. $Z^7$ represents a hydrogen atom, an alkyl group, a substituted alkyl group, an aryl group, a substituted aryl group, an aralkyl group, an alkoxyl group, an alkylthio group, an arylthio group, a substituted amino group, an acyl group, or an alkoxycarbonyl group, and may be taken together with $Y^3$ to form a ring. Preferable specific examples include the following compounds.

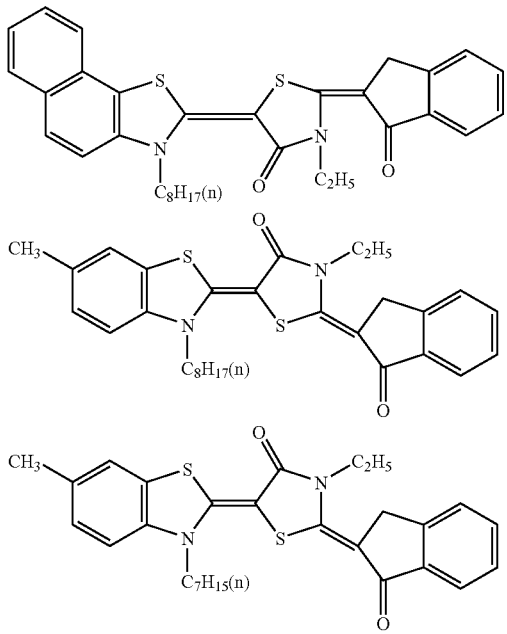

Merocyanine pigments represented by the following general formula (29), described in JP-B No. 59-28326.

General formula (29)

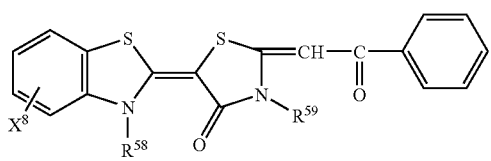

In the general formula (29), $R^{58}$ and $R^{59}$ may be the same or different and each represents a hydrogen atom, an alkyl group, a substituted alkyl group, an aryl group, a substituted aryl group, or an aralkyl group. $X^8$ represents a substituent having a Hammett's σ value falling within the range of −0.9 to +0.5.

Nerocyanine pigments represented by the following general formula (30), described in JP-A No. 59-89303.

General formula (30)

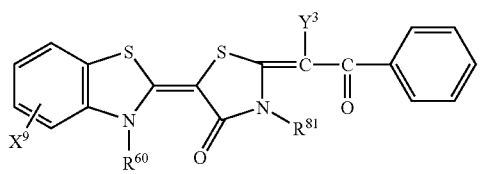

In the general formula (30), each of $R^{60}$ and $R^{61}$ independently represents a hydrogen atom, an alkyl group, a substituted alkyl group, an aryl group, a substituted aryl group, or an aralkyl group. $X^9$ represents a substituent having a Hammett's σ value falling within a range from −0.9 to +0.5. $Y^4$ represents a hydrogen atom, an alkyl group, a substituted alkyl group, an aryl group, a substituted aryl group, an aralkyl group, an acyl group, or an alkoxycarbonyl group. Preferable specific examples include the following compounds.

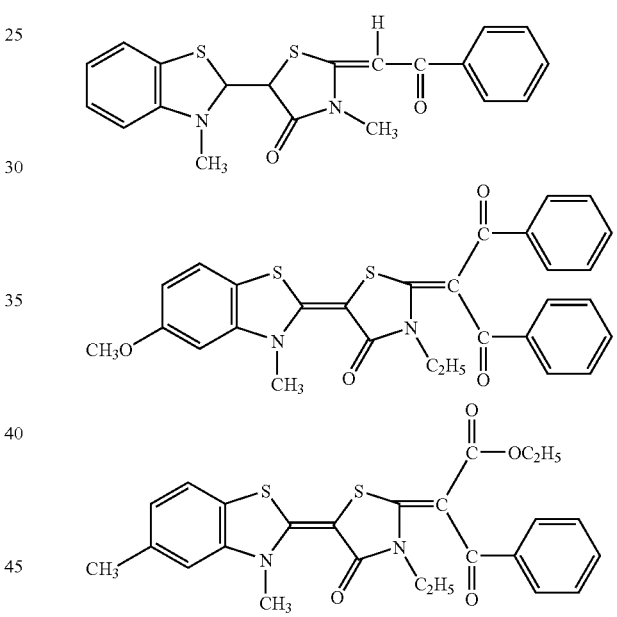

Merocyanine pigments represented by the following general formula (31), described in Japanes Patent Application No. 6-269047.

General formula (31)

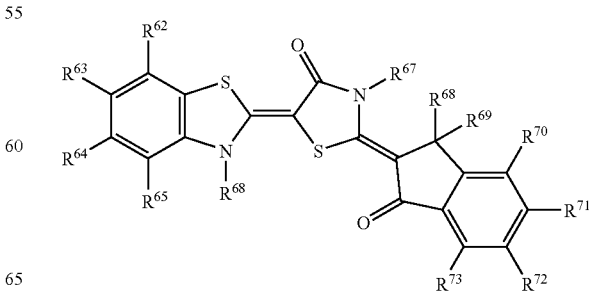

In the general formula (31), each of $R^{62}$, $R^{63}$, $R^{64}$, $R^{65}$, $R^{70}$, $R^{71}$, $R^{72}$, and $R^{73}$ independently represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonatho group, a substituted sulfinyl group, a substituted sulfonyl group, a phosphono group, a substituted phosphono group, a phosphonatho group, a substituted phosphonatho group, a cyano group, or a nitro group, or $R^{62}$ and $R^{63}$, $R^{63}$ and $R^{64}$, $R^{64}$ and $R^{65}$, $R^{70}$ and $R^{71}$, $R^{71}$ and $R^{72}$, or $R^{72}$ and $R^{73}$ may be bonded to each other to form an aliphatic or aromatic ring; $R^{66}$ represents a hydrogen atom, an alkyl group, a substituted alkyl group, an aryl group, or a substituted aryl group; $R^{67}$ represents a substituted or unsubstituted alkenylalkyl group or a substituted or unsubstituted alkynylalkyl group; and each of $R^{69}$ and $R^{69}$ independently represents a hydrogen atom, a halogen atom, an alkyl group, a substituted alkyl group, an aryl group, a substituted aryl group, or a substituted carbonyl group.

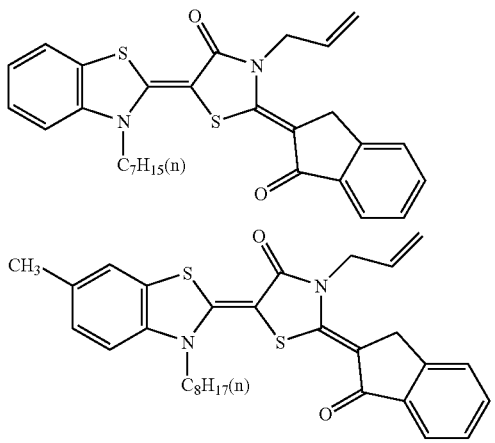

Preferable specific examples include the following compounds.

Benzopyran pigments represented by the following general formula (32), described in Japanese Patent Application No. 7-164583.

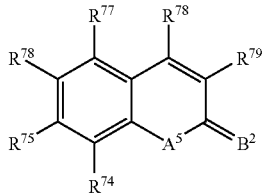

General formula (32)

In the general formula (32), each of $R^{74}$ to $R^{77}$ independently represents a hydrogen atom, a halogen atom, an alkyl group, an aryl group, a hydroxyl group, an alkoxyl group, or an amino group. Further, $R^{74}$ to $R^{77}$ may each be taken together with a carbon atom capable of being bonded thereto to form a ring comprising non-metallic atoms. $R^{78}$ represents a hydrogen atom, an alkyl group, an aryl group, a hetero aromatic group, a cyano group, an alkoxyl group, a carboxy group, or an alkenyl group. $R^{79}$ represents the group represented by $R^{78}$ or $-Z^7-R^{78}$; and $Z^7$ represents a carbonyl group, a sulfonyl group, a sulfinyl group, or an arylene dicarbonyl group. $R^{78}$ and $R^{79}$ may be taken together to form a ring comprising non-metallic atoms. $A^5$ represents an O atom, an S atom, NH, or an N atom having a substituent. $B^2$ represents an O atom or a group of $=C(G^7)(G^8)$. $G^7$ and $G^8$ may be the same or different and each represents a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group, or a fluorosulfonyl group, provided that $G^7$ and $G^8$ do not represent a hydrogen atom at the same time. Further, $G^7$ and $G^8$ may be taken together with a carbon atom to form a ring comprising non-metallic atoms.

Besides, in particular, the following infrared absorbers (dyes or pigments) are also suitably used as the sensitizing pigment. Preferable examples of dyes that can be used include cyanine dyes described in JP-A Nos. 58-125246, 59-84356, 59-202829 and 60-78787 and cyanine dyes described in British Patent No. 434,875.

Near infrared absorbing sensitizers described in U.S. Pat. No. 5,156,938 are also suitably used. Further, substituted aryl benzo(thio)pyrylium salts described in U.S. Pat. No. 3,881,924, trimethine thiapyrylium salts described in JP-A No. 57-142645 (counterpart to U.S. Pat. No. 4,327,169); pyrylium compounds described in JP-A Nos. 58-181051, 58-220143, 59-41363, 59-84248, 59-84249, 59-146063 and 59-146061; cyanine pigments described in JP-A No. 59-216146; pentamethine thiopyrylium salts described in U.S. Pat. No. 4,283,475; and pyrylium compounds described in JP-B Nos. 5-13514 and 5-19702 are suitably used, too.

Also, near infrared absorbing dyes represented by the formulae (I) and (II) in U.S. Pat. No. 4,756,993 and phthalocyanine dyes described in EP-A No. 916,513 can be provided as preferred dyes Additionally, anionic infrared absorbers described in Japanese Patent Application No. 10-79912 can be suitably used. The anionic infrared absorbers as referred to herein mean pigments that substantially absorb infrared rays, in which a matrix thereof does not have a cationic structure but an anionic structure. Examples include (1) anionic metal complexes, (2) anionic carbon blacks, (3) anionic phthalocyanines, and (4) compounds represented by the following general formula (33). Counter cations of these anionic infrared absorbers are proton-containing monovalent cations or polyvalent cations.

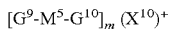 General formula (33)

(1) The anionic metal complexes mean metal complexes that substantially absorb rays, in which the whole of a central metal and ligands becomes an anion.

(2) Examples of the anionic carbon blacks include carbon blacks having an anionic group (such as a sulfonic acid group, a carboxylic acid group, and a phosphonic acid group) as a substituent bonded thereto. For introducing such a group into carbon black, there may be employed a measure of oxidizing carbon black with a prescribed acid described on page 12 *Handbook of Carbon Blacks, 3rd Ed.* (edited by The Carbon Black Association of Japan, Apr. 5, 1995, published by The Carbon Black Association of Japan).

(3) The anionic phthalocyanines mean phthalocyanines in which an anionic group as provided above in (2) is bonded as a substituent to a phthalocyanine skeleton, and the whole thereof becomes an anion.

Next, compounds represented by the foregoing general formula (33) will be described below in detail. In the general formula (33), $G^9$ represents an anionic substituent; and $G^{10}$ represents a neutral substituent. $(X^{10})^+$ represents a proton-containing monovalent cation or cation having a valence of m; and m represents an integer from 1 to 6. $M^5$ represents a conjugated chain, and this conjugated chain $M^5$ may have a substituent or a ring structure. The conjugated chain $M^5$ can be r presented by the following formula.

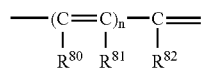

In the formula, $R^{80}$, $R^{81}$ and $R^{82}$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group, or an amino group, and these groups may be connected to each other to form a ring structure; and n represents an integer of 1 to 8.

Of anionic infrared absorbers represented by the general formula (33) are preferably used the following IRA-1 to IRA-5.

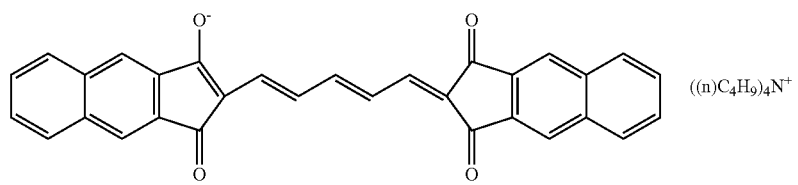

IRA-1

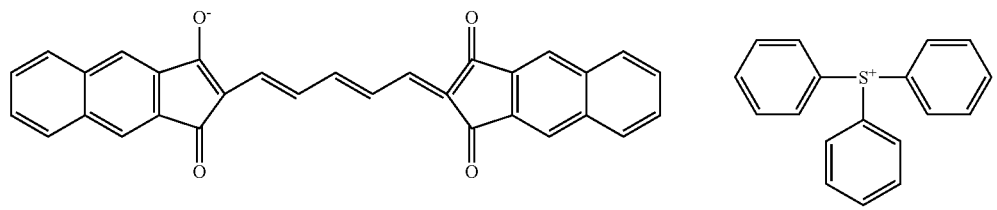

IRA-2

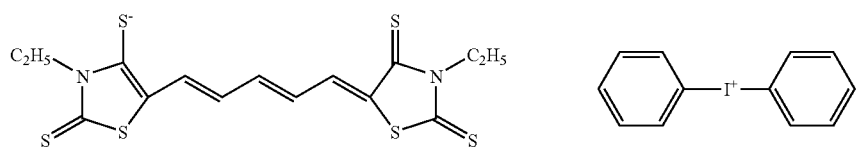

IRA-3

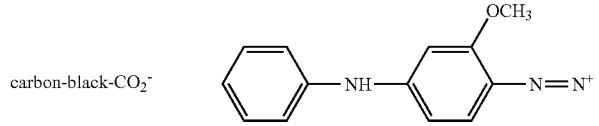

IRA-4

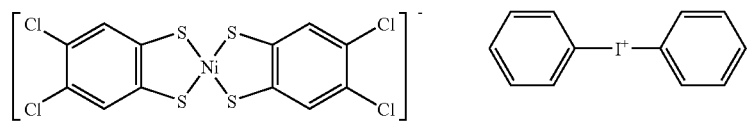

IRA-5

Further, the following cationic infrared absorbers IRC-1 to IRC-44 can be suitably used.

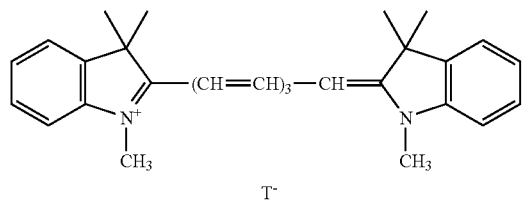

IRC-1

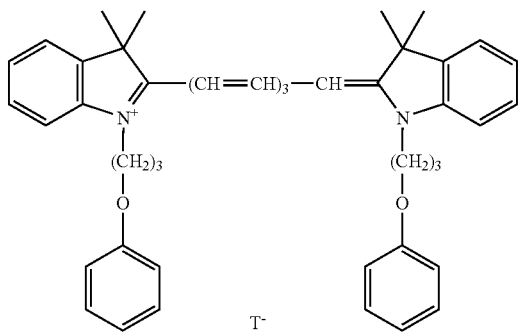

IRC-2

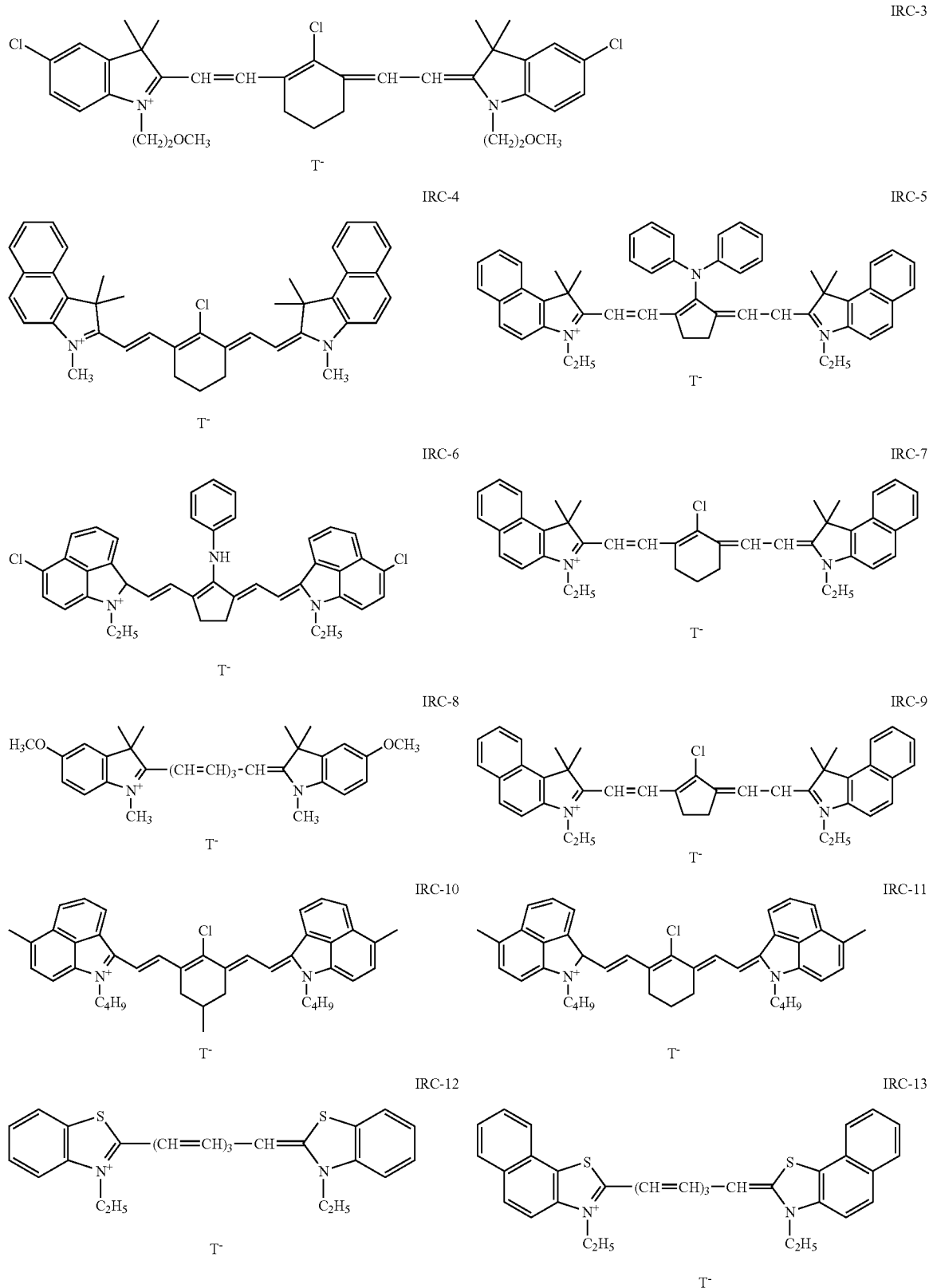

-continued
IRC-14
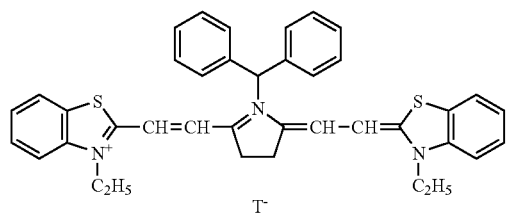
IRC15
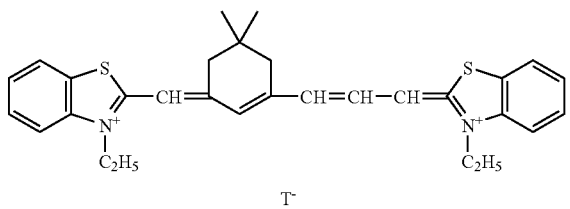
IRC-16
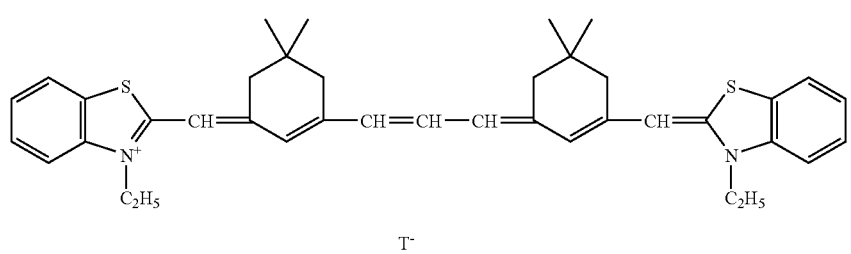
IRC-17
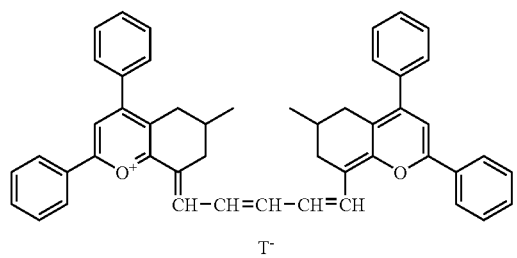
IRC-18
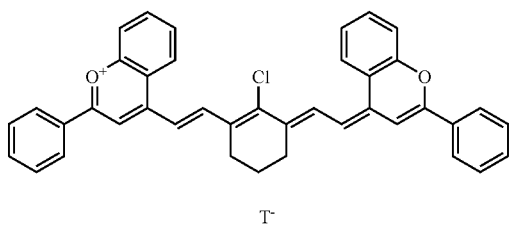
IRC-19
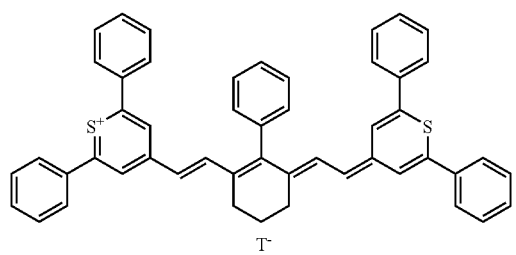
IRC-20
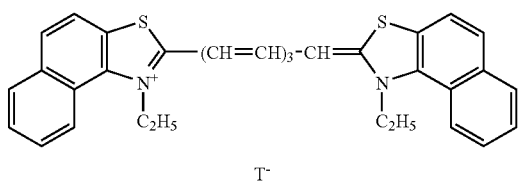
IRC-21
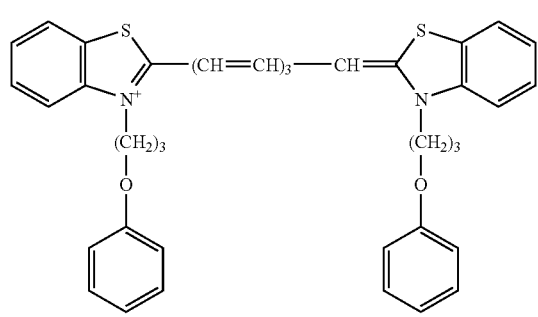

-continued
IRC-22
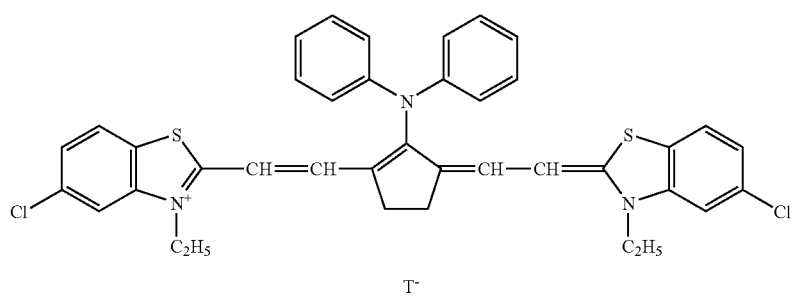
IRC-23
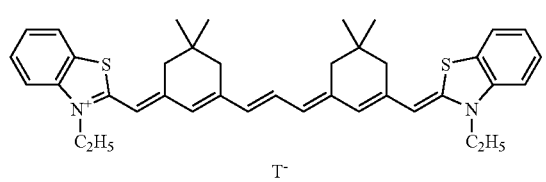
IRC-24
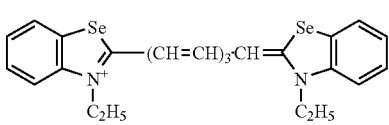
IRC-25
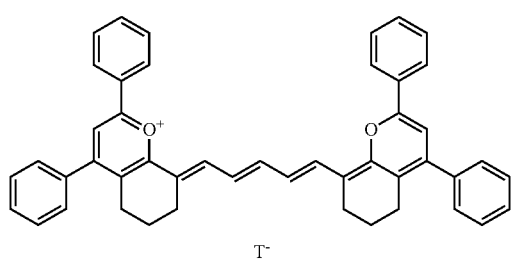
IRC-26
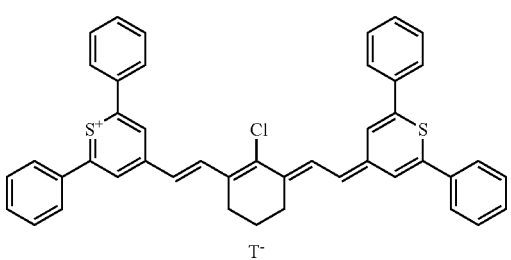
IRC-27
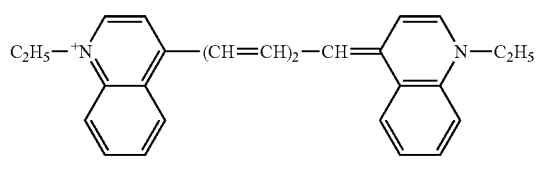
IRC-28
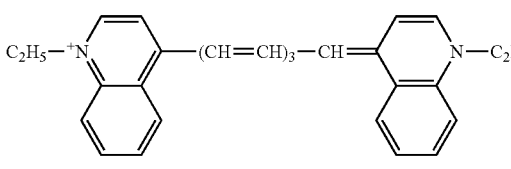
IRC-29
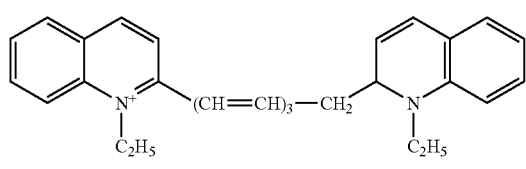
IRC-30
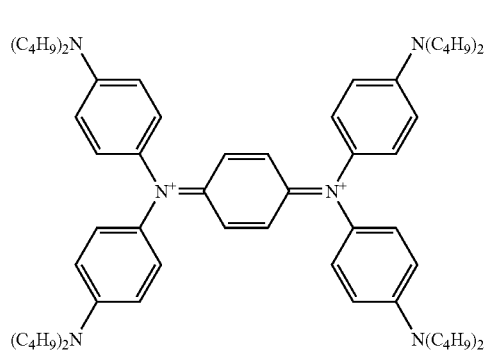
IRC-31
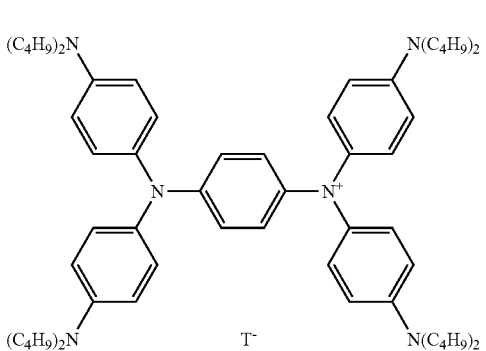

-continued
IRC-32
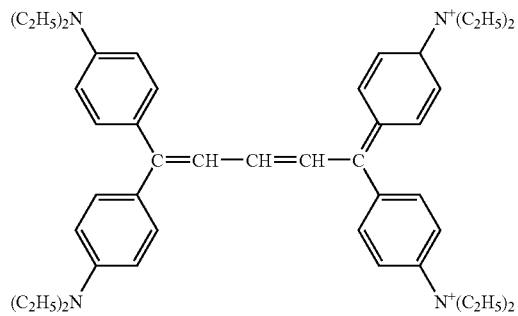
IRC-33
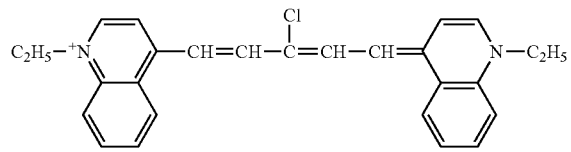
T⁻
IRC-34
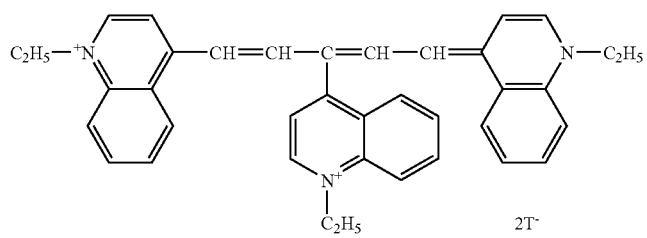
2T⁻
IRC-35
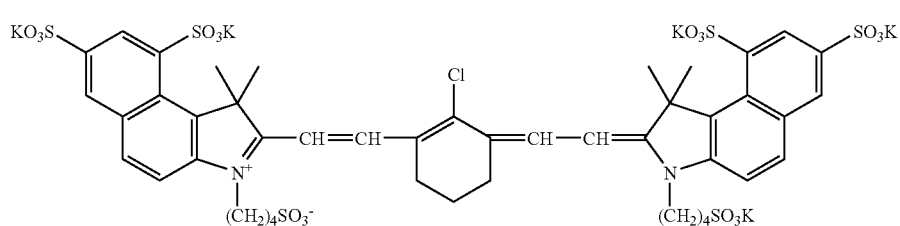
IRC-36
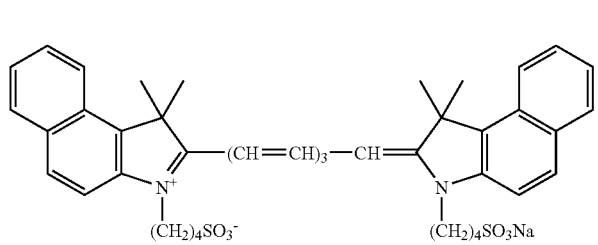
IRC-37
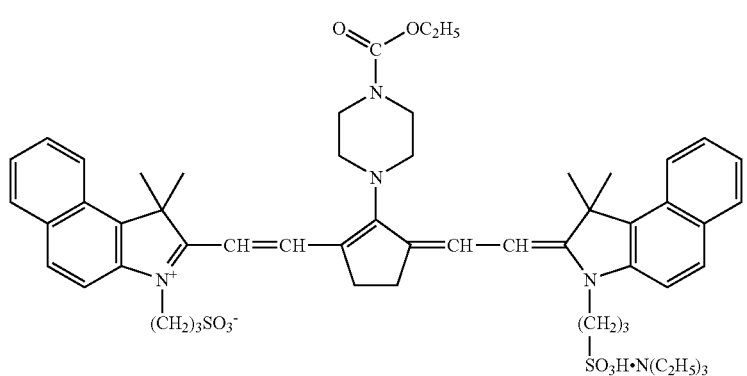

-continued
IRC-38
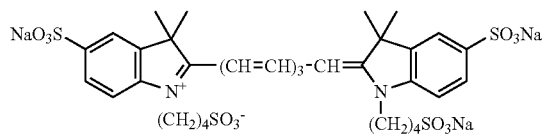
IRC-39
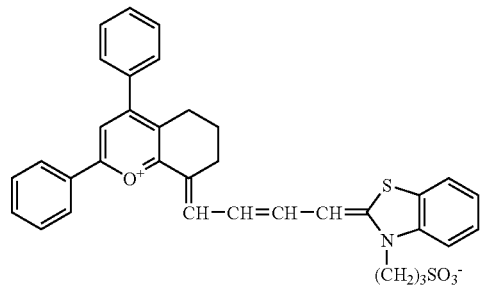
IRC-40
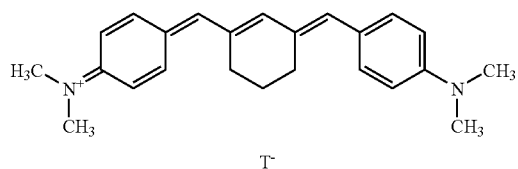
IRC-41
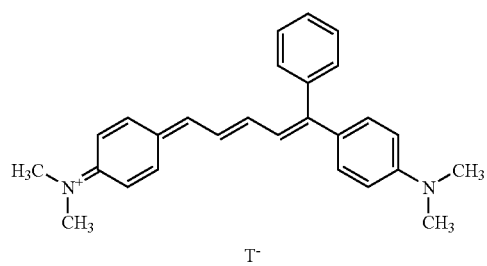
IRC-42
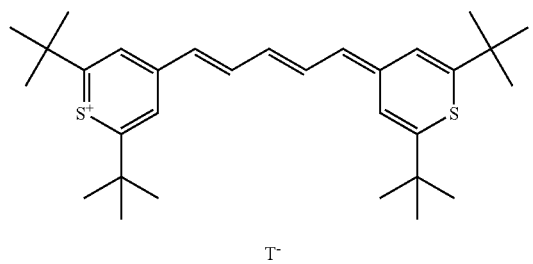
IRC-43
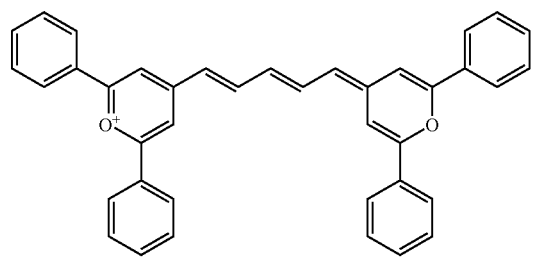
IRC-44
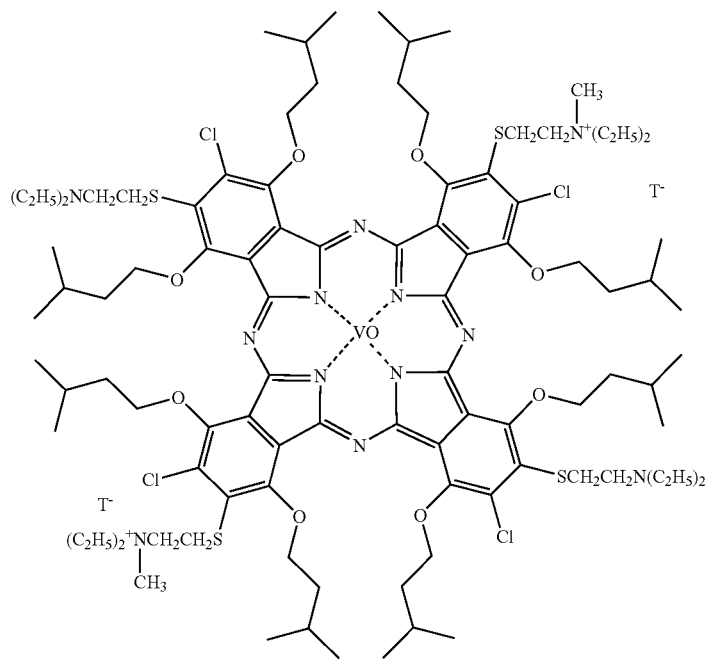

In the foregoing structural formulae, $T^-$ represents a monovalent counter ion, and preferably a halogen anion (such as $F^-$, $Cl^-$, $Br^-$, and $I^-$), a Lewis acid anion (such as $BF_4^-$, $PF_6^-$, $SbCl_6^-$ and $ClO_4^-$), an alkylsulfonic acid anion, or an arylsulfonic acid anion.

The "alkyl" in the alkylsulfonic acid means a linear, branched or cyclic alkyl group having from 1 to 20 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbonyl group. Of these are preferable linear alkyl groups having from 1 to 12 carbon atoms, branched alkyl groups having from 3 to 12 carbon atoms, and cyclic alkyl groups having from 5 to 10 carbon atoms.

The "aryl" in the arylsulfonic acid represents ones comprising one benzene ring, ones in which two or three benzene rings form a fused ring, or ones in which a benzene ring and a 5-membered unsaturated ring form a fused ring. Specific examples include a phenyl group, a naphthyl group, an anthryl group, a phenanthryl group, an indenyl group, an acenabutenyl group, and a fluorenyl group, with a phenyl group and a naphthyl group being preferred.

Further, the following nonionic infrared absorbers IRN-1 to IRN-9 can be suitably used.

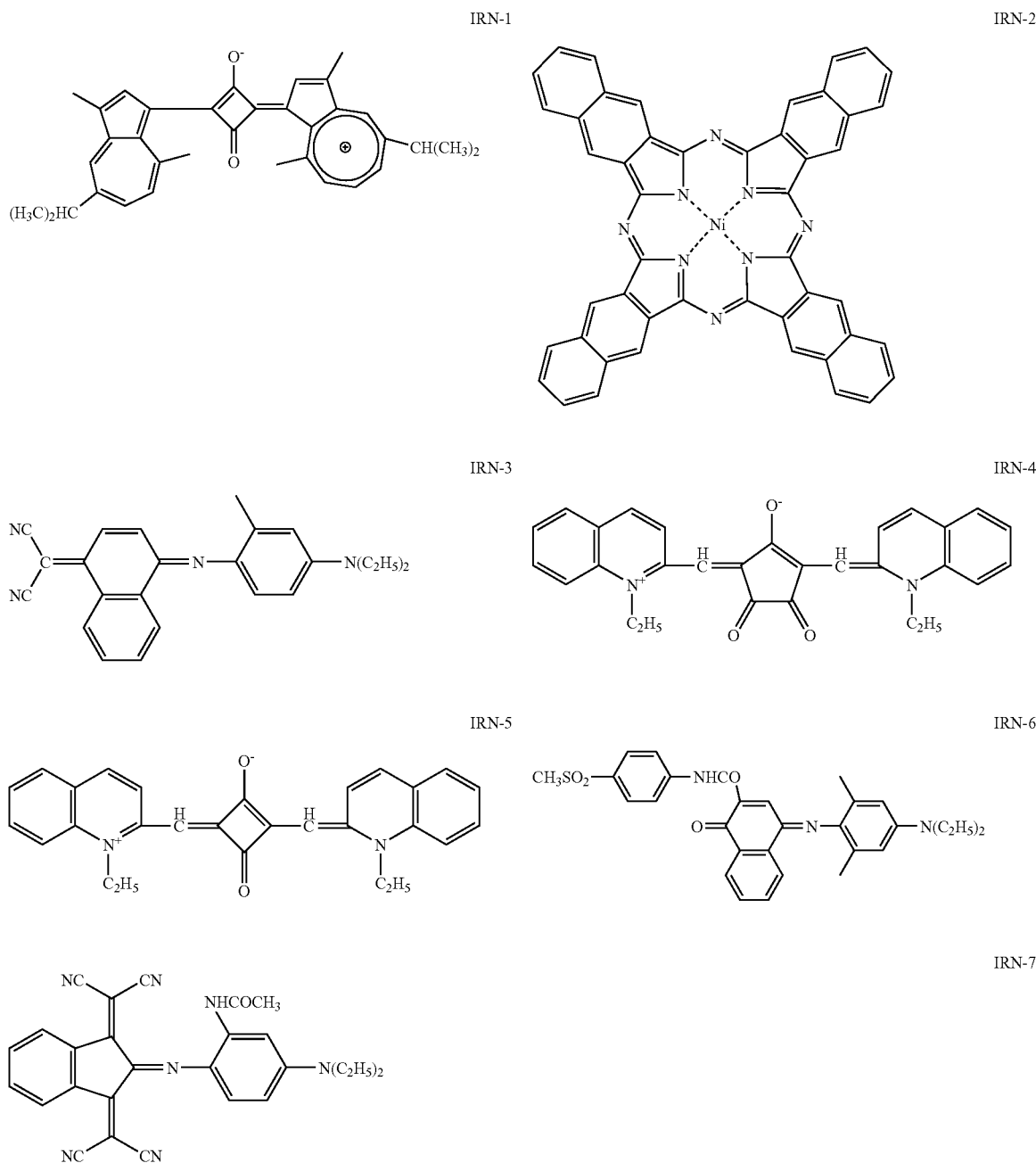

-continued

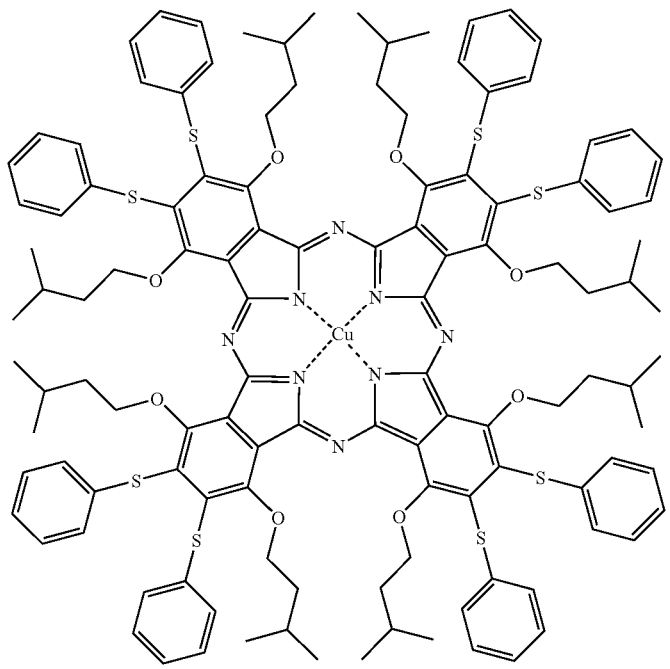

IRN-8

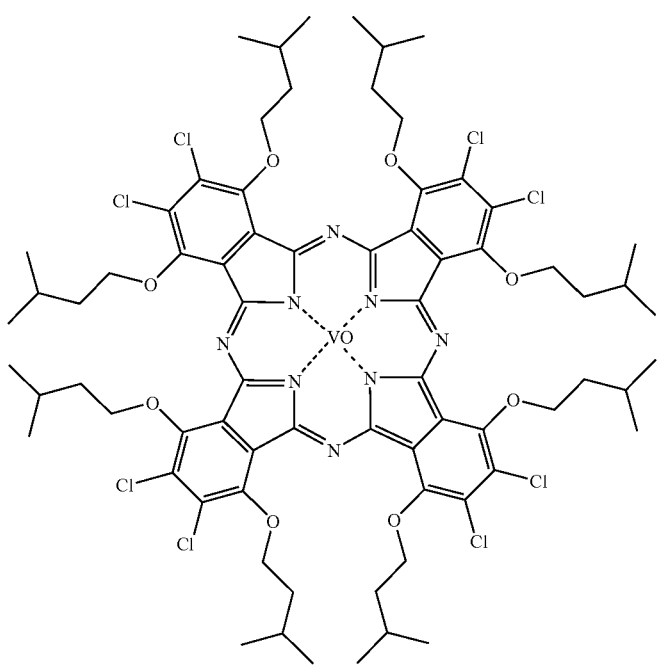

IRN-9

Among the foregoing illustrative compounds, particularly preferable are IRA-1 as the anionic infrared absorber, IRC-7, IRC-30, IRC-40 and IRC-42 as the cationic infrared absorbers, and IRN-9 as the nonionic infrared absorber, respectively.

Pigment

As pigments that are used in the invention can be utilized commercially available pigments and pigments described in Color Index Handbook, *Saishin Ganryo Binran* (The Newest Pigment Handbook) (edited by The Japan Pigment Technology Association, 1977), *Saishin Canryo Oyo Gijutsu* (The Newest Pigment Application Technology) (published by CMC Publishing Co., Ltd., 1986), and *Insatsu Inki Gijutsu* (Printing Ink Technology) (published by CMC Publishing Co., Ltd., 1984).

As kinds of pigments are provided black pigment, yellow pigments, orange pigments, brown pigments, red pigments, violet pigments, blue pigments, green pigments, fluorescent pigments, metallic flake pigments, and polymer-binding pigments. Specifically, insoluble azo pigments, azo lake pigments, condensed azo pigments, chelate azo pigments, phthalocyanine pigments, anthraquinone pigments, perylene or piperylene pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black. Of these is preferable carbon black.

These pigments may be used without being subjected to surface processing, or may be used after being subjected to surface processing. As the method of the surface processing, there may be considered a method of coating the surface of the pigment with a resin or a wax, a method of adhering a surfactant to the surface of the pigment, and a method of a reactive substance (such as silane coupling agents, epoxy compounds, and cyanate compounds) to the surface of the pigment. These surface processing methods are described in *Kinzoku sekken No SeishitSu To Oyo* (Nature and Application of Metallic Soap) (published by Saiwai Shobo Co., Ltd.), *Insatsu Ink Gijutsu* (Printing Ink Technology) (published by CMC Publishing Co., Ltd., 1984), and *Saishin Ganryo Oyo Gijutsu* (The Newest Pigment Application Technology) (published by CNC Publishing Co., Ltd., 1986).

The pigment preferably has a particle size in the range of 0.01 μm to 10 μm, more preferably from 0.05 μm to 1 μm, and particularly preferably from 0.1 μm to 1 μm. When the particle size of the pigment is less than 0.01 μm, such is not preferred from the standpoint of stability of the dispersion in a coating solution for recording layer. On the other hand, when it exceeds 10 μm, such is not preferred from the standpoint of uniformity of the recording layer.

As a method of dispersing the pigment, known dispersing technologies used in ink production or toner production can be used. Examples of dispersing machines include ultrasonic dispersing units, sand mills, attritors, pearl mills, super mills, ball mills, impellers, dispersers, KD mills, colloid mills, dynatrons, three-roll mills, and pressure kneaders. The details are described in *Saishin Ganryo Oyo Gijutsu* (The Newest Pigment Application Technology) (published by CMC Publishing Co. Ltd., 1986).

The sensitizing dye to be added for accelerating curing reaction of the polymerizable composition of the invention of the invention may be added directly to the polymerizable composition along with other components. By providing another layer adjacent thereto and adding the sensitizing dye thereto, the same effect can also be obtained.

Especially, in the case where the polymerizable composition of the invention is used in a negative-working recording layer of planographic printing plate precursor described later, the polymerizable composition may be added to the same layer as the recording layer or another layer as provided. During preparation of negative-working planographic printing plate precursors, it is preferred that the photosensitive layer (recording layer) has an optical density falling with the range of from 0.1 to 3.0 at the absorption maximum at a wavelength in the range of 300 nm to 1,200 nm. When the optical density falls outside this range, sensitivity is liable to be lowered. Since the optical density is determined depending on the addition amount of the sensitizing pigment and the thickness of the recording layer, a prescribed optical density is obtained by controlling the both conditions.

The optical density of the recording layer can be measured by usual methods. Examples of measurement methods include a method in which a recording layer having a thickness as properly determined such that the coating amount after drying falls within the range necessary as a planographic printing plate is formed on a transparent or white support, whose optical density is then measured by a transmission type optical densitometer; and a method in which a recording layer is formed on a reflecting support such as aluminum, whose reflection density is then measured.

Other Components

If desired, various compounds other than those described above may be added to the polymerizable composition of the invention. For example, dyes having large absorption in visible regions can be used as a coloring agent of image. Specific examples include Oil Yellow #101, Oil Yellow #103, Oil Pink #312, Oil Green BG, Oil Blue BOS, Oil Blue #603, Oil Black BY, Oil Black BS, and Oil Black T-505 (all being manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A No. 62-293247. Further, phthalocyanine pigments, azo pigments, carbon blacks, and pigments such as titanium oxide can be suitably used.

It is preferred to add such a coloring agent because the coloring agent enables to easily distinguish image areas from non-image areas after image formation. The addition amount of the coloring agent is preferably from 0.01 to 10% by weight based on the whole of solid contents of the coating solution for recording layer.

In the invention, for preventing unnecessary heat polymerization of the radical polymerizable compound from occurrence during preparation or preservation of the image forming material, it is desired to add a small amount of a heat polymerization inhibitor. Suitable examples of heat polymerization inhibitors include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt. The addition amount of the heat polymerization inhibitor is from about 0.01 to 5% by weight on a basis of the weight of the whole of composition. Also, if desired, for preventing polymerization inhibition by oxygen, a higher fatty acid derivative such as behenic acid and behenic amide may be added such that it is locally present on the surface of the thermosensitive layer during drying step after coating. The addition amount of the higher fatty acid derivative is preferably from about 0.1% by weight to about 10% by weight of the whole of composition.

The polymerizable composition of the invention is mainly used for forming a recording layer of planographic printing plate precursor. For broadening stability of the processing against the development condition of recording layer, non-ionic surfactants described in JP-A Nos. 62-251740 and 3-208514 and ampholytic surfactants described in JP-A Nos. 59-121044 and 4-13149 can be added.

Examples of nonionic surfactants include sorbitan tristearate, sorbitan monopalmitate, sorbitan trioleate, stearic acid monoglyceride, and polyoxyethylene nonylphenyl ether.

Examples of ampholytic surfactants include alkyl di(aminoethyl) glycines, alkyl polyaminoethyl glycine hydrochlorides, 2-alkyl-N-carboxyethyl-N-hydroxyethyl imidazolium betaines, and N-tetradecyl-N,N-betaines (such as a trade name: AMOGEN K, manufactured by Daiichi Kogyo K.K.).

A proportion of the nonionic surfactant or ampholytic surfactant in the coating solution for recording layer is preferably from 0.05 to 15% by weight, and more preferably from 0.1 to 5% by weight.

In addition, for imparting flexibility of the coating film, etc., plasticizers can be added to the coating solution for recording layer according to the invention, as the need arises. Examples include polyethylene glycol, tributyl citrate, diethyl phtbalate, dibutyl phthalate, dihexyl phthalate, dioctyl phthalate, tricresyl phosphate, tributyl phosphate, trioctyl phosphate, and tetrahydrofurfuryl oleate.

The planographic printing plate precursor of the invention may be usually formed by dissolving the constituent components of the recording layer in a solvent along with respective components necessary for coating solution and coating the solution on an appropriate support. Examples of solvents to be used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, tolune, and water. However, it should not be construed that the invention is limited thereto. These solvents may be used alone or in admixture. The concentration of the foregoing components (the whole of solid contents including the additives) in the solvent is preferably in a range of 1 to 50% by weight The coating amount (solids content) of the recording layer on the support obtained after coating and drying varies depending on the utility, but so far as planographic printing plate precursors are concerned, it is usually preferably in a range of 0.5 to 5.0 g/m$^2$. As a coating method, various methods can be employed. Examples include bar coater coating, rotary coating, spray coating, curtain coating, dip coating, air knife coating, blade coating, and roll coating. As the coating amount decreases, the apparent sensitivity increases, but film characteristics of the recording layer are lowered.

In the invention, surfactants for improving the coating property, such as fluorine surfactants described in JP-A No. 62-170950, can be added to the coating solution for recording layer. The addition amount of such a surfactant is preferably in a range of 0.01 to 1% by weight, and more preferably in a range of 0.05 to 0.5% by weight in the solid contents of the whole of photosensitive layer (recording layer).

The planographic printing plate precursor of the invention uses the foregoing specific binder polymer capable of being rapidly cured to form a firm coating film and having high shielding property of oxygen from the outside as the binder component and has an advantage such that it is possible to suppress a reduction of image forming property due to polymerization inhibition by oxygen, etc. Accordingly, the planographic printing plate precursor of the invention is not particularly required to provide a protective layer that is usually provided in planographic printing plate precursors having a negative-working polymerizable recording layer. Further, for the purposes of enhancing shielding property of oxygen from the outside and enhancing image forming property, especially image intensity, the planographic printing plate precursor of the invention may be provided with a protective layer using a water-soluble high-molecular compound having relatively excellent crystallinity, which is low in permeation of low-molecular compounds such as oxygen and can readily be removed in the development step after exposure, such as polyvinyl alcohol, polyvinylpyrrolidone, acidic celluloses, gelatin, gum arabic, and polyacrylic acids.

Support

As the support in the planographic printing plate precursor of the invention, dimensionally stable sheet-like materials can be used without particular limitations. Examples include papers, papers laminated with plastics (such as polyethylene, polypropylene, and polystyrene), metal sheets (such as aluminum, zinc, and copper), and plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal). These resin films or metal sheets may be a sheet made of a single material or a lamination made of two or more materials. Examples include papers or plastic films laminated or vapor deposited with the foregoing metals and laminate sheets of films of different plastics.

As the support are preferable polyester films or aluminum sheets. Among these, relatively cheap aluminum sheets are particularly preferable. Suitable aluminum sheets are pure aluminum sheets and alloy sheets containing aluminum as a major component and trace amounts of foreign elements, and further, plastic films laminated or vapor deposited with aluminum may be employed. Examples of foreign elements contained in aluminum alloys include silicon, iron, manganese, copper, magnesium, chromium, zinc, bismuth, nickel, and titanium. The content of foreign elements in the alloy is at most 10% by weight. In the invention, pure aluminum is particularly suitable. However, since it is difficult to produce completely pure aluminum from the standpoint of refining technology, those containing slightly foreign elements may be used. Aluminum sheets that are applied in the invention are not specified with respect to their compositions, and those that have hitherto been known and used can be properly utilized.

The aluminum sheets have a thickness of in a range of about 0.1 to 0.6 mm, preferably in a range of 0.15 to 0.4 mm, and particularly preferably in a range of 0.2 to 0.3 mm.

Prior to roughing the aluminum sheet, if desired, the aluminum sheet is subjected to degreasing processing with, for example, a surfactant, an organic solvent or an alkaline aqueous solution for the purpose of removing a rolling oil on the surface.

The roughing processing of the surface of the aluminum sheet can be carried out by various methods such as a method of mechanically roughing the surface, a method of electrochemically dissolving and roughing the surface, and a method of chemically selectively dissolving the surface. As the mechanical method, known methods such as ball polishing, brush polishing, blast polishing, and buff polishing can be employed. As the electrochemical roughing method, a method of using an alternating current or direct current in a hydrochloric acid or nitric acid electrolytic solution can be employed. Further, a combination of the both methods disclosed in JP-A No. 54-63902 can also be employed.

The thus roughed aluminum sheet is subjected to alkali etching processing and neutralization processing as the need arises. Thereafter, if desired, the aluminum sheet is further subjected to anodic oxidation processing for the purpose of enhancing water retention and abrasion resistance of the surface. As electrolytes to be used for the anodic oxidation processing of the aluminum sheet, various electrolytes capable of forming a porous oxidized film can be used. In general, sulfuric acid, phosphoric acid, oxalic acid, chromic acid, or mixed acids thereof can be used. A concentration of such an electrolyte is properly determined depending on the kind of electrolyte.

The processing condition of the anodic oxidation varies depending on the electrolyte and hence, cannot be unequivocally specified. In general, it is proper that; the concentration of electrolyte is from 1 to 80% by weight, the liquid temperature is from 5 to 70° C., the current density is from 5 to 60 A/dm², the voltage is from 1 to 100 V, and the electrolysis time is from 10 seconds to 5 minutes.

The amount of the anodically oxidized film is preferably 1.0 g/m² or more, and more preferably in the range of 2.0 to 6.0 g/m². When the amount of the anodically oxidized film is less than 1.0 g/m², printing endurance is liable to be insufficient, or scuffs are likely formed in non-image areas of planographic printing plate, whereby so-called "scuff stain" in which an ink easily adheres to scuffs during printing is likely generated.

Incidentally, the anodic oxidation processing is applied on the surface of the support of planographic printing plate to be printed. However, it is general that an anodically oxidized film of from 0.01 to 3 g/m² is also formed on the aback surface due to spreading to back of electric lines of force.

After the anodic oxidation processing, the support surface is subjected to hydrophilic processing, and conventionally known processing methods are employed. As the hydrophilic processing is employed a method of using alkali metal silicates (such as a sodium silicate aqueous solution) as disclosed in U.S. Pat. Nos. 2,714,066, 3,181,461, 3,280,734 and 3,902,734. According to this method, the support is subjected to dip processing or electrolysis processing with a sodium silicate aqueous solution. Besides, there are employed a method of processing with potassium fluorozirconate as disclosed in JP-B No. 36-22063 and a method of processing with polyvinylphosphonic acid as disclosed in U.S. Pat. Nos. 3,276,868, 4,153,461 and 4,689,272.

In the invention, the hydrophilic processing is particularly preferably silicate processing. The silicate processing will be described below.

The thus processed anodically oxidized film of aluminum sheet is dipped in an aqueous solution having from 0.1 to 30% by weight, and preferably from 0.5 to 10% by weight of an alkali metal silicate and having a pH of from 10 to 13 at 25° C., for example, at from 15 to 80° C. for from 0.5 to 120 seconds. When the pH of the alkali metal silicate aqueous solution is less than 10, the solution is gelled, whereas when it exceeds 13.0, the oxidized film is dissolved. Examples of the alkali metal silicate that is used in the invention include sodium silicate, potassium silicate, and lithium silicate. Examples of hydroxides that are used for increasing the pH of the alkali metal silicate aqueous solution include sodium hydroxide, potassium hydroxide, and lithium hydroxide. Incidentally, the processing solution may be compounded with alkaline earth metal salts or Group IVB metal salts. Examples of alkaline earth metal salts include water-soluble salts such as nitrates (such as calcium nitrate, strontium nitrate, magnesium nitrate, and barium nitrate), sulfates, hydrochlorides, phosphates, acetates, oxalates, and borates. Examples of Group IVB metal salts include titanium tetrachloride, titanium trichloride, potassium titanium fluoride, potassium titanium oxalate, titanium sulfate, titanium tetraiodide, zirconium chloride oxide, zirconium dioxide, zirconium oxychloride, and zirconium tetrachloride. These alkaline earth metal salts of Group IVB metal salts can be used alone or in combination of two or more thereof. The addition amount of such a metal salt is preferably in the range of in a range of 0.01 to 10% by weight, and more preferably in a range of 0.05 to 5.0% by weight.

Since hydrophilicity on the aluminum sheet surface is further improved by the silicate processing, the ink hardly adheres to non-image areas during printing, whereby staining performance is enhanced.

A back coat is provided on the back surface of the support as the need arises. As such a back coat, coating layers made of an organic high-molecular compound described in JP-A No. 5-45885 or of a metal oxide obtained by hydrolysis or polycondensation of an organic or inorganic metal compound described in JP-A No. 6-35174 are preferably used.

With respect to these coating layers, alkoxy compounds of silicon, such as $Si(OCH_3)_4$, $Si(OC_2H_5)_4$, $Si(OC_3H_7)_4$, and $Si(OC_4H_9)_4$, are cheap and readily commercially available, and coating layers made of a metal oxide obtained from such an alkoxy compound of silicon are excellent in resistance to developing solution and particularly preferable.

Protective Layer

In the case where the planographic printing plate precursor of the invention is a planographic printing plate precursor for scanning exposure, since exposure is usually carried out in air, a protective layer can further be provided on the recording layer. The protective layer prevents incorporation of low-molecular compounds (such as basic substances), which are present in air and are liable to inhibit image formation reaction caused by exposure in the recording layer, so that it becomes possible to realize exposure in air. Accordingly, such a protective layer is required to have characteristics such that it has low permeability of low-molecular compounds; it does not substantially inhibit permeation of light to be used for exposure; it has excellent adhesion to the recording layer; and it can readily be removed in the development step after the exposure.

With respect to such protective layers, there have hitherto been made various devices described in U.S. Pat. No. 3,458,311 and JP-A No. 55-49729. As materials that can be used for protective layers, water-soluble high-molecular compounds having relatively excellent crystallinity can be used. Specific examples water-soluble polymers such as include polyvinyl alcohol, polyvinylpyrrolidone, acidic celluloses, gelatin, gum arabic, and polyacrylic acids. Especially, use of polyvinyl alcohol as the major component gives the best results with respect to basic characteristics such as oxygen shielding property and development removal property. The polyvinyl alcohol to be used in the protective layer may be partially substituted with an ester, an ether, or an acetal so far as it contains an unsubstituted vinyl alcohol unit for having necessary oxygen shielding property and water solubility. Further, the polyvinyl alcohol may partly have other copolymerization components. Examples of the polyvinyl alcohol include those having been hydrolyzed to an extent of from 71 to 100% by mole and having a weight average molecular weight in the range of 300 to 2,400. Specific examples includes PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA217EE, PVA-217E, PVA-220E, PVA-224E, PVA-405, PVA-420, PVA-613, and L-8 (all being trade names of Kuraray Co., Ltd.).

Components of the protective layer (inclusive of selection of PVA and use of additives), coating amount, etc. are selected while taking into account shielding property of low-molecular substances, development removal property, fogging, adhesion, and scuff resistance. In general, the higher the degree of hydrolysis of PVA to be used (i.e., the higher the content of unsubstituted vinyl alcohol unit in the protective layer) and the thicker the film thickness, the higher the shielding property of low-molecular substances, therefore, such is advantageous on the point of sensitivity. However, where the shielding property of low-molecular substances is extremely high, there are caused problems such that unnecessary polymerization reaction takes place during production and fresh preservation and that unnecessary fogging and thickening of image lines are generated during image exposure. Further, adhesion to image areas and scuff resistance are also extremely important in handling printing plates. That is, when a hydrophilic layer made of a water-soluble polymer is laminated on an oleophilic polymerization layer, film separation is liable to take place due to shortage of adhesion. In contrast, various proposals have been made for improving the adhesion between these two layers. For example, JP-A No. 49-70702 (counterpart to U.S. patent application Ser. No. 292,501) and GB-A No. 1,303, 570 (counterpart to U.S. patent application Ser. No. 44,563) describe that by mixing from 20 to 60% by weight of an acrylic emulsion or a water-insoluble polyvinylpyrrolidone-vinyl acetal copolymer in a hydrophilic polymer mainly composed of polyvinyl alcohol and laminating the mixture on a polymerization layer, sufficient adhesion is obtained. For the protective layer in the invention, any of these known technologies can be applied. Coating methods of such protective layers are described in detail in U.S. Pat. No. 3,458,311 and JP-A No. 55-49729.

In addition, it is possible to impart other functions to the protective layer. For example, when lasers are used as a light source, there may be the case where a photosensitive composition is desired to have excellent sensitivity at wavelengths of that light source but not have sensitivity at other wavelengths. For example, when the light source is one in infrared regions of 750 nm or longer, the photosensitive composition can be used in a light room, but actually, it is also sensitized by rays having shorter wavelengths, such as fluorescent lamp. In that case, it is preferred to add coloring agents (such as water-soluble dyes) having excellent light transmittance of light source and capable of effectively absorbing rays having a wavelength shorter than 700 nm. As another example, when the light source is one in ultraviolet regions of not longer than 450 nm, the photosensitive composition can be used substantially under safety light. However, in actual, there may be the case where the photosensitive composition is sensitized by visible lights of 500 nm or longer. In that case, by adding coloring agents (such as water-soluble dyes) having excellent light transmittance of light source and capable of effectively absorbing rays having a wavelength of 500 nm or longer, adaptability to safety light can be enhanced without causing a reduction of sensitivity.

Thus, the planographic printing plate precursor of the invention can be prepared. This planographic printing plate precursor can be recorded by ultraviolet lamps, visible lasers, or infrared lasers. In the invention, it is preferred that image exposure is carried out by solid lasers or semiconductor lasers capable of radiating actinic rays in a ultraviolet to infrared wavelength region or 300 nm to 1,200 nm.

In the invention, the following lasers are preferable.

Examples of gas lasers include Ar ion lasers (364 nm, 351 nm, 10 mW to 1 W), Kr ion lasers (356 nm, 351 nm, 10 mW to 1 W), and He-Cd lasers (441 nm, 325 nm, 1 mW to 100 mW); and examples of solid lasers include twice combinations of Nd:YAG(YVO$_4$) and SHG crystals and combinations of Cr:LiSAF and SHG crystals (430 nm, 10 mw).

Examples of semiconductor lasers include KNbO$_3$, ring resonators (430 nm, 30 mW), combinations of waveguide type wavelength sensing element and AlGaAs or InGaAs semiconductor (380 nm to 450 nm, 5 mW to 100 mW), combinations of waveguide type wavelength sensing element and AlGaInP or AlGaAs semiconductor (300 nm to 350 nm, 5 mW to 100 mW), and AlGaInN (350 nm to 450 nm, 5 mW to 30 mW).

Besides, pulse layers such as N$_2$ lasers (337 nm, pulse: 0.1 to 10 mJ) and XeF (351 nm, pulse: 10 to 250 mJ) are provided.

Among these, AlGaInN semiconductor layers (commercially available InGaN semiconductor lasers: 400 to 410 nm, 5 to 30 mW) are particularly preferable from the standpoints of wavelength characteristic and cost.

Besides, examples of available light sources of from 450 nm to 700 nm that can be used include Ar$^+$ lasers (488 nm), YAG-SHG lasers (532 nm), He-Ne lasers (633 nm), He-Cd lasers, and red semiconductor lasers (650 to 690 nm) and examples of available light sources of from 700 nm or 1,200 nm that can be used include semiconductor lasers (800 to 850 nm) and Nd-YAG lasers (1,064 nm).

Besides, various mercury vapor lamps of extra-high pressure, high pressure, medium pressure and low pressure, chemical lamps, carbon arc lamps, xenon lamps, metal halide lamps, ultraviolet laser lamps (such as ArF excimer lasers and KrF excimer lasers), and radiations such as electron beams. X rays, ion beams, and far infrared rays can be utilized. Especially, laser light sources of 350 nm or longer (preferably not longer than 1,200 nm) are preferable because they are cheap.

The planographic printing plate precursor containing the polymerizable composition of the invention in a recording layer is also suitably used for image exposure by solid lasers or semiconductor lasers capable of radiating actinic rays in regions of from 700 nm to 1,200 nm. The reason of this resides in the following matter. That is, there is the case where curing in a lower portion of the recording layer does not sufficiently proceed in image exposure by solid lasers or semiconductor lasers capable of radiating actinic rays in regions of from 700 nm to 1,200 nm. Even in such case, the effect of the specific acid group in the invention remarkably reveals, thereby exhibiting excellent printing endurance.

After the exposure, it is preferred that the recording layer in the invention is developed with water or an alkaline aqueous solution.

In the invention, in the case where an alkaline aqueous solution is used as a developing solution, conventionally known alkaline aqueous solutions can be used as the developing solution and a replenisher thereof. Examples include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide; and organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkaline agents may be used alone or in combination of two or more thereof.

In addition, in the case where development is carried out using an automatic processor, it is known that by adding one the same as in the developing solution or an aqueous solution (replenisher) having a higher alkaline strength than the developing solution to the developing solution, a large amount of planographic printing plate precursors can be processed without exchanging the developing solution as used in a developing bath over a long period of time. This method is suitably applied, too in the invention.

For the purposes of accelerating or retarding developability, diffusing development scums, and enhancing ink-philic property of image areas of printing plates, various surfactants and organic solvents can be added to the developing solution and replenisher, as the need arises. As surfactants are preferable anionic, cationic, nonionic and ampholytic surfactants. As organic solvents is preferable benzyl alcohol. Further, it is also preferred to add polyethylene glycol or its derivatives, or propylene glycol or its derivatives. Also, non-reducing sugars such as arabitol, sorbitol, and mannitol can be added.

Also, it is possible to add hydroquinone, resorcin, inorganic salt reducing agents such as sodium salts and potassium of sulfurous acid or bydrogensulfurous acid, organic carboxylic acids, defoaming agent, or hard water softeners to the developing solution and replenisher, as the need arises.

The planographic printing plate thus developed using the developing solution and replenisher is subjected to post treatment with, for example, washing water, a rinse solution containing a surfactant, and a desensitizing solution containing gum arabic and starch derivatives. In the invention, in the case where the image forming material is used as a recording layer, these treatments can be employed through various combinations as the post treatment.

In recent years, in the industries of plate making and printing, for the purposes of rationalization and standardization, an automatic processor for printing plate is widely used. Such an automatic processor generally includes a development section and a post treatment section and further includes a unit for conveying a printing plate and respective processing solution tanks and spray units, in which an exposed printed plate is conveyed horizontally and developed while spraying each of processing solutions drawn up by a pump from spray nozzles. Further, recently, there is also known a method in which printing plate materials are processed in a processing solution tank filled with a processing solution while dipping and conveying by guide rollers. In such automatic processing, the processing can be performed while replenishing a replenisher to each processing solution according to the processing amount and operation time. Moreover, the processing solution can be automatically replenished upon detection of the electric conductivity by a sensor.

Also, a so-called non-returnable processing system of treating with a substantially virgin processing solution can also be applied.

The thus obtained planographic printing plate can be provided for printing step after coating a desensitizing gum, if desired. In the case where a planographic printing plate is required to have higher printing endurance, the planographic printing plate is subjected to burning processing.

In the case where a planographic printing plate is subjected to burning processing, it is preferred to treat the planographic printing plate with a surface conditioning solution described in JP-B Nos. 61-2518 and 55-28062 and JP-A Nos. 62-31859 and 61-159655 prior to the burning processing.

Examples of methods of performing such processing include a method in which a surface conditioning solution is coated on a planographic printing plate using a sponge or absorbent cotton impregnated with the surface conditioning solution, a method in which the planographic printing plate is dipped in a vat filled with a surface conditioning solution and coated with the surface conditioning solution, and a method in which a surface conditioning solution is coated using an automated coater. Further, what a coating amount is made uniform after coating by a squeegee or a squeegee roller gives rise more preferred results.

A suitable coating amount of the surface conditioning solution is in general in a range of 0.03 to 0.8 g/m$^2$ (on a dry weight).

The surface conditioning solution-coated planographic printing plate is heated at high temperatures by a burning processor (for example, a burning processor "BP-1300" (trade name), sold by Fuji Photo Film Co., Ltd.), etc. after drying, as the need arises. In this case, the heating temperature and time vary depending on the kind of components forming an image, and the heating is preferably carried out at from 180 to 300° C. for from 1 to 20 minutes.

If desired, the burning processed planographic printing plate can be properly subjected to conventionally employed processings such as water washing and gumming. In the case where a surface conditioning solution containing a water-soluble high-molecular compound is used, so-called desensitizing processing such as gumming can be omitted.

The planographic printing plate obtained from the planographic printing plate precursor of the invention through such processings is fixed in an offset printer and used for producing a number of prints.

The polymerizable compound of the invention can be utilized in not only planographic printing plates for scanning exposure but also a wide variety of applications known as photocurable resins without limitations. For example, when the polymerizable compound of the invention is applied to a liquid photopolymerizable composition optionally in combination with a cationic polymerizable compound, high-sensitivity rapid prototyping materials are obtained. Further, by utilizing a change in refractive index following the photopolymerization, it is possible to make the polymerizable compound of the invention as a holographic material. By utilizing a change in adhesiveness of the surface following the photopolymerization, it is possible to apply the polymerizable compound of the invention as various transfer materials (such as peeling-apart materials and toner developing photosensitive materials). The polymerizable compound of the invention can also be applied to photocuring of microcapsules. The polymerizable compound of the invention can be applied to production of electronic materials such as photoresists and as inks and photocurable resin materials such as coating materials and adhesives.

EXAMPLES

The present invention will be described below in more detail with reference to the following Examples and Comparative Examples, however, the invention is limited thereto.

Examples 1 to 15 and Comparative Examples 1 to 6

Preparation of Supports

Support 1: Anodically Oxidized Aluminum Support

The surface of a 0.30 mm-thick aluminum sheet of a material quality of 1S was sandblasted using a No. 8 nylon brush and an aqueous suspension of 800-mesh pumistone and then well rinsed with water. The resulting aluminum sheet was dipped in and etched with a 10% by weight sodium hydroxide aqueous solution at 70° C. for 60 seconds, rinsed with running water, neutralized and rinsed with 20% $HNO_3$, and then rinsed with water. The aluminum sheet was subjected to electrolytic roughing processing in a 1% nitric acid aqueous solution using an alternating waveform current of sine wave under a condition of $V_\lambda=12.7$ V at an electrical quantity at anodization of 300 coulombs/$dm^2$. As a result of measurement, the resulting aluminum sheet was found to have a surface roughness (Ra) of 0.45 μm. Subsequently, the aluminum sheet was dipped in a 30% $H_2SO_4$ aqueous solution and subjected to desmutting processing at 55° C. for 2 minutes. Thereafter, a cathode was placed on the sand-blasted surface in a 20% $H_2SO_4$ aqueous solution at 33° C., and the aluminum sheet was subjected to anodic oxidation for 50 seconds at a current density of 5 A/$dm^2$ to form an oxidized film having a thickness of 2.7 g/$m^2$. The resulting aluminum sheet was defined as support 1.

Support 2

The following undercoating liquid composition 1 for surface processing was coated on the support 1 so that an Si amount was about 0.001 g/$m^2$, and dried at 100° C. for 1 minute to prepare a support 2.

Undercoating Liquid Composition 1

The following components were mixed and stirred, and after elapse for about 5 minutes, heat generation was observed. After reacting for 60 minutes, the contents were transferred into another container, to which was then added 30,000 parts by weight of methanol to pr par a liquid composition 2.

| | |
|---|---|
| Acidphosphoxy polyethyleneglycol monomethacrylate (trade name: Phosmer PE, manufactured by Uni-chemical Co., Ltd.) | 20 parts by weight |
| Methanol | 130 parts by weight |
| Water | 20 parts by weight |
| p-Toluenesulfonic acid | 5 parts by weight |
| Tetraethoxysilane | 50 parts by weight |
| 3-Methacryloxypropyl triethoxysilane | 50 parts by weight |

The following sol-gel reaction solution was coated on the back surface of the thus processed substrate using a bar coater and dried at 100° C. for 1 minute to prepare a support provided with a back coat layer having a coating amount after drying of 70 mg/$m^2$.

| Sol-gel reaction solution: | |
|---|---|
| Tetraethyl silicate | 50 parts by weight |
| Water | 20 parts by weight |
| Methanol | 15 parts by weight |
| Phosphoric acid | 0.05 parts by weight |

The foregoing components were mixed and stirred, and after elapse for about 5 minutes, h at generation was observed. After reacting for 60 minutes, the following solution was added to prepare a coating solution for back coat.

| | |
|---|---|
| Pyrogallol-formaldehyde condensate resin (molecular weight: 2,000) | 4 parts by weight |
| Dimethyl phthalate | 5 parts by weight |
| Fluorine surfactant (N-Butyl- perfluorooctanesulfonamidoethyl acrylate/polyoxyethylene acrylate copolymer, molecular weight: 20,000) | 0.7 parts by weight |
| Methanol silica gel (manufactured by Nissan Chemical Industries, Ltd., methanol: 30% by weight) | 50 parts by weight |
| Methanol | 800 parts by weight |

Formation of Photosensitive Layer (Recording Layer)

A photopolymerizable composition having the following composition was coated on the thus processed aluminum sheet such that the coating amount after drying was 1.5 g/$m^2$, and then dried at 100° C. for 1 minute to form a photosensitive layer (recording layer).

Coating Solution for Photosensitive Layer:
  Alkali-soluble high-molecular compound: Binder polymer component (the compound and amount being shown in Tables 6 to 8)
  Radical polymerizable compound; Radical polymerizable component (the compound and amount being shown in Tables 6 to 8)
  Polymerization initiator: Radical-generating compound component (the compound and amount being shown in Tables 6 to 8)
  Sensitizing pigment (the compound and amount being shown in Tables 6 to 8)
  Additive [S] (the compound and amount being shown in Tables 6 to 8)

| | |
|---|---|
| Fluorine surfactant (a trade name: MEGAFACE F-177, manufactured by Dainippon Ink and Chemicals, Incorporated) | 0.03 g |
| Heat polymerization inhibitor (N-Nitrsophenylhydroxylamine aluminum salt) | 0.01 g |
| Pigment dispersion | 2.0 g |
| Composition of pigment dispersion: Composition: | |
| Pigment Blue 15:6 | 15 parts by weight |
| Ally methacrylate/methacrylic acid copolymer (copolymerization molar ratio 83/17) | 10 parts by weight |
| Cyclohexanone | 15 parts by weight |
| Methoxypropyl acetate | 20 parts by weight |
| Propylene glycol monomethyl ether | 40 parts by weight |
| Methyl ethyl ketone | 20 g |
| Propylene glycol monomethyl ether | 20 g |

Incidentally, the alkali-soluble high-molecular compounds as used in the Examples are the specific binder polymer (A) obtained in the foregoing Synthesis Examples.

Specific examples of structural units (P1 to P5) of the alkali-soluble high-molecular weight compounds as used in the Comparative Examples, and polymerization initiators (B1 to B3), sensitizing pigments (C1 to C4), radical polymerizable compounds and additives (S1 to S4) as used in the Examples and comparative Examples are given below.

P-1
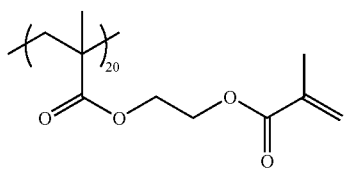 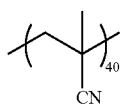 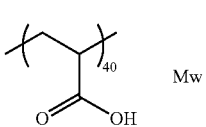 Mw
P-2
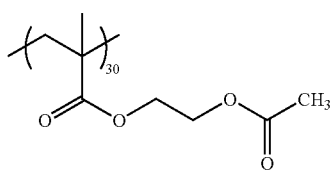 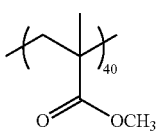 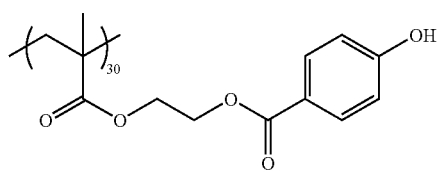 Mw
P-3
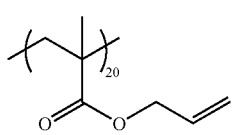 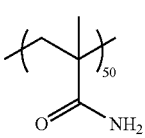 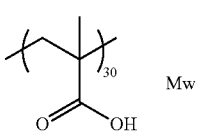 Mw
P-4
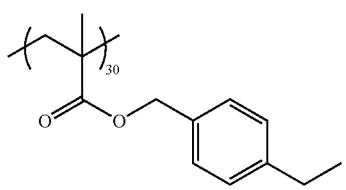 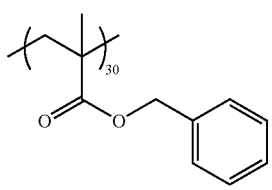 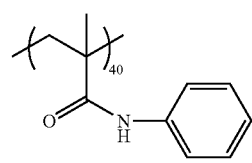 Mw
P-5
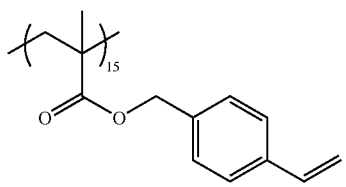 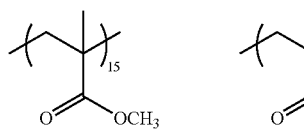 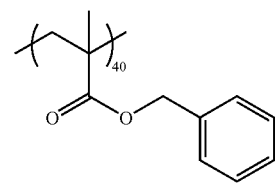 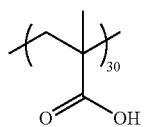
P-6
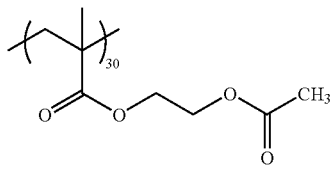 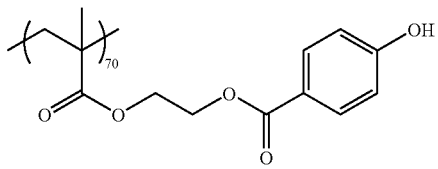 Mw
DPHA
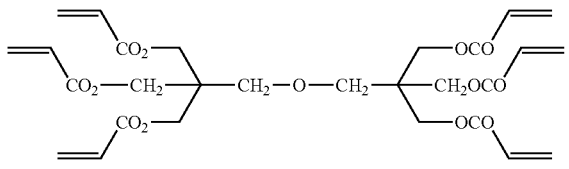
U-1
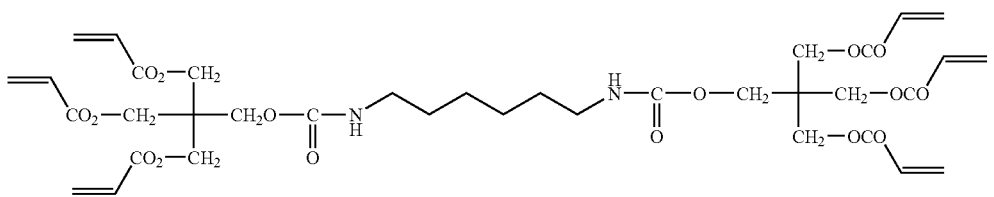

-continued
U-2
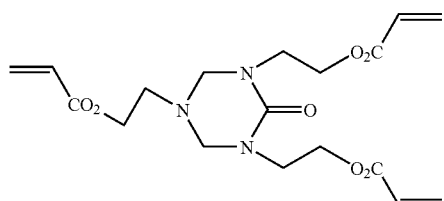
B-1
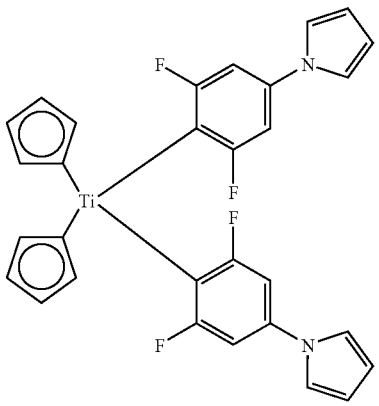
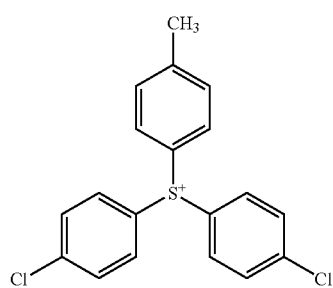
B-2
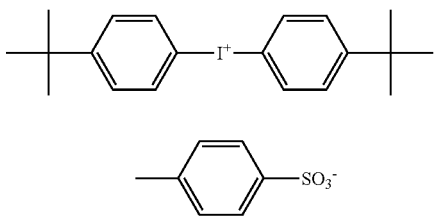
B-3
C-1
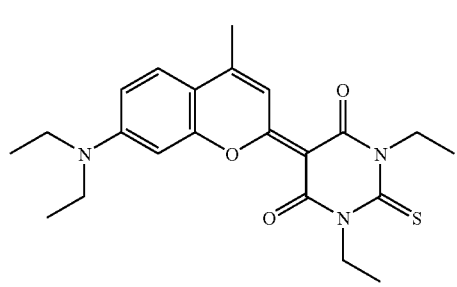
C-2
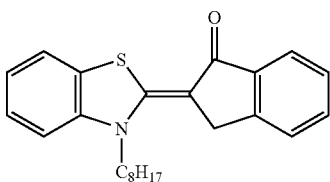
C-3
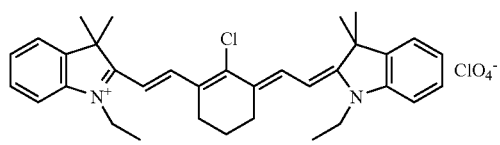
C-4
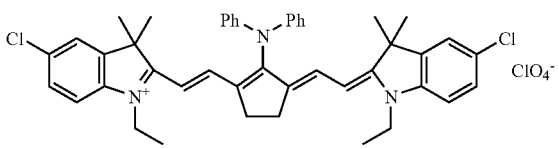
S-1
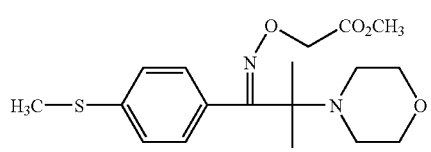
S-2
S-3
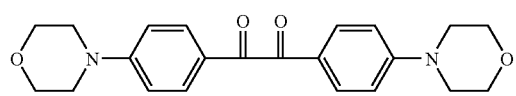
S-4
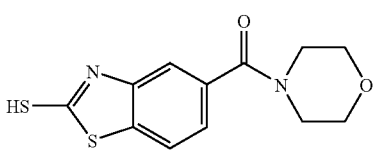

Formation of Protective Layer

After forming the photosensitive layers described above, with respect to part thereof (see Tables 6 to 8), a 3% by weight aqueous solution of polyvinyl alcohol (degree of hydrolysis: 98% by mole, degree of polymerization: 550) was coated on each of the photosensitive layers such that the coating weight after drying was 2 g/m$^2$, and then dried at 100° C. for 2 minutes to prepare protective layers.

There was thus obtained each planographic printing plate precursor.

Exposure

Each of the thus obtained planographic printing plate precursors was exposed using a varied light source corresponding to the exposure wavelength. For example, the exposure was carried out in air using a semiconductor laser having a wavelength of 400 nm, an FD-YAG laser having a wavelength of 532 nm, or a semiconductor laser having a wavelength of 830 nm, respectively.

Development Processing

After exposure, the planographic printing plate precursor was developed using an automatic processor (a trade name: STABLON 900NP, manufactured by Fuji Photo Film Co., Ltd.). As a developing solution, either one of the following developing solutions 1 and 2 was used. The development was carried out at a temperature of developing bath of 30° C. for 12 seconds.

There was thus obtained each planographic printing plate.

Developing solution 1:
DP-4 (a trade name of Fuji Photo Film Co., Ltd.) (diluted with 8 times of water)

Developing solution 2:

| Alkaline aqueous solution having the following composition: | |
| --- | --- |
| Potassium hydroxide | 4 g |
| Potassium hydrogencarbonate | 1 g |
| Potassium carbonate | 2.5 g |
| Sodium sulfite | 1 g |
| Polyethylene glycol mononaphthyl ether | 145 g |
| Sodium dibutylnaphthalenesulfonate | 55 g |
| Tetrasodium ethylenediaminetetraacetate | 8 g |
| Water | 750 g |

Evaluation of Printing Endurance and Staining Resistance Property

Each of the thus obtained planographic printing plates was printed using a printing machine (a trade name: LITHRONE, manufactured by Komori Corporation). During this time, how many copies could be printed while keeping a sufficient ink density was visually measured, thereby evaluating printing endurance and staining resistance property of non-image areas. The results are shown in Tables 6 to 8.

TABLE 6

| | Alkali-soluble high-molecular compound (content) | Radical polymerizable compound (content) | Initiator (content) | Sensitizing pigment (content) | Other additive (content) | Presence of protective layer | Support | Developing solution | Printing endurance | Staining resistance property of non-image areas | Light source |
| --- | --- | --- | --- | --- | --- | --- | --- | --- | --- | --- | --- |
| Example 1 | 1 (1.0 g) | DPHA (1.0 g) | B-2 (0.3 g) | C-2 (0.1 g) | No | Yes | 1 | 1 | 80,000 copies | Good | 400 |
| Example 2 | 2 (1.0 g) | U-2 (0.5 g) | B-1 (0.3 g) | C-2 (0.05g) | S-1 (0.5 g) | Yes | 1 | 1 | 100,000 copies | Good | 400 |
| Example 3 | 5 (1.2 g) | DPHA (1.0 g) | B-1 (0.2 g) | C-2 (0.1 g) | S-2 (0.5 g) | Yes | 1 | 1 | 90,000 copies | Good | 400 |
| Example 4 | 7 (1.0 g) | DPHA (1.0 g) | B-3 (0.25 g) | C-2 (0.08 g) | S-2 (0.6 g) | Yes | 1 | 1 | 95,000 copies | Good | 400 |
| Comparative Example 1 | P-1 (1.2 g) | U-2 (0.5 g) | B-1 (0.3 g) | C-2 (1.0 g) | S-1 (0.5 g) | Yes | 1 | 1 | 45,000 copies | Stained | 400 |
| Comparative Example 2 | P-2 (1.0 g) | DPHA (1.0 g) | B-2 (0.3 g) | C-2 (0.1 g) | No | Yes | 1 | 1 | 31,000 copies | Good | 400 |

TABLE 7

| | Alkali-soluble High-molecular compound (content) | Radical polymerizable compound (content) | Initiator (content) | Sensitizing pigment (content) | Other additive (content) | Presence of protective layer | Support | Developing solution | Printing endurance | Staining resistance property of non-image areas | Light source |
| --- | --- | --- | --- | --- | --- | --- | --- | --- | --- | --- | --- |
| Example 5 | 1 (1.5 g) | U-2 (0.5 g) | B-1 (0.3 g) | C-1 (0.08 g) | No | Yes | 1 | 1 | 100,000 copies | Good | 532 |
| Example 6 | 1 (1.2 g) | U-1 (0.5 g) | B-1 (0.3 g) | C-1 (1.1 g) | S-3 (0.4 g) | Yes | 1 | 1 | 125,000 copies | Good | 532 |
| Example 7 | 14 (1.0 g) | DPHA (1.0 g) | B-1 (0.3 g) | C-1 (1.0 g) | No | Yes | 2 | 2 | 110,000 copies | Good | 532 |
| Example 8 | 16 (1.0 g) | U-2 (1.0 g) | B-2 (0.2 g) | C-1 (1.0 g) | S-4 (0.4 g) | Yes | 1 | 1 | 97,000 copies | Good | 532 |
| Comparative Example 3 | P-3 (1.0 g) | DPHA (0.5 g) | B-1 (0.25 g) | C-1 (1.0 g) | No | Yes | 2 | 2 | 20,000 copies | Good | 532 |
| Comparative Example 4 | P-4 (1.0 g) | U-2 (1.0 g) | B-2 (0.2 g) | C-1 (1.0 g) | S-4 (0.4 g) | Yes | 1 | 1 | 32,000 copies | Good | 532 |

TABLE 8

| | Alkali-soluble high-molecular compound (content) | Radical polymerizable compound (content) | Initiator (content) | Sensitizing pigment (content) | Other additive (content) | Presence of protective layer | Support | Developing solution | Printing endurance | Staining resistance property of non-image areas | Light source |
|---|---|---|---|---|---|---|---|---|---|---|---|
| Example 9 | 18 (1.0 g) | DPHA (0.5 g) | B-2 (0.25 g) | C-3 (0.08 g) | No | Yes | 1 | 1 | 142,000 copies | Good | 830 |
| Example 10 | 5 (1.2 g) | U-1 (0.5 g) | B-2 (0.15 g) | C-4 (0.08 g) | No | No | 1 | 1 | 130,000 copies | Good | 830 |
| Example 11 | 3 (1.5 g) | DPHA (0.5 g) | B-2 (0.3 g) | C-4 (0.1 g) | No | No | 2 | 2 | 143,000 copies | Good | 830 |
| Example 12 | 10 (1.4 g) | U-2 (1.0 g) | B-3 (0.3 g) | C-4 (0.05 g) | No | No | 1 | 1 | 152,000 copies | Good | 830 |
| Example 13 | 1 (1.0 g) | DPHA (1.0 g) | B-2 (0.20 g) | C-3 (0.1 g) | No | No | 1 | 1 | 151,000 copies | Good | 830 |
| Example 14 | 7 (1.2 g) | U-1 (0.8 g) | B-2 (0.25 g) | C-4 (0.08 g) | No | No | 1 | 1 | 162,000 copies | Good | 830 |
| Exampre 15 | 15 (1.5 g) | U-1 (0.5 g) | B-2 (0.20 g) | C-4 (0.08 g) | No | No | 1 | 1 | 157,000 copies | Good | 830 |
| Comparative Example 5 | P-3 (1.4 g) | U-2 (0.1 g) | B-3 (0.3 g) | C-4 (0.05 g) | No | No | 1 | 1 | 20,000 copies | Good | 830 |
| Comparative Example 6 | P-5 (1.2 g) | U-1 (0.5 g) | B-2 (0.15 g) | C-4 (0.08 g) | No | No | 1 | 1 | 52,000 copies | Stained | 830 |

It was noted from Tables 6 to 8 that the planographic printing plates containing the polymerizable composition of the invention in a photosensitive layer (recording layer) are excellent with respect to printing endurance and staining resistance property.

The invention provides a polymerizable composition capable of forming high-image quality images free from staining in non-image areas and of being suitably used in recording layers of planographic printing plate precursors having high strength in formed image areas and excellent printing endurance, and a planographic printing plate precursor using the polymerizable composition. In particular, the invention can provide a polymerizable composition that is suitably used in recording layers of negative-working planographic printing plate precursors that can be made directly from digital data of computers and the like by recording using solids lasers and semiconductor layers each radiating ultraviolet rays, visible rays or infrared rays, and a negative-working planographic printing plate precursor using the polymerizable composition.

What is claimed is:

1. A negative-working planographic printing plate precursor that can be recorded by a solid laser or a semiconductor laser capable of radiating actinic ray in an ultraviolet to infrared wavelength region of 300 nm to 1,200 nm, and comprises a support having a recording layer containing a polymerizable composition provided thereon, wherein the support is an aluminum sheet, a surface of which has been roughened, and wherein the polymerizable composition comprises:
   a binder polymer containing at least an acid group having an acid dissociation constant (pKa) of 5.5 or more and a radical addition polymerizable group; and
   a radical-generating compound capable of generating a radical with light or heat,
   wherein the binder polymer comprises a structural unit that has the acid group and that is represented by a formula selected from the group consisting of formulae (2), (3), (4), (5), (6), (7) and (8):

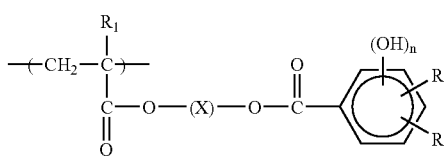

General formula (2)

wherein in formula (2), X represents an alkylene group, a substituted alkylene group, $-CH_2CH_2OCH_2CH_2-$,

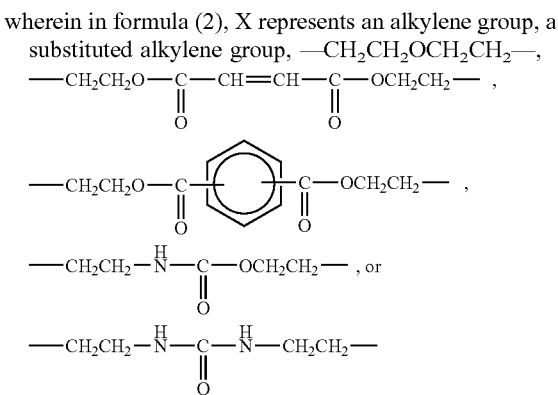

wherein $R^1$ represents a hydrogen atom, a halogen atom, or an alkyl group; each of $R^2$ and $R^3$ independently represents a hydrogen atom, a halogen atom, an alkyl group, a substituted alkyl group, an aromatic group, a substituted aromatic group, $-OR^4$, $-COOR^5$, $-COONHR^6$, $-COR^7$, or $-CN$; $R^2$ and $R^3$ may be bonded to each other to form a ring; each of $R^4$ to $R^7$ independently represents an alkyl group or an aromatic group; and n represents 2 or 3;

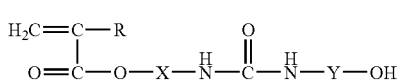

Formula (3)

wherein formula (3), R represents a hydrogen atom or an alkyl group; X represents a divalent linking group; and Y represents a divalent aromatic group which may have substituents;

Formula (4)

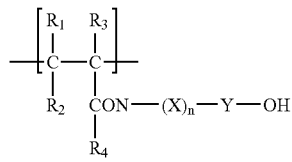

wherein in formula (4), each of $R^1$ and $R^2$ independently represents a hydrogen atom, an alkyl group, or a carboxylic acid group; $R^3$ represents a hydrogen atom, a halogen atom, or an alkyl group; $R^4$ represents a hydrogen atom, an alkyl group, a phenyl group, or an aralkyl group; X represents a divalent organic group linking a nitrogen atom to a carbon atom in an aromatic ring; n represents 0 or 1; and Y represents a phenylene group or a naphthylene group, each of which may have substituents;

Formula (5)

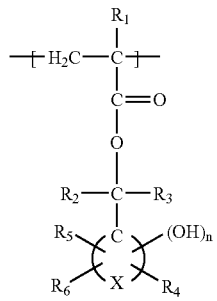

wherein in formula (5), $R^1$ represents a hydrogen atom, a halogen atom, a cyano group, or an alkyl group; each of $R_2$ and $R_3$ independently represents a hydrogen atom, a halogen atom, an alkyl group, an alkoxyl group, or an aryl group; each of $R^4$, $R^5$ and $R^6$ independently represents a hydrogen atom, an alkyl group, an aryl group or a halogen atom; X represents an atom necessary for completing a monocyclic or polycyclic carbocyclic aromatic ring system; and n represents 1, 2 or 3;

Formula (6)

Formula (7)

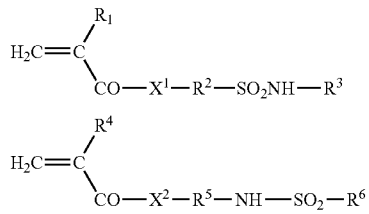

wherein in formulae (6) and (7), each of $X^1$ and $X^2$ independently represents —O— or —$NR^7$—; each of $R^1$ and $R^4$ independently represents —H or —$CH_3$; each of $R^2$ and $R^5$ independently represents an alkylene group, a cycloalkylene group, an arylene group or an aralkylene group each having from 1 to 12 carbon atoms and each of which may have substituents; $R^3$ represents —H or an alkyl group, a cycloalkyl group, an aryl group or an aralkyl group each having from 1 to 12 carbon atoms and each of which may have substituents; $R^6$ represents an alkyl group, a cycloalkyl group, an aryl group or an aralkyl group each having from 1 to 12 carbon atoms and each of which may have substituents; and $R^7$ represents a hydrogen atom or an alkyl group, a cycloalkyl group, an aryl group or an aralkyl group each having from 1 to 12 carbon atoms and each of which may have substituents;

Formula (8)

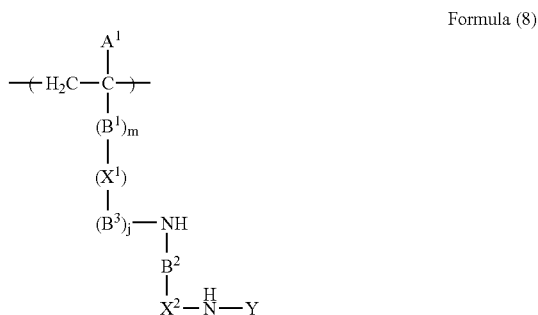

wherein in formula (8), $A^1$ represents a hydrogen atom, a halogen atom, or an alkyl group having from 1 to 4 carbon atoms; $B^1$ represents a phenylene group or a substituted phenylene group; $B^2$ represents an alkylene group having from 2 to 6 carbon atoms or a phenylene group, wherein each of which may have substituents; $B^3$ represents a divalent organic group; each of $X^1$ and $X^2$ independently represents —CO— or —$SO_2$—; Y represents —CO—$R^1$ or —$SO_2$—$R^1$; $R^1$ represents an alkyl group, a substituted alkyl group, an aromatic group, or a substituted aromatic group; and each of m and j represents 0 or 1.

2. A negative-working planographic printing plate precursor according to claim 1, wherein the acid group and the radical addition polymerizable group are introduced as a side chain of the binder polymer.

3. A negative-working planographic printing plate precursor according to claim 1, wherein the acid group and the radical addition polymerizable group are introduced into terminal ends of a main chain of the binder polymer.

4. A negative-working planographic printing plate precursor according to claim 1, wherein the pKa of the acid group is in a range from 7 to 11.5.

5. A negative-working planographic printing plate precursor according to claim 1, wherein the binder polymer comprises at least one of a structural unit that includes the radical addition polymerizable group and that is represented by one of the following formulae (9) to (11):

Formula (9)

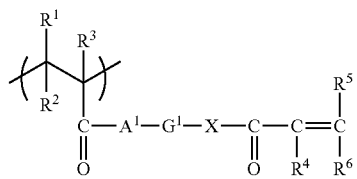

Formula (10)

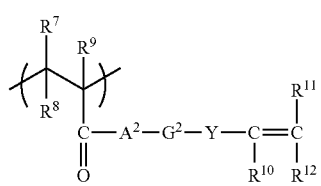

Formula (11)

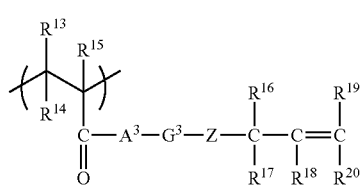

wherein in the above formulas, each of $A^1$, $A^2$ and $A^3$ independently represents an oxygen atom, a sulfur atom, or —$N(R^{21})$—; $R^{21}$ represents a hydrogen atom or an alkyl group which may have substituents; each of $G^1$, $G^2$ and $G^3$ independently represents a divalent organic group; each of X and Z independently represents an oxygen atom, a sulfur atom, or —$N(R^{22})$—; $R^{22}$ represents a hydrogen atom or an alkyl group which may have substituents; Y represents an oxygen atom, a sulfur atom, a phenylene group which may have substituents, or —$N(R^{23})$—; $R^{23}$ represents an alkyl group which may have substituents; and each of $R^1$ to $R^{20}$ independently represents a monovalent inorganic or organic group.

6. A negative-working planographic printing plate precursor according to claim 1, wherein a mixing ratio of structural units that have the acid groups relative to total structural units contained in the binder polymer is in a range of from 5 to 70% by mole.

7. A negative-working planographic printing plate precursor according to claim 1, wherein a mixing ratio of structural units that have the radical addition polymerizable groups relative to total structural units contained in the binder polymer is in a range of from 5 to 95% by mole.

8. A negative-working planographic printing plate precursor according to claim 1, wherein the radical-generating compound contains at least one selected from the group consisting of an aromatic iodonium salt, an aromatic sulfonium salt, a titanocene compound, and a trihalomethyl-S-triazine compound represented by the following formula (17);

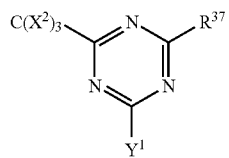

Formula (17)

wherein in formula (17), $X^2$ represents a halogen atom; $Y^1$ represents —$C(X^2)_3$, —$NH_2$, —$NHR^{38}$, —$NR^{38}$, or —$OR^{38}$; $R^{38}$ represents an alkyl group, a substituted alkyl group, an aryl group, or a substituted aryl group; and $R^{37}$ represents —$C(X^2)_3$, an alkyl group, a substituted alkyl group, an aryl group, a substituted aryl group, or a substituted alkenyl group.

9. A negative-working planographic printing plate precursor according to claim 1, further comprising a radical polymerizable compound.

10. A negative-working planographic printing plate precursor according to claim 9, wherein a mixing ratio of the binder polymer to the radical polymerizable compound is in the range of 1:0.05 to 1:3 by weight.

11. The negative-working planographic printing plate precursor according to claim 1, wherein the weight average molecular weight of the binder polymer is in a range of 78,000 to 175,000.

12. The negative-working planographic printing plate precursor according to claim 1, wherein a weight average molecular weight of the binder polymer is in a range of 20,000 to 200,000.

13. The negative-working planographic printing plate precursor according to claim 1, wherein the polymerizable composition comprises a sensitizing dye.

14. The negative-working planographic printing plate precursor according to claim 1, which further comprises a protective layer provided on the recording layer.

15. The negative-working planographic printing plate precursor according to claim 14, wherein the protective layer comprises a polyvinyl alcohol.

16. The negative-working planographic printing plate precursor according to claim 1, wherein the polymerizable composition comprises a sensitizing dye, and the support is an aluminum sheet a surface of which has been roughened.

17. The negative-working planographic printing plate precursor according to claim 1, wherein the polymerizable composition comprises a sensitizing dye, the support is an aluminum sheet a surface of which has been roughened, and a protective layer is further provided on the recording layer.

18. The negative-working planographic printing plate precursor according to claim 1, wherein the polymerizable composition comprises a sensitizing dye, the support is an aluminum sheet a surface of which has been roughened, a protective layer is further provided on the recording layer, and the protective layer comprises a polyvinyl alcohol.

* * * * *